(12) United States Patent
Zhao et al.

(10) Patent No.: US 11,701,968 B2
(45) Date of Patent: Jul. 18, 2023

(54) VEHICLE INTERIOR COMPONENT HAVING A COMPOSITE STRUCTURE PROVIDING A USER INTERFACE

(71) Applicant: Shanghai Yanfeng Jinqiao Automotive Trim Systems Co. Ltd., Novi, MI (US)

(72) Inventors: Yanning Zhao, Beijing (CN); Hannes Rene Boehm, Reutlingen (DE); Steffen Proemmel, Dusseldorf (DE); Iris Wegner, Dusseldorf (DE); Amit Mukund Patankar, Farmington Hills, MI (US); Danny Brian Larsen, Holland, MI (US)

(73) Assignee: Shanghai Yanfeng Jinqiao Automotive Trim Systems Co. Ltd., Novi, MI (US)

( * ) Notice: Subject to any disclaimer, the term of this patent is extended or adjusted under 35 U.S.C. 154(b) by 0 days.

(21) Appl. No.: 17/559,128

(22) Filed: Dec. 22, 2021

(65) Prior Publication Data

US 2022/0111731 A1 Apr. 14, 2022

Related U.S. Application Data

(63) Continuation-in-part of application No. PCT/US2020/041928, filed on Jul. 14, 2020.

(Continued)

(51) Int. Cl.
*B60K 35/00* (2006.01)
*B60Q 3/54* (2017.01)
(Continued)

(52) U.S. Cl.
CPC .............. *B60K 35/00* (2013.01); *B60K 37/06* (2013.01); *B60Q 3/54* (2017.02); *B60Q 3/745* (2017.02);
(Continued)

(58) Field of Classification Search
CPC ............ B60Q 3/54; B60R 13/02; B60K 37/06
See application file for complete search history.

(56) References Cited

U.S. PATENT DOCUMENTS 5,095,409 A 3/1992 Dematteo et al.
5,744,210 A 4/1998 Hofmann et al.
(Continued)

FOREIGN PATENT DOCUMENTS

CN 103154862 A 6/2013
CN 102089626 B 9/2013
(Continued)

OTHER PUBLICATIONS

International Search Report and Written Opinion from the International Searching Authority for International Patent Application No. PCT/US2017/041523 dated Dec. 8, 2017 (in English) (16 Pages).

(Continued)

*Primary Examiner* — Robert J May

(57) ABSTRACT

A vehicle interior component configured to provide a user interface for vehicle systems is disclosed. The component may provide a user interface for a vehicle occupant. The component may comprise a composite structure to provide the user interface comprising a cover providing an exterior surface, a sensor, light panel, absorber panel and/or decorative material. The light panel may provide output visible at the exterior surface; the decorative layer and/or absorber panel may provide a visual effect. The cover may comprise a light-transmissive cover; illumination from a display may comprise visible light transmitted through a functional layer and through an at least partially translucent cover. The component may comprise a light panel to provide output visible at the cover exterior surface. A method of operating (Continued)

the user interface provided by the composite structure is also disclosed. The user interface may be coupled to a control system.

20 Claims, 21 Drawing Sheets

Related U.S. Application Data

(60) Provisional application No. 62/874,185, filed on Jul. 15, 2019.

(51) Int. Cl.
  *B60Q 3/74* (2017.01)
  *B60K 37/06* (2006.01)
  *B60R 13/02* (2006.01)

(52) U.S. Cl.
  CPC ...... *B60R 13/02* (2013.01); *B60K 2370/1434* (2019.05); *B60K 2370/339* (2019.05); *B60R 2013/0287* (2013.01)

(56) References Cited

U.S. PATENT DOCUMENTS

| | | | |
|---|---|---|---|
| 6,214,266 B1 | 4/2001 | Millif et al. |
| 6,504,928 B1 | 1/2003 | Toyooka |
| 6,608,996 B1 | 8/2003 | Laurikka et al. |
| 6,652,128 B2 | 11/2003 | Misaras |
| 6,752,946 B2 | 6/2004 | Toyooka |
| 6,774,505 B1 | 8/2004 | Wnuk |
| 6,842,288 B1 | 1/2005 | Liu et al. |
| 7,034,778 B1 | 4/2006 | Hähl |
| 7,201,508 B2 | 4/2007 | Misaras |
| 7,207,686 B2 | 4/2007 | Schmidt et al. |
| 7,350,949 B2 | 4/2008 | Meinke et al. |
| 7,441,913 B2 | 10/2008 | Bayersdorfer |
| 7,447,575 B2 | 11/2008 | Goldbeck et al. |
| 7,465,064 B2 | 12/2008 | Breinich et al. |
| 7,637,631 B2 | 12/2009 | McDermott et al. |
| 7,666,497 B2 | 2/2010 | Takatsuki et al. |
| 7,862,220 B2 | 1/2011 | Cannon et al. |
| 8,032,280 B2 | 10/2011 | Shibata et al. |
| 8,098,236 B2 | 1/2012 | Klein et al. |
| 8,236,383 B2 | 8/2012 | Gasworth et al. |
| 8,449,156 B2 | 5/2013 | Salter et al. |
| 8,449,161 B2 | 5/2013 | Igoe et al. |
| 8,451,193 B2 | 5/2013 | Namm et al. |
| 8,775,023 B2 | 7/2014 | Fröjdh et al. |
| 8,890,839 B2 | 11/2014 | Santarossa |
| 9,016,913 B2 | 4/2015 | Englert |
| 9,090,009 B2 | 7/2015 | Deckert et al. |
| 9,143,126 B2 | 9/2015 | Salter et al. |
| 9,216,650 B2 | 12/2015 | Drury |
| 9,354,376 B2 | 5/2016 | Englert |
| 9,359,790 B2 | 6/2016 | Stetter et al. |
| 9,440,604 B2 | 9/2016 | Graham |
| 9,459,116 B2 | 10/2016 | Waeller et al. |
| 9,531,379 B2 | 12/2016 | Dassanayake et al. |
| 9,597,825 B2 | 3/2017 | Schmidt et al. |
| 9,605,984 B2 | 3/2017 | Farell |
| 2002/0101738 A1 | 8/2002 | Misaras |
| 2003/0011315 A1 | 1/2003 | Ito et al. |
| 2004/0109096 A1 | 6/2004 | Anderson et al. |
| 2004/0183656 A1 | 9/2004 | Abel et al. |
| 2005/0165526 A1 | 7/2005 | Stam et al. |
| 2005/0276874 A1 | 12/2005 | Menaldo et al. |
| 2007/0085423 A1 | 4/2007 | Chin |
| 2008/0062147 A1 | 3/2008 | Hotelling et al. |
| 2009/0174121 A1 | 7/2009 | Hayes et al. |
| 2009/0286072 A1 | 11/2009 | Küchler et al. |
| 2010/0045624 A1 | 2/2010 | Hisatsugu et al. |
| 2010/0083894 A1 | 4/2010 | Birman et al. |
| 2010/0095245 A1 | 4/2010 | Fino et al. |
| 2010/0133866 A1 | 6/2010 | Hipshier |
| 2010/0226539 A1 | 9/2010 | Ishii |
| 2010/0302200 A1 | 12/2010 | Netherton et al. |
| 2011/0001722 A1 | 1/2011 | Newman et al. |
| 2011/0096025 A1 | 4/2011 | Slobodin et al. |
| 2011/0141390 A1 | 6/2011 | Lee et al. |
| 2011/0182081 A1 | 7/2011 | Oeuvrard et al. |
| 2011/0183120 A1 | 7/2011 | Sharygin et al. |
| 2011/0290038 A1 | 12/2011 | Hoshino et al. |
| 2012/0268406 A1 | 10/2012 | Trachte |
| 2012/0313857 A1 | 12/2012 | Senanayake et al. |
| 2013/0147739 A1 | 6/2013 | Åberg et al. |
| 2013/0200991 A1 | 8/2013 | Ricci et al. |
| 2013/0329166 A1 | 12/2013 | Poliakine et al. |
| 2013/0333922 A1 | 12/2013 | Kai et al. |
| 2014/0309871 A1 | 10/2014 | Ricci |
| 2014/0365928 A1 | 12/2014 | Boelter et al. |
| 2015/0000425 A1 | 1/2015 | Miura et al. |
| 2015/0019083 A1 | 1/2015 | Kalliomaki et al. |
| 2015/0070604 A1 | 3/2015 | Chen et al. |
| 2015/0185843 A1 | 7/2015 | Olien |
| 2015/0185946 A1 | 7/2015 | Fourie |
| 2015/0253966 A1 | 9/2015 | Sizelove |
| 2016/0004362 A1 | 1/2016 | Kring et al. |
| 2016/0073098 A1 | 3/2016 | Villalobos Martinez et al. |
| 2016/0075290 A1 | 3/2016 | Catlin |
| 2016/0098120 A1 | 4/2016 | Miyake |
| 2016/0109982 A1 | 4/2016 | Lee et al. |
| 2016/0188050 A1 | 6/2016 | Uchiyama |
| 2016/0193976 A1 | 7/2016 | Wild et al. |
| 2016/0329894 A1 | 11/2016 | Buschmann et al. |
| 2016/0373110 A1 | 12/2016 | Koehne et al. |
| 2017/0144344 A1 | 5/2017 | Schmidt et al. |
| 2017/0277322 A1 | 9/2017 | Lee et al. |
| 2018/0029264 A1 | 2/2018 | Sharron et al. |
| 2018/0178736 A1 | 6/2018 | Schelter |
| 2018/0188531 A1 | 7/2018 | Dubey et al. |
| 2018/0188869 A1 | 7/2018 | Boggs et al. |
| 2019/0135199 A1 | 5/2019 | Galan Garcia et al. |

FOREIGN PATENT DOCUMENTS

| | | |
|---|---|---|
| CN | 104067098 B | 4/2016 |
| DE | 19909471 A1 | 9/2000 |
| DE | 19702977 C2 | 2/2001 |
| DE | 10118178 C2 | 5/2003 |
| DE | 10123344 B4 | 9/2005 |
| DE | 202006017445 U1 | 9/2007 |
| DE | 202007015946 U1 | 5/2008 |
| DE | 102013003659 A1 | 9/2014 |
| DE | 102013216490 A1 | 2/2015 |
| EP | 1314612 B1 | 1/2007 |
| EP | 1510995 B1 | 2/2009 |
| EP | 2305508 B1 | 2/2012 |
| EP | 2099950 B1 | 5/2012 |
| EP | 2269797 B1 | 11/2013 |
| EP | 2793111 A1 | 10/2014 |
| EP | 3053778 A1 | 8/2016 |
| EP | 2816334 B1 | 4/2017 |
| EP | 2684744 B1 | 5/2018 |
| EP | 3100915 B1 | 1/2019 |
| EP | 3303063 B1 | 3/2019 |
| FR | 2540441 A1 | 8/1984 |
| FR | 2803791 B1 | 7/2002 |
| FR | 2931746 B1 | 7/2010 |
| GB | 2408246 B | 5/2006 |
| JP | 2002048658 A | 2/2002 |
| JP | 2013164365 A | 8/2013 |
| JP | WO2012147948 A | 7/2014 |
| KR | 101337305 B1 | 11/2013 |
| KR | 101337307 B1 | 11/2013 |
| WO | 2008061786 A1 | 5/2008 |
| WO | 2010042107 A1 | 4/2010 |
| WO | 2011025611 A2 | 3/2011 |
| WO | 2012063010 A1 | 5/2012 |
| WO | 2013088559 A1 | 6/2013 |
| WO | 2013122038 A1 | 8/2013 |
| WO | 2015001496 A1 | 1/2015 |

(56) References Cited

FOREIGN PATENT DOCUMENTS

| WO | 2015023668 A1 | 2/2015 |
| WO | 2016120287 A1 | 8/2016 |
| WO | 2016207690 A1 | 12/2016 |

OTHER PUBLICATIONS

Extended European Search Report from the European Patent Office for EP Patent Application No. 17828299.2 dated Jan. 8, 2020 (in English) (10 Pages).
Communication pursuant to Article 94(3) EPC from the European Patent Office for EP Patent Application No. 17828299.2 dated Apr. 19, 2021 (in English) (6 Pages).
International Search Report and Written Opinion from the International Searching Authority for International Patent Application No. PCT/US2020/041928 dated Nov. 9, 2020 (in English) (17 Pages).

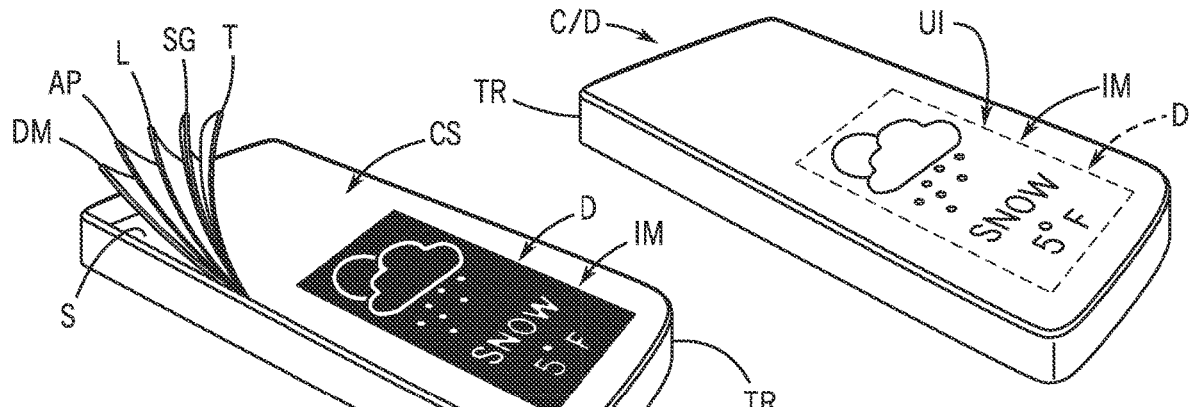
FIG. 10A
FIG. 10B
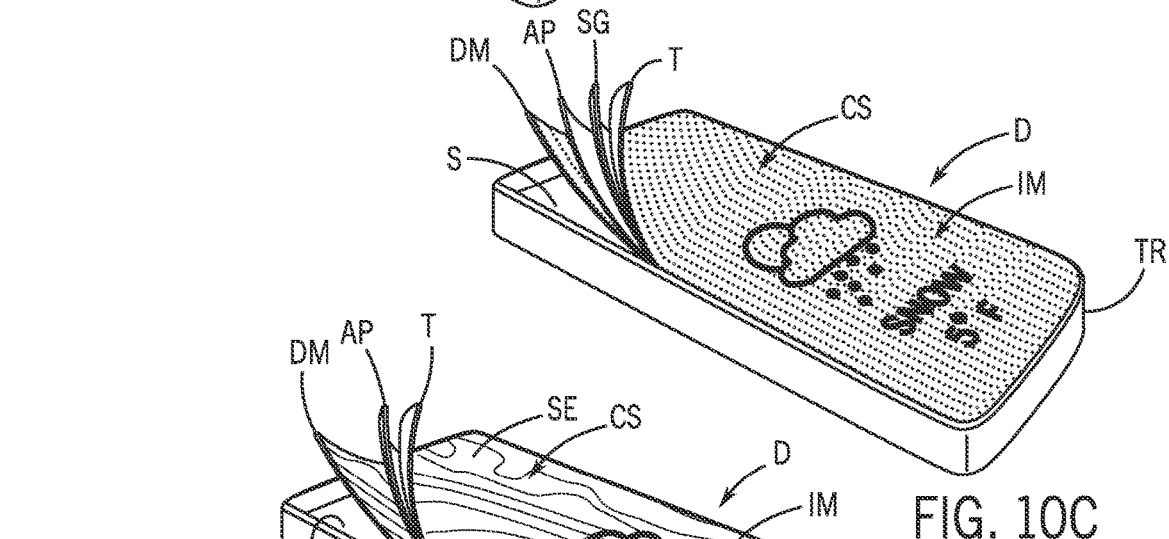
FIG. 10C
FIG. 10D
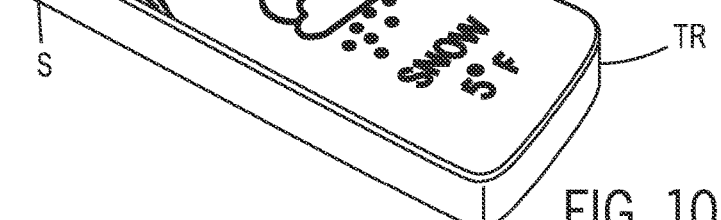
FIG. 10E

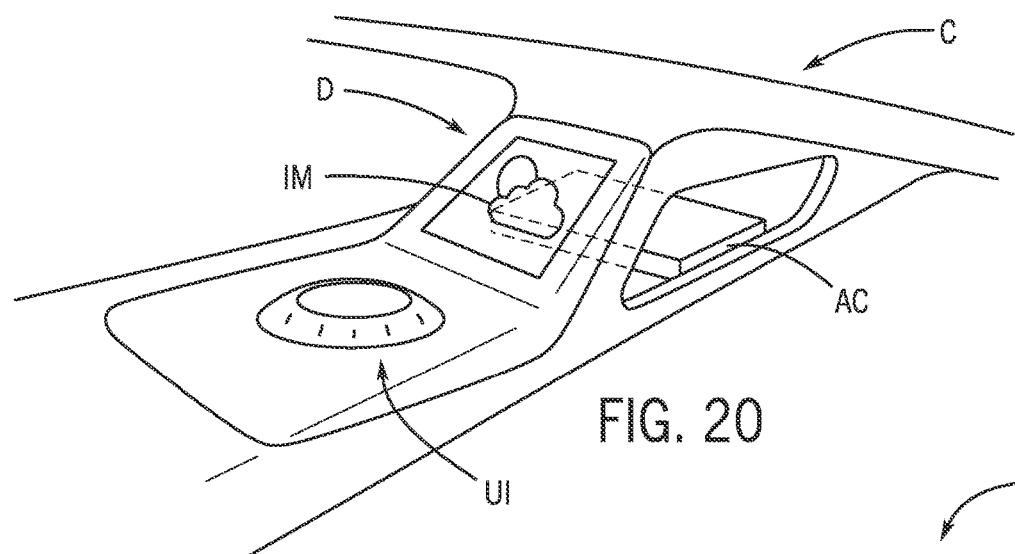
FIG. 20
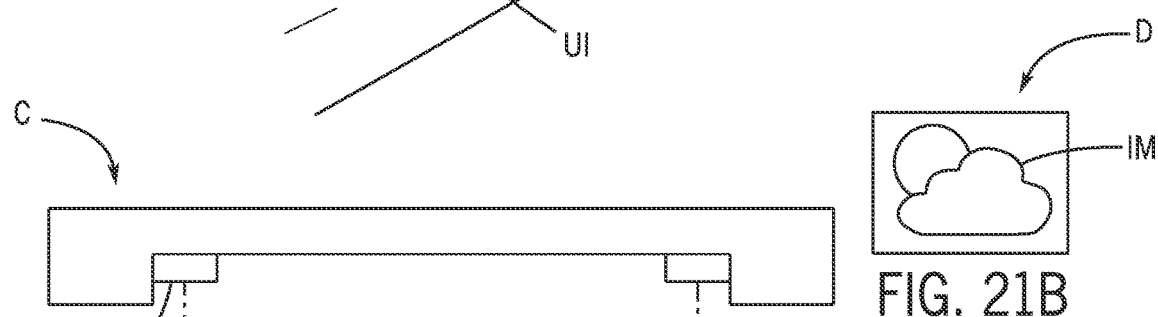
FIG. 21A
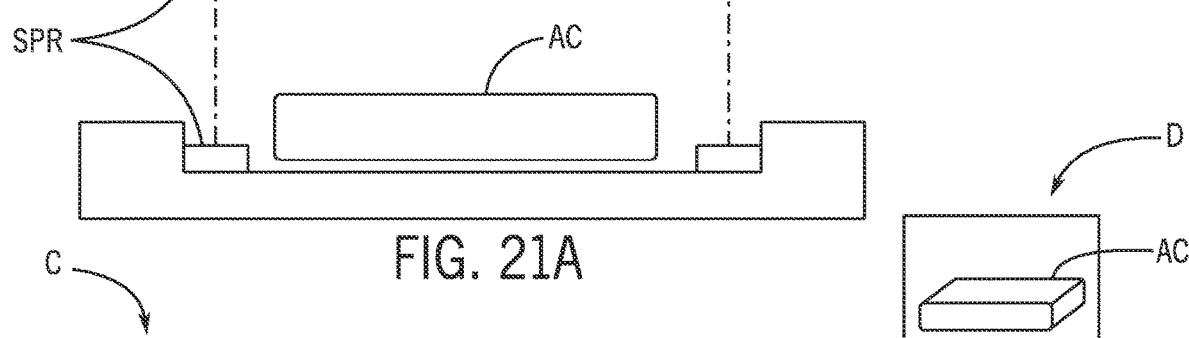
FIG. 22A
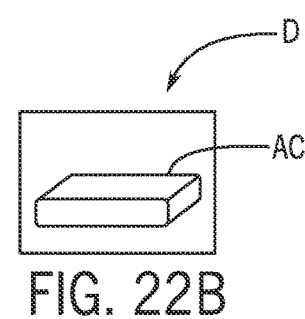
FIG. 21B
FIG. 22B

VEHICLE INTERIOR COMPONENT HAVING A COMPOSITE STRUCTURE PROVIDING A USER INTERFACE

CROSS-REFERENCE TO RELATED APPLICATIONS

The present application is a continuation-in-part of PCT/International Patent Application No. PCT/US2020/041928 titled "VEHICLE INTERIOR COMPONENT" filed Jul. 14, 2020, which claims the benefit of U.S. Provisional Patent Application No. 62/874,185 titled "VEHICLE INTERIOR COMPONENT" filed Jul. 15, 2019.

The present application claims priority to and incorporates by reference in full the following patent applications: (a) U.S. Provisional Patent Application No. 62/874,185 titled "VEHICLE INTERIOR COMPONENT" filed Jul. 15, 2019; (b) PCT/International Patent Application No. PCT/US2020/041928 titled "VEHICLE INTERIOR COMPONENT" filed Jul. 14, 2020.

The present application is related to and incorporates by reference in full the following patent applications: (1) PCT/International Patent Application No. PCT/US2017/041523 titled "VEHICLE INTERIOR COMPONENT" filed Jul. 11, 2017; (2) U.S. patent application Ser. No. 16/236,191 (now U.S. Pat. No. 11,061,475) titled "VEHICLE INTERIOR COMPONENT" filed Dec. 28, 2018; (3) U.S. patent application Ser. No. 16/736,359 (now U.S. Pat. No. 11,104,229) titled "VEHICLE INTERIOR COMPONENT" filed Jan. 7, 2020.

FIELD

The present invention relates to a vehicle interior component. The present invention also relates to a vehicle interior component providing a composite structure. The present invention further relates to a vehicle interior component providing a composite structure providing a user interface system.

BACKGROUND

Conventional automotive interiors may provide a user interface comprising numerous switches, buttons, dials, and other physical control elements for receiving inputs from an occupant. Control elements are coupled to corresponding features and systems including entertainment systems, information systems, climate controls, door locks, window regulator/controls, seat position adjusters, cruise control, mirror position adjusters, headlights, steering wheel adjusters, etc. For example, it is well-known to provide a touch panel in a vehicle interior having buttons/icons that can be pressed to perform a function such as adjusting a seat or window position. It is known to provide such a panel with buttons/icons that are illuminated at all times, or only when selectively illuminated. It is known to provide such a panel with a hard surface that is separate from the soft (e.g. fabric/leather/etc.) surfaces of vehicle interior components.

It would be advantageous to provide an aesthetically pleasing and integrated composite structure including a cover/exterior surface and configured to provide a user interface with a display for a vehicle interior component. It would be advantageous to provide an integrated composite structure configured to provide a user interface in or on a vehicle interior component in a manner to provide an appearance and feel provided by the cover/exterior surface and functional layers beneath the cover (including decorative material). It would be advantageous to provide an improved system and method of operating the user interface for the composite structure of the vehicle interior component. It would be advantageous to provide an improved composite structure including a cover/exterior surface and configured to provide a user interface in or on a vehicle interior component providing a composite visual effect provided by the display and the decorative material. It would be advantageous to provide an improved composite structure including a cover/exterior surface and configured to provide a user interface in or on a vehicle interior component providing features suitable for a vehicle interior such as aesthetics, system integration, decorative appearance, color/texture, softness/firmness, feel/touch/haptic sensation, resistance to dirt/stains, repellence to water/fluids, convenient to maintain/clean, etc.

SUMMARY

The present invention relates to a vehicle interior component configured to provide a user interface for a vehicle occupant in a vehicle comprising vehicle systems comprising a composite structure configured to provide the user interface comprising a cover providing an exterior surface, an absorber panel and a decorative material. The decorative material may be configured to provide a visual effect at least partially visible at the exterior surface of the cover. The absorber panel may be configured to provide a visual effect at least partially visible at the exterior surface of the cover. The composite structure may be configured so that operation of the user interface for the vehicle occupant comprises a composite visual effect. The visual effect of the decorative material may be presented at the exterior surface of the cover. The component may comprise a light panel configured to provide output at least partially visible at the exterior surface of the cover; operation of the user interface for the vehicle occupant may comprise output from the light panel. The light panel may comprise a display panel; the display panel may comprise a self-emissive panel; the self-emissive panel may comprise at least one of a light-transmissive display, a translucent display, a transparent display. The light panel may comprise a display panel; the output of the light panel may comprise a display from the display panel; the visual effect of the absorber panel may comprise a background for the display from the display panel. The absorber panel may comprise a background panel configured to provide a dark background for a display panel; the absorber panel may comprise a display panel configured to augment output from the light panel. The light panel may comprise a display panel; the composite visual effect may comprise the output of a light panel over the visual effect of the absorber panel when the composite structure is in an on state; the light panel may comprise a display panel; the composite visual effect may comprise the output of the light panel over the visual effect of the absorber panel with the visual effect of the decorative layer when the composite structure is in an on state. The composite structure may be configured for an on state and an off state; the composite visual effect of the composite structure may comprise at least the visual effect of the decorative material when the composite structure is in the off state; the decorative material may be at least one of light transmissive or transparent. The composite structure may be configured for an on state and an off state; the visual effect of the absorber panel may be generally light-transmissive when the composite structure is in the off state; the composite structure may be configured for an on state and an off state; the visual effect of the absorber panel may be generally light-transmissive when the composite structure is in the on state. The component may comprise a sensor; operation of the user interface for the vehicle occupant may comprise input detected by the sensor; operation of the user interface for the vehicle occupant may comprise at least one of (a) output from the absorber panel; (b) output from a light panel; (c) input detected by the sensor. The display may comprise a light source; the display may be configured to provide color and light; the visual effect may comprise color and light.

The present invention relates to a vehicle interior component configured to provide a user interface for a vehicle occupant in a vehicle comprising vehicle systems comprising a composite structure configured to provide the user interface comprising a cover providing an exterior surface, an absorber panel and a decorative material. The decorative material may be configured to provide a visual effect at least partially visible at the exterior surface of the cover. The absorber panel may be configured to provide a visual effect at least partially visible at the exterior surface of the cover. The composite structure may be configured so that operation of the user interface for the vehicle occupant comprises a composite visual effect. The composite structure may be configured so that the composite visual effect comprises at least the visual effect of the decorative material when the composite structure is in an off state. The user interface may be presented with the visual effect of the decorative material and the visual effect of the absorber panel. The user interface may be presented with the visual effect of the decorative material and the visual effect of the absorber panel and output of a light panel; the light panel may comprise a display panel. The component may comprise a control system configured to connect to vehicle systems; the control system may be configured to facilitate operation by the vehicle occupant for at least one of (a) sending a signal to a control module; (b) controlling a motor; (c) providing a signal to a vehicle component; (d) providing electrical power to a vehicle component; (e) providing to the vehicle occupant at least one of (1) visible feedback and/or (2) audible feedback and/or (3) tactile feedback and/or (4) haptic feedback. The cover may comprise at least one of a plastic material and/or a glass material and/or a composite material and/or a light-transmissive material and/or a flexible material and/or a generally rigid material and/or a polymeric material providing a generally rigid structure.

The present invention relates to a vehicle interior component configured to provide a user interface for a vehicle occupant in a vehicle comprising vehicle systems comprising a composite structure configured to provide the user interface comprising a cover providing an exterior surface, an absorber panel and a decorative material. The decorative material may be configured to provide a visual effect at least partially visible at the exterior surface of the cover. The absorber panel may be configured to provide a visual effect at least partially visible at the exterior surface of the cover. The composite structure may be configured so that operation of the user interface for the vehicle occupant comprises a composite visual effect. The absorber panel may comprise a display panel. The visual effect of the absorber panel may comprise a display at least partially visible at the exterior surface of the cover. Operation of the user interface for the vehicle occupant may comprise at least one of (a) output from a light panel presenting a display and (b) the visual effect of the absorber panel and (c) input detected by a sensor. The user interface may be configured for interaction with a vehicle occupant by at least one of (a) touch at the exterior surface of the cover detected by the sensor or (b) gesture adjacent to the exterior surface of the cover detected by the sensor. The display may be configured to provide (a) a decorative state and (b) a light-transmissive state; the decorative state may comprise at least one of an opaque appearance, a translucent appearance, display of information, display of icons, display of images, display of pictures, display of patterns, display of a map. The composite structure may be configured to be coupled to at least one of (a) a trim component; (b) a panel; (c) a door panel; (d) an instrument panel; (e) a surface; (f) a console; (g) a base; (h) a seat; (i) a vehicle system; (j) an overhead console; (k) a floor console, (l) a seat back panel.

The present invention relates to a vehicle interior component configured to provide a user interface for a vehicle occupant in a vehicle comprising vehicle systems comprising a composite structure configured to provide the user interface comprising a cover comprising a form providing an exterior surface comprising a primary surface and at least one lateral surface, a light panel for the primary surface, a light panel for at least one lateral surface and a decorative material. The light panel for the primary surface may be configured to provide output at least partially visible at the exterior surface of the cover. The light panel for the at least one lateral surface may be configured to provide output at least partially visible at the at least one lateral surface. The decorative material may comprise a decorative layer configured to provide a visual effect at least partially visible at the exterior surface of the cover. The component may comprise an absorber panel configured to provide a visual effect at least partially visible at the exterior surface of the cover; so that operation of the user interface for the vehicle occupant comprises at least one of (a) output from the light panel and (b) the visual effect of the absorber panel and (c) input detected by the sensor. The light panel may comprise a display panel; the display panel may comprise a self-emissive panel.

The present invention relates to a vehicle interior component configured to provide a user interface for a vehicle occupant in a vehicle comprising vehicle systems comprising a composite structure configured to provide the user interface comprising a cover providing an exterior surface; an absorber panel; and a decorative material. The decorative material may be configured to provide a visual effect at least partially visible at the exterior surface of the cover. The absorber panel may be configured to provide a visual effect at least partially visible at the exterior surface of the cover. The composite structure may be configured so that operation of the user interface for the vehicle occupant may comprise a composite visual effect. The component may comprise a light panel configured to provide output at least partially visible at the exterior surface of the cover; operation of the user interface for the vehicle occupant may comprise output from the light panel. The light panel may comprise a display panel; the display panel may comprise a self-emissive panel; the self-emissive panel may comprise at least one of a light-transmissive display, a translucent display, a transparent display. The light panel may comprise a display panel; the output of light panel may comprise a display from the display panel; the visual effect of the absorber panel may comprise a background for the display from the display panel. The absorber panel may comprise a background panel configured to provide a dark background for a display panel. The absorber panel may comprise a display panel configured to augment output from the light panel. The light panel may comprise a display. The light panel may comprise a display panel; the composite visual effect may comprise the output of a light panel over the visual effect of the absorber panel when the composite structure is in an on state. The light panel may comprise a display panel; the composite visual effect may comprise the output of the light panel over the visual effect of the absorber panel with the visual effect of the decorative layer when the composite structure is in an on state. The user interface may comprise a display comprising output from the light panel and a visual effect from the absorber panel. The cover may comprise a layer configured to facilitate the transmission of light from the light panel. The absorber panel may comprise a display panel; the visual effect of the absorber panel may comprise a display at least partially visible at the exterior surface of the cover. The absorber panel may comprise an addressable display. The absorber panel may comprise a display panel. The composite structure may be configured so that the composite visual effect may comprise at least the visual effect of the decorative material when the composite structure is in an off state. The composite structure may be configured for an on state and an off state; the composite visual effect of the composite structure may comprise at least the visual effect of the decorative material when the composite structure is in the off state. The decorative material may be at least one of light transmissive or transparent. The decorative material may comprise at least one of (a) glass or (b) plastic. The composite structure may be configured for an on state and an off state; the visual effect of the absorber panel may be generally light-transmissive when the composite structure is in the off state. The composite structure may be configured for an on state and an off state; the visual effect of the absorber panel may be generally light-transmissive when the composite structure is in the on state. The composite structure may be configured for an on state and an off state; the visual effect of the absorber panel may be generally dark background when the composite structure is in the off state. The composite structure may be configured for an on state and an off state; the visual effect of the absorber panel may be generally dark background when the composite structure is in the on state. The component may comprise a sensor; operation of the user interface for the vehicle occupant may comprise input detected by the sensor. Operation of the user interface for the vehicle occupant may comprise at least one of (a) output from the absorber panel; (b) output from a light panel; (c) input detected by the sensor. The sensor may be configured to detect input from the vehicle occupant at or adjacent to the exterior surface of the cover. The user interface may be presented at the exterior surface of the cover. The visual effect of the decorative material may be presented at the exterior surface of the cover. The user interface may be presented with the visual effect of the decorative material and the visual effect of the absorber panel. The user interface may be presented with the visual effect of the decorative material and the visual effect of the absorber panel and output of a light panel; the light panel may comprise a display panel. The user interface may comprise the composite visual effect. The decorative material may comprise a decorative layer. The composite structure may be configured in a contoured shape. The composite structure may comprise a substrate. The composite structure may be configured to be coupled to at least one of (a) a trim component; (b) a panel; (c) a door panel; (d) an instrument panel; (e) a surface; (f) a console; (g) a base; (h) a seat; (i) a vehicle system; (j) an overhead console; (k) a floor console, (l) a seat back panel. The component may comprise a control system configured to connect to vehicle systems; the control system may be configured to facilitate operation by the vehicle occupant for at least one of (a) sending a signal to a control module; (b) controlling a motor; (c) providing a signal to a vehicle component; (d) providing electrical power to a vehicle component; (e) providing to the vehicle occupant at least one of (1) visible feedback and/or (2) audible feedback and/or (3) tactile feedback and/or (4) haptic feedback. Operation of the user interface for the vehicle occupant may comprise at least one of (a) output from a light panel presenting a display and (b) the visual effect of the absorber panel and (c) input detected by a sensor. The user interface may be configured for interaction with a vehicle occupant by at least one of (a) touch at the exterior surface of the cover detected by the sensor or (b) gesture adjacent to the exterior surface of the cover detected by the sensor. The sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel. The component may comprise a display system comprising the absorber panel and a display; the display may comprise at least one of (a) an array; (b) a grid; (c) a panel; (d) a display screen; (e) a flexible panel; (f) a lighting array; (g) a lighting device array; (h) a light-emitting device array; (i) an LED array; (j) a flexible LED array; (k) an OLED array; (l) a flexible LED matrix; (m) a flexible sheet; (n) EL display; (o) a TFEL display, (p) QD array, (q) color emitting device array, (r) light and color emitting device; (s) self-emissive display. The display may be configured to provide color and light; the display may comprise at least one of an OLED (organic light emitting diode) display, an ELQD (Electroluminescent Quantum Dot) display. The display may comprise at least one of a light emitting display, an EL (electroluminescent) display, a TFEL (Thin Film Electroluminescent) display. The display may be configured to provide color; the display may comprise at least one of a QD (Quantum Dot) display, an LED (Light emitting diode) display, a LC (Liquid Crystal) display. The display further may comprise a light source; the display may be configured to provide color and light. The visual effect may comprise color and light. The composite structure may comprise a composite surface; the cover may comprise an at least partially translucent cover; illumination from the display at the exterior surface of the composite structure may comprise visible light transmitted through the functional layer and through the at least partially translucent cover. The cover may comprise a generally rigid light-transmissive cover. The cover may comprise at least one of a plastic material and/or a glass material and/or a composite material and/or a light-transmissive material and/or a flexible material and/or a generally rigid material. The cover may comprise a polymeric material providing a generally rigid structure.

The present invention relates to a vehicle interior component configured to provide a user interface for a vehicle occupant in a vehicle comprising vehicle systems comprising a composite structure configured to provide the user interface comprising a cover providing an exterior surface; a light panel; an absorber panel; and a decorative material. The light panel may be configured to provide output at least partially visible at the exterior surface of the cover. The decorative material may be configured to provide a visual effect at least partially visible at the exterior surface of the cover. The absorber panel may be configured to provide a visual effect at least partially visible at the exterior surface of the cover so that operation of the user interface for the vehicle occupant may comprise at least one of (a) output from the light panel and (b) the visual effect of the absorber panel. The component may comprise a sensor; operation of the user interface for the vehicle occupant may comprise input detected by the sensor.

The present invention relates to vehicle interior component configured to provide a user interface for a vehicle occupant in a vehicle comprising vehicle systems comprising a composite structure configured to provide the user interface comprising a cover providing an exterior surface; a sensor; an absorber panel; and a decorative material. The decorative material may be configured to provide a visual effect at least partially visible at the exterior surface of the cover. The absorber panel may be configured to provide a visual effect at least partially visible at the exterior surface of the cover so that operation of the user interface for the vehicle occupant may comprise at least one of (a) the visual effect of the absorber panel and (b) input detected by the sensor. The component may comprise a light panel configured to provide output at least partially visible at the exterior surface of the cover. Operation of the user interface for the vehicle occupant may comprise output from the light panel.

The present invention relates to a vehicle interior component configured to provide a user interface for a vehicle occupant in a vehicle comprising vehicle systems comprising a composite structure configured to provide the user interface comprising a cover providing an exterior surface; a sensor; a light panel; and a decorative material. The light panel may be configured to provide output at least partially visible at the exterior surface of the cover. The decorative material may comprise a decorative layer configured to provide a visual effect at least partially visible at the exterior surface of the cover so that operation of the user interface for the vehicle occupant may comprise at least one of (a) output from the light panel and (b) input detected by the sensor. The component may comprise an absorber panel; the absorber panel may be configured to provide a visual effect at least partially visible at the exterior surface of the cover so that operation of the user interface for the vehicle occupant may comprise the visual effect of the absorber panel. The component may comprise a functional layer. The functional layer may be configured for at least one of (a) positioning; (b) spacing; (c) haptic feedback; (d) tactile feedback such as vibration; (e) audible feedback such as sound; (f) optical enhancement; (g) light shielding; (h) electrical shielding; (i) interference shielding; (j) optical electrical charging for a device; (k) interaction with a mobile device; (l) interaction with a vehicle system; (m) cushioning; (n) adhesion or bonding; (o) tactile shear/feel performance; (p) thermal management; (q) heating; (r) cooling; (s) providing Peltier effect; (t) diffusion of illumination from the display; (u) monitoring; (v) recording; (w) alerting; (x) messaging; (y) light guiding; (z) flexibility. The user interface may comprise a display element from illumination from the display that may be configured to be selectively positioned on the exterior surface of the cover; the display element of the user interface may comprise at least one of (a) an icon; (b) a symbol; (c) a button indicator; (d) a menu system; (e) a display panel image; (f) an information display image; (g) a graphics display image; (h) a control panel; (i) an input panel; (j) a touch screen; (k) a repositionable image; (l) a projected image; (m) an image element selectively positionable on the exterior surface of the cover by interaction with the vehicle occupant. The display element of the user interface may be configured to be positioned on the exterior surface of the cover (a) contacting the exterior surface of the cover at a position where the display element is to be displayed when the display element is not displayed; (b) contacting the exterior surface of the cover where the display element is displayed and dragging the display element along the exterior surface of the cover to a position where the display element is to be displayed. The user interface may be configured (a) to be activated for operation by compressing the cover toward the sensor and (b) to be operated by contacting the exterior surface within a distance where input can be detected by the sensor and (c) to be operated by movement directed by the vehicle occupant above the exterior surface of the cover within a distance where input can be detected by the sensor.

The present invention relates to a vehicle interior component configured to provide a user interface for a vehicle occupant in a vehicle comprising vehicle systems comprising a storage compartment; a composite structure configured to provide the user interface comprising a cover providing an exterior surface; a sensor and a display system; and a control system. The display system may be configured to provide (a) a decorative state and (b) a light-transmissive state. The control system may be configured to provide the light-transmissive state at the display system of the user interface when the sensor detects entry to the storage compartment. The storage compartment may be configured to contain an object; the user interface may be configured to provide the light-transmissive state at the display system so that the occupant can observe inside/interior of the storage compartment the object during entry into the storage compartment. The storage compartment may be configured to contain an object; the user interface may be configured to provide the light-transmissive state at the display system so that the occupant can observe an interior of the storage compartment the object during entry into the storage compartment. The component may be configured to be operated by a method comprising the steps of providing the decorative state at the display system for user interface; detecting entry into the storage compartment and providing the light-transmissive state at the display system for the user interface; detecting absence of entry into the storage compartment and providing the decorative state at the display system for the user interface. The decorative state may comprise at least one of an opaque appearance, a translucent appearance, display of information, display of icons, display of images, display of pictures, display of patterns, display of a map. The light-transmissive state may comprise at least one of a transparent appearance, a semi-transparent appearance, a shine-through effect, an unobstructed view, an image of an item, a view into the compartment, visibility into the compartment. The step of detecting entry into the storage compartment may comprise detection of the presence of (a) a hand, (b) a finger, (c) an arm (d) an extremity, (e) an object, (f) an article; (g) and item (h) a device, (i) a mobile device; (j) an electronic device (k) a bottle (l) a can; (m) a pen (n) eyeglasses (o) a book The step of detecting entry into the storage compartment may comprise detection by the sensor. The sensor may comprise a photo-electric sensor for the storage compartment. The light-transmissive state may comprise a generally transparent state. The light-transmissive state may comprise a generally transparent state so that an object in the storage compartment is visible through the display system. The display system may comprise a display panel; the decorative state may comprise display of an image on the display panel. The image may comprise an output from the control system. The display system may comprise a decorative layer; the decorative layer may be configured to provide a visual effect at least partially visible at the exterior surface of the cover. The display system may comprise a display panel; operation of the user interface for the vehicle occupant may comprise at least one of (a) visual effect of an image at the display panel and (b) visual effect of an object in the storage compartment at the display panel. The display system may comprise at least one of (a) an absorber panel and/or (b) a display panel and/or (c) a light panel; (d) a light panel comprising an absorber panel and a display panel; (e) a light panel configured to provide a display.

The present invention relates to a vehicle interior component configured to provide a user interface for a vehicle occupant in a vehicle comprising vehicle systems comprising a composite structure configured to provide the user interface comprising a cover comprising a form providing an exterior surface comprising a primary surface and at least one lateral surface; a light panel for the primary surface; a light panel for at least one lateral surface; and a decorative material. The light panel for the primary surface may be configured to provide output at least partially visible at the exterior surface of the cover. The light panel for the at least one lateral surface may be configured to provide output at least partially visible at the at least one lateral surface. The decorative material may comprise a decorative layer configured to provide a visual effect at least partially visible at the exterior surface of the cover. The component may comprise an absorber panel configured to provide a visual effect at least partially visible at the exterior surface of the cover so that operation of the user interface for the vehicle occupant may comprise at least one of (a) output from the light panel and (b) the visual effect of the absorber panel and (c) input detected by the sensor. The light panel may comprise a display panel; the display panel may comprise a self-emissive panel. The primary surface may comprise at least one of (a) a top surface; (b) a front surface; (c) a face surface, (d) a main surface, (e) a central surface, (f) a principal surface. The at least one lateral surface may comprise at least one of (a) a side surface; (b) an ancillary surface: (c) a set of lateral surfaces; (d) a set of side surfaces.

The present invention relates to a vehicle interior component configured to provide a user interface for a vehicle occupant in a vehicle comprising vehicle systems. The component may comprise a composite structure configured to provide the user interface comprising a cover providing an exterior surface and an absorber panel and a decorative material. The decorative material may be configured to provide a visual effect at least partially visible at the exterior surface of the cover; the absorber panel may be configured to provide a visual effect at least partially visible at the exterior surface of the cover. The composite structure may be configured so that operation of the user interface for the vehicle occupant may comprise a composite visual effect. The component may comprise a light panel configured to provide output at least partially visible at the exterior surface of the cover; operation of the user interface for the vehicle occupant may comprise output from the light panel; the light panel may comprise a display panel; the light panel may comprise a display panel; the output of light panel may comprise a display from the display panel; the visual effect of the absorber panel may comprise a background for the display from the display panel. The absorber panel may comprise a background panel configured to provide a dark background for the display panel. The absorber panel may comprise a display panel configured to augment the output from the light panel. The light panel may comprise a display. The absorber panel may comprise a display panel; the visual effect of the absorber panel may comprise a display at least partially visible at the exterior surface of the cover. The absorber panel may comprise an addressable display. The absorber panel may comprise a display panel. The composite structure may be configured so that the composite visual effect may comprise at least the visual effect of the decorative material when the composite structure may be in an off state. The composite structure may be configured for an on state and an off state; the composite visual effect of the composite structure may comprise at least the visual effect of the decorative material when the composite structure may be in an off state. The composite structure may be configured for an on state and an off state; the visual effect of the absorber panel may be generally light-transmissive when the composite structure may be in the off state. The composite structure may be configured for an on state and an off state; the visual effect of the absorber panel may be generally dark background when the composite structure is in the off state. The composite structure may be configured for an on state and an off state; the visual effect of the absorber panel may be generally dark background when the composite structure is in the on state. The composite structure may be configured for an on state and an off state; the visual effect of the absorber panel may be generally dark background when the composite structure may be in the on state. The light panel may comprise a display panel; the composite visual effect may comprise the output of the light panel over the visual effect of the absorber panel when the composite structure may be in the on state. The light panel may comprise a display panel; the composite visual effect may comprise the output of the light panel over the visual effect of the absorber panel with the visual effect of the decorative layer when the composite structure may be in the on state. Operation of the user interface for the vehicle occupant may comprise input detected by the sensor. Operation of the user interface for the vehicle occupant may comprise at least one of (a) output from the absorber panel; (b) output from a light panel; (c) input detected by the sensor. The user interface may comprise a display comprising output from the light panel and a visual effect from the absorber panel. The cover may comprise a layer configured to facilitate the transmission of light from the light panel; the sensor may be configured to detect input from the vehicle occupant at or adjacent to the exterior surface of the cover. The user interface may be presented at the exterior surface of the cover. The visual effect of the decorative material may be presented at the exterior surface of the cover. The user interface may be presented with the visual effect of the decorative material and the visual effect of the absorber panel. The user interface may be presented with the visual effect of the decorative material and the visual effect of the absorber panel and output of a light panel; the light panel may comprise a display panel. The user interface may comprise the composite visual effect. The decorative material may comprise a decorative layer. The composite structure may be configured in a contoured shape. The composite structure may comprise a substrate. The composite structure may be configured to be coupled to at least one of (a) a trim component; (b) a panel; (c) a door panel; (d) an instrument panel; (e) a surface; (f) a console; (g) a base; (h) a seat; (i) a vehicle system; (j) an overhead console; (k) a floor console. The system/component may comprise or connect to a control system configured to connect to vehicle systems; the control system may be configured to facilitate operation by the vehicle occupant for at least one of (a) sending a signal to a control module, (b) controlling a motor, (c) providing a signal to a vehicle component, (d) providing electrical power to a vehicle component, (e) providing at least one of (1) visible feedback, (2) audible feedback, (3) tactile feedback, (4) haptic feedback to the vehicle occupant. Operation of the user interface for the vehicle occupant may comprise at least one of (a) output a light panel presenting a display and/or (b) the visual effect of the absorber panel and/or (c) input detected by a sensor. The user interface may be configured for interaction with a vehicle occupant by at least one of (a)

touch at the exterior surface of the cover detected by the sensor or (b) gesture adjacent to the exterior surface of the cover detected by the sensor. The sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel. The display may comprise at least one of (a) an array; (b) a grid; (c) a panel; (d) a display screen; (e) a flexible panel; (f) a lighting array; (g) a lighting device array; (h) a light-emitting device array; (i) an LED array; (j) a flexible LED array; (k) an OLED array; (l) a flexible LED matrix; (m) a flexible sheet; (n) a TFEL display. The composite structure may comprise a composite surface; the cover may comprise an at least partially translucent cover; illumination from the display at the exterior surface of the composite structure may comprise visible light transmitted through the functional layer and through the at least partially translucent cover. The cover may comprise a generally rigid light-transmissive cover. The cover may comprise at least one of a plastic material or a glass material or a composite material or a light-transmissive material. The cover may comprise a polymeric material providing a generally rigid structure (e.g. polycarbonate, Polymethyl methacrylate (PMMA), acrylic, acrylic glass, or plexiglass, etc.).

The present invention relates to a vehicle interior component configured to provide a user interface for a vehicle occupant in a vehicle comprising vehicle systems. The vehicle interior component may comprise a composite structure configured to provide the user interface comprising a cover providing an exterior surface; a light panel; an absorber panel; a decorative material; the light panel may be configured to provide output at least partially visible at the exterior surface of the cover; the decorative layer may be configured to provide a visual effect at least partially visible at the exterior surface of the cover; the absorber panel may be configured to provide a visual effect at least partially visible at the exterior surface of the cover; operation of the user interface for the vehicle occupant may comprise at least one of (a) output from light panel and/or (b) the visual effect of the absorber panel. The component may comprise a sensor; operation of the user interface for the vehicle occupant may comprise input detected by the sensor.

The present invention relates to a vehicle interior component configured to provide a user interface for a vehicle occupant in a vehicle comprising vehicle systems; the component may comprise a composite structure configured to provide the user interface comprising: a cover providing an exterior surface; a sensor; an absorber panel; a decorative material; the decorative layer may be configured to provide a visual effect at least partially visible at the exterior surface of the cover; the absorber panel may be configured to provide a visual effect at least partially visible at the exterior surface of the cover; operation of the user interface for the vehicle occupant may comprise at least one of (a) the visual effect of the absorber panel and/or (b) input detected by the sensor. The light panel may be configured to provide output at least partially visible at the exterior surface of the cover; the user interface for the vehicle occupant may comprise output from the light panel.

The present invention relates to a vehicle interior component configured to provide a user interface for a vehicle occupant in a vehicle comprising vehicle systems; the vehicle interior component may comprise a composite structure configured to provide the user interface comprising a cover providing an exterior surface; a sensor; a light panel; an absorber panel; a decorative material. The light panel may be configured to provide output at least partially visible at the exterior surface of the cover; the decorative layer may be configured to provide a visual effect at least partially visible at the exterior surface of the cover; the absorber panel may be configured to provide a visual effect at least partially visible at the exterior surface of the cover; operation of the user interface for the vehicle occupant may comprise at least one of (a) output from the light panel and/or (b) the visual effect of the absorber panel and/or (c) input detected by the sensor. The composite structure may comprise a functional layer; the functional layer may be configured for at least one of (a) positioning; (b) spacing; (c) haptic feedback; (d) tactile feedback such as vibration; (e) audible feedback such as sound; (f) optical enhancement; (g) light shielding; (h) electrical shielding; (i) interference shielding; (j) optical electrical charging for a device; (k) interaction with a mobile device; (l) interaction with a vehicle system; (m) cushioning; (n) adhesion or bonding; (o) tactile shear/feel performance; (p) thermal management; (q) heating; (r) cooling; (s) providing Peltier effect; (t) diffusion of illumination from the display; (u) monitoring; (v) recording; (w) alerting; (x) messaging; (y) light guiding; (z) flexibility. The user interface may comprise a display element from illumination from the display that may be configured to be selectively positioned on the exterior surface of the cover; and the display element of the user interface may comprise at least one of (a) an icon; (b) a symbol; (c) a button indicator; (d) a menu system; (e) a display panel image; (f) an information display image; (g) a graphics display image; (h) a control panel; (i) an input panel; (j) a touch screen; (k) a repositionable image; (l) a projected image; (m) an image element selectively positionable on the exterior surface of the cover by interaction with the vehicle occupant. The display element of the user interface may be configured to be positioned on the exterior surface of the cover (a) contacting of the exterior surface of the cover at a position where the display element may be to be displayed when the display element may be not displayed; (b) contacting the exterior surface of the cover where the display element may be displayed and dragging the display element along the exterior surface of the cover to a position where the display element may be to be displayed. The user interface may be configured (a) to be activated for operation by compressing the cover toward the sensor and/or (b) to be operated by contacting the exterior surface within a distance where input can be detected by the sensor and/or (c) to be operated by movement directed by the vehicle occupant above the exterior surface of the cover within a distance where input can be detected by the sensor.

FIGURES

FIGS. 10A through 10E are schematic perspective views of a vehicle interior component with a component/display configured to provide a user interface according to an exemplary embodiment.

FIG. 20 is a schematic perspective view of a vehicle interior component comprising a user interface/display according to an exemplary embodiment.

FIG. 21A is a schematic diagram of a vehicle interior component comprising a compartment according to an exemplary embodiment.

FIG. 21B is a schematic diagram of a user interface/display for a vehicle interior component comprising a compartment according to an exemplary embodiment.

FIG. 22A is a schematic diagram of a vehicle interior component comprising a compartment according to an exemplary embodiment.

FIG. 22B is a schematic diagram of a user interface/display for a vehicle interior component comprising a compartment according to an exemplary embodiment.

DESCRIPTION

Figure 1A:
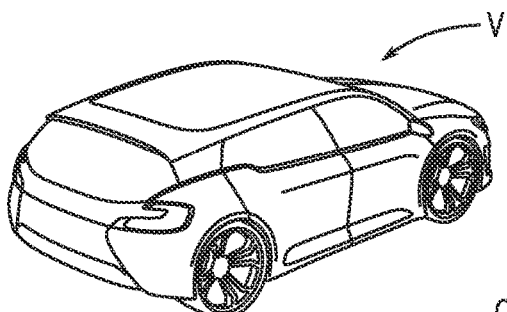
FIGS. 1A and 1B are schematic perspective views of a vehicle according to an exemplary embodiment.
Figure 1B:
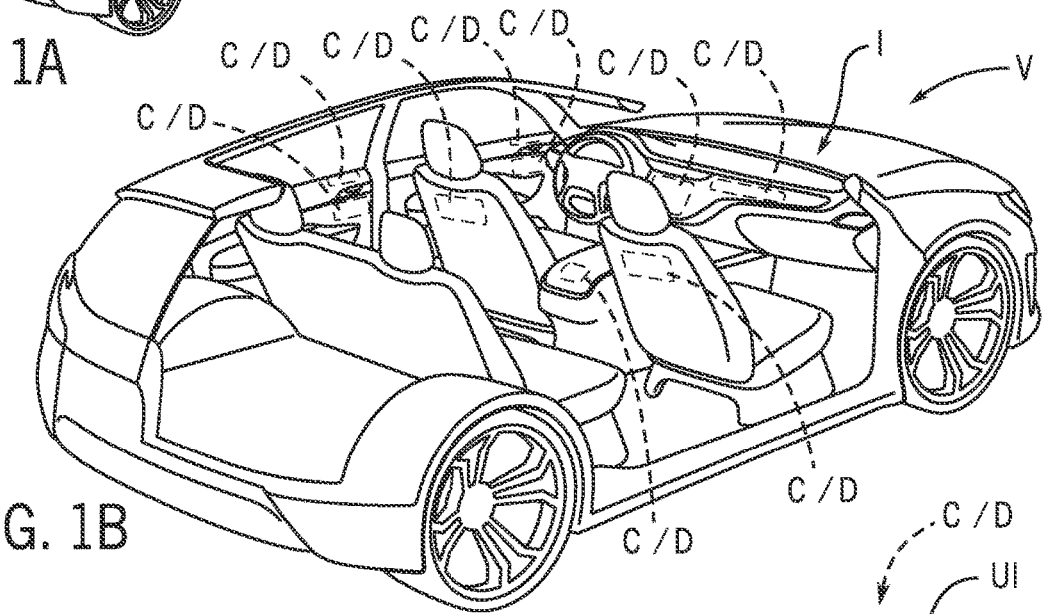
Figure 1D:
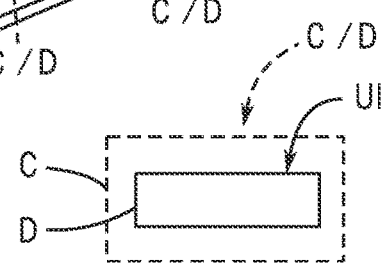
FIG. 1D is a schematic diagram of a component providing a display for a user interface for a vehicle interior according to an exemplary embodiment.
Figure 1C:
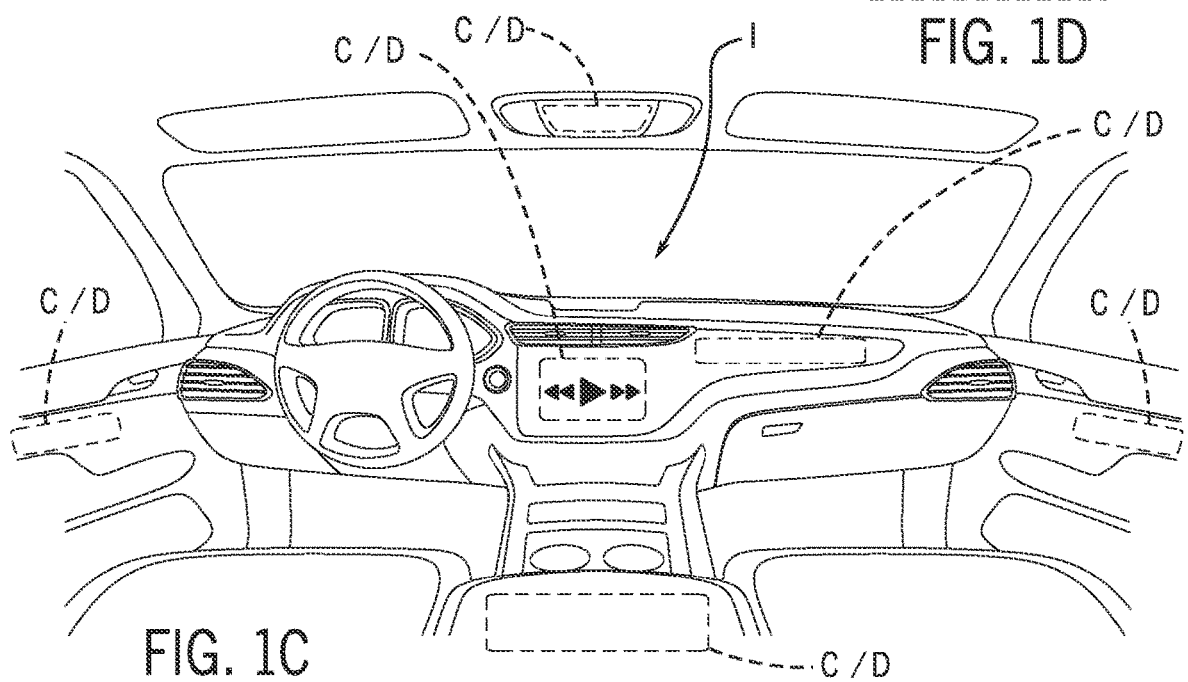
FIG. 1C is a schematic perspective view of an interior of a vehicle according to an exemplary embodiment.

Referring to FIGS. 1A-1C, a vehicle V is shown with an interior I. As shown schematically according to an exemplary embodiment in FIGS. 1B-1D, the interior I of the vehicle V provides a component C configured to provide a display D. As indicated schematically in FIGS. 1C-1D, 2 and 3, the component/display C/D may be configured to present a user interface for interaction with an occupant of the vehicle (e.g. a display/user interface on an area/section of the exterior surface of the component); the component/display may be provided at any of a variety of positions/locations in the interior, for example on a door panel, console (overhead, floor, etc.), instrument panel, trim panel, other trim/other panel, seat/seating system, etc. (e.g. integrated, installed, embedded, attached to trim/components within the interior of the vehicle). See also FIGS. 2, 3, 5A-5D and 10A (showing display configuration for component C in various arrangements for vehicle interior components).

Figure 2:
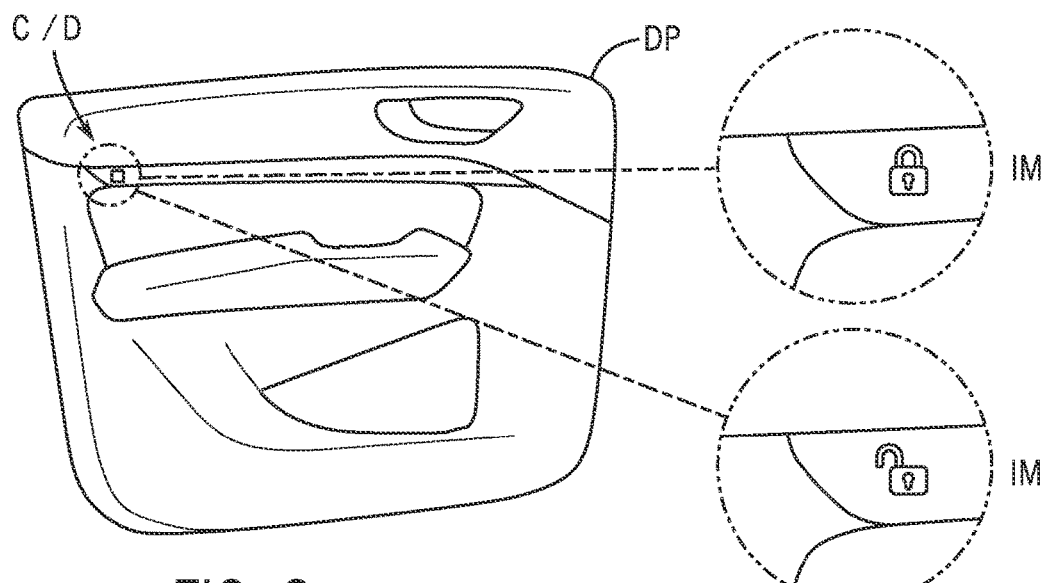
FIGS. 2 and 3 are schematic perspective views of a vehicle interior component with a component/display configured to present an image for a user interface according to an exemplary embodiment.
Figure 3:
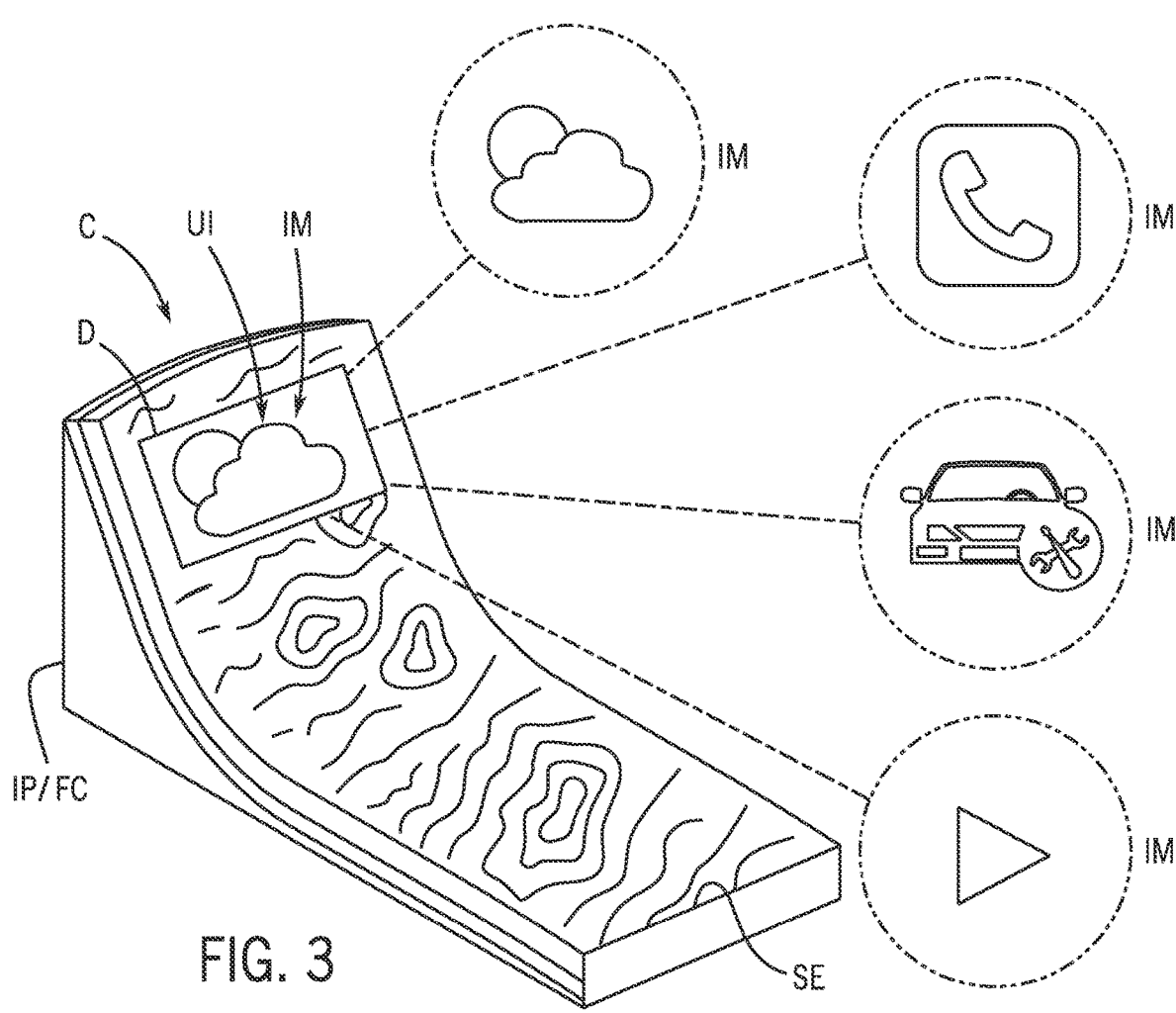

As shown schematically according to an exemplary embodiment in FIGS. 2 and 3, the component C may be configured to present a display D (configured to provide the user interface/UI) that can present an image IM. See also FIG. 1D. As indicated schematically, the component may be configured to present a panel/control for interaction with the occupant of the vehicle (e.g. a user interface through a display with sensor, such as touch panel/motion sensor) with vehicle systems or other associated systems (e.g. vehicle data/status, vehicle controls, networking/data communications, information/data sources, entertainment such as audio/video, telephony, etc.). See FIGS. 1C-1D, 2 and 3. According to an exemplary embodiment, the component/display may be configured with a system to provide a user interface allowing the vehicle operator to interact with other systems (including vehicle systems, network connected systems, data networks/internet, etc.). See FIGS. 16A-16C.

As shown schematically according to an exemplary embodiment in FIG. 2, the component/display D is shown as presenting an image IM on an area of interior trim/door panel DP of a door for the vehicle; the image IM presented at the display/for interaction (for the user interface/UI) may be representative of the status of a vehicle system, for example the status of a lock on the door (locked or unlocked); the component/display C/D may be configured (at the user interface/UI) to facilitate interaction between the occupant of the vehicle and the vehicle system (e.g. to display status of the vehicle system and to allow control/operation of the vehicle status, such as to allow locking/unlocking of the door by touching/motion at the user interface/sensor).

As shown schematically according to an exemplary embodiment in FIGS. 3 and 5A-5D, the component/display D is shown as presenting an image IM on an interior component (console FC/panel IP) for the vehicle; the image IM presented at the display for interaction (for the user interface/UI) may be representative of the status of a vehicle system, for example information about conditions (e.g. weather report from data/network/internet connectivity), communications (e.g. telephone/data connectivity and operation), vehicle system control/status (e.g. alerts, updates, etc.), entertainment system control/status and operation (e.g. vehicle audio system operation with on-board or networked connectivity), etc. The component/display C/D may be configured (at the user interface/UI) to facilitate interaction between an occupant of the vehicle and a vehicle system (e.g. to display status of the vehicle system and to allow control/operation of the vehicle status, such as to allow selection and control of a function/system by touching/motion at the user interface/sensor).

As shown schematically according to an exemplary embodiment in FIGS. 2, 3, 4A-4C and 5A-5D, the component may be configured to comprise a composite structure CS configured to present the user interface (e.g. display and/or sensor) for interaction with the vehicle occupant (e.g. configurable as a system to be installed/integrated into the vehicle interior and with connectivity to data/network/systems). See also FIGS. 6A-6B, 7A-7B, 8A-8B, 9A-9B and 10A-10E.

Figure 4A:
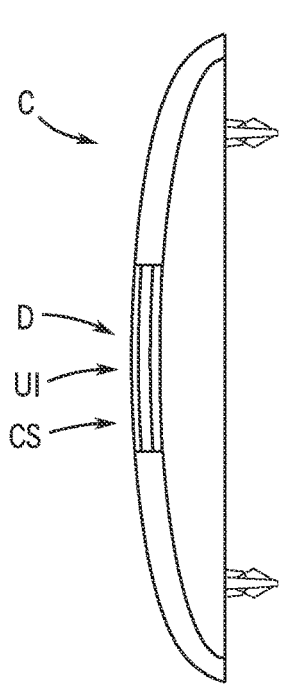
FIGS. 4A and 4B are schematic cross-section views of a vehicle interior component with a component/display configured to provide a user interface according to an exemplary embodiment.
Figure 4B:
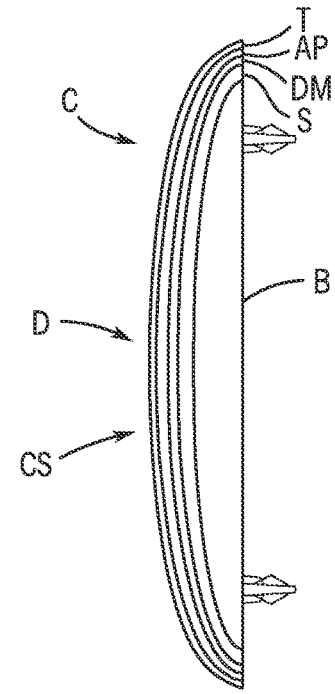
Figure 4C:
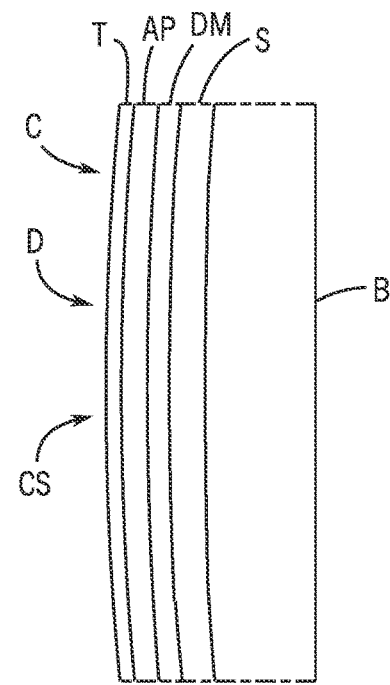
FIG. 4C is a schematic fragmentary cross-section view of a component/display configured to provide a user interface according to an exemplary embodiment.

As shown schematically according to an exemplary embodiment in FIGS. 4A and 4B, the component C may be configured with the composite structure CS for installation/integration within the vehicle on a base/structure B (such as a panel, console, structure, etc.); the composite structure may be configured to present a display section D (FIG. 4A) or display surface (FIG. 4B) and/or to operate as a user interface (e.g. with or without a sensor arrangement) presented within the vehicle interior (e.g. as installed/integrated with interior components/structures). See also FIGS. 4C and 5A-5D.

As shown schematically according to an exemplary embodiment in FIGS. 4B-4C and 5A-5D, the composite structure CS configured to present the display D for the user interface may comprise a cover T (e.g. providing an exterior surface) and substrate/carrier S (e.g. providing for installation with the base/structure) with a combination of functional segments/layers such as an absorber panel AP and a decorative material/layer DM (FIGS. 4B-4C) or with a combination of functional segments/layers such as a sensor/grid SG and light/display panel L and absorber panel AP and decorative/layer DM (FIGS. 5A-5D).

According to an exemplary embodiment, the functional segments/layers of the composite structure may be selected and configured to provide intended functionality as a system (e.g. selected arrangement/combination of functions) for application/use as the user interface for the vehicle interior. See generally FIGS. 2, 3, 4B, 5A-5D, 6A-6B, 7A-7B, 8A-8B, 9A-9B, 10A-10E, 11A-11C, 12A-12C, 13A-13C, 14A-14C and 15A-15C.

As shown schematically according to an exemplary embodiment in FIGS. 6A-6B, 7A-7B, 8A-8B, 9A-9B and 10B-10E, the composite structure CS may comprise an assembled/layered construction with selected functional segments/layers for the application; as indicated schematically the segments/layers may be assembled with an adhesive A and/or air gap AG in the assembly/construction of the composite structure for the component (e.g. adjacent positioning, adhesive attachment, direct positioning, indirect/separated positioning, etc.). See also FIGS. 4A-4C and 5A-5D. As indicated schematically according to an exemplary embodiment in FIGS. 10A-10E, the component C may be configured to present an image IM at the display D for the user interface in a structure/component configured with trim/edge TR for installation in/on a vehicle interior component. See also FIGS. 1B-1C, 2 and 3.

As indicated schematically, the absorber panel of the composite structure may comprise an addressable display configured to present a display/image (e.g. configured to present the image display at the exterior surface of the cover) or a background panel configured to provide a background for the light/display panel (e.g. configured to enhance the image display from the light/display panel at the exterior surface of the cover). See generally FIGS. 11A-11C, 12A-12C, 13A-13C, 14A-14C and 15A-15C.

Figure 6A:
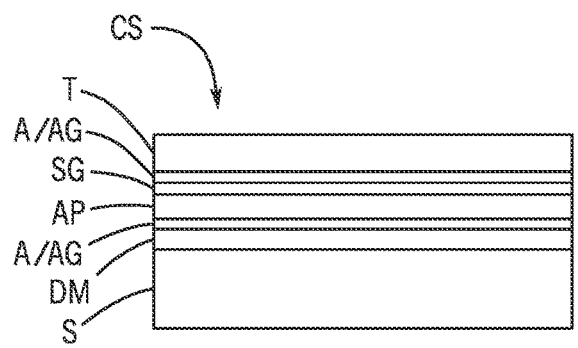
FIG. 6A is a schematic fragmentary cross-section view of a component/display configured to provide a user interface according to an exemplary embodiment.
Figure 6B:
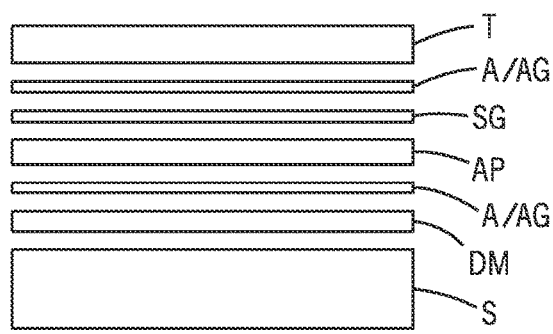
FIG. 6B is a schematic exploded fragmentary cross-section view of a component/display configured to provide a user interface according to an exemplary embodiment.
Figure 7A:
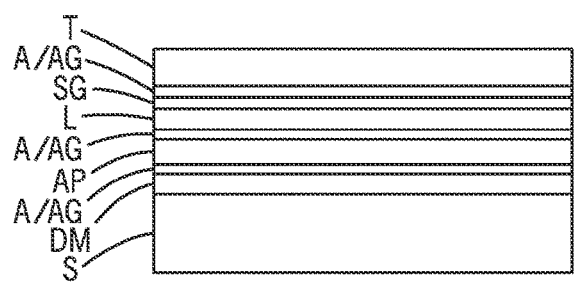
FIG. 7A is a schematic fragmentary cross-section view of a component/display configured to provide a user interface according to an exemplary embodiment.
Figure 7B:
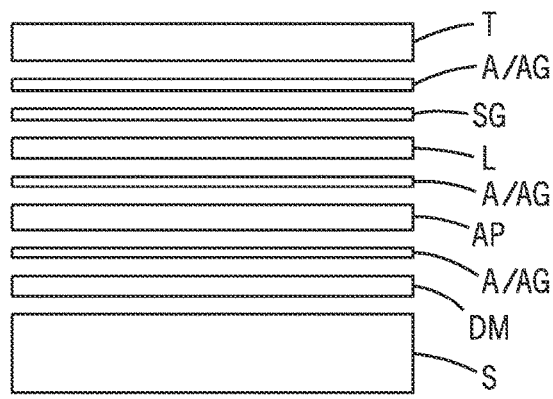
FIG. 7B is a schematic exploded fragmentary cross-section view of a component/display configured to provide a user interface according to an exemplary embodiment.

As indicated schematically in FIGS. 6A-6B and 10C, the composite structure may comprise cover T and sensor grid SG and absorber panel AP and decorative material/layer DM on the substrate/carrier S; in operation, the composite visual effect at the display of the composite structure through the exterior surface of the cover may comprise a visual effect presented by the absorber panel and the decorative material; the user interface may comprise interaction with the sensor grid and the display D/image IM presented by the absorber panel. See also FIGS. 11A-11C and 12A-12C (use of absorber panel shown as stand-alone absorber display).

As indicated in FIGS. 7A-7B and 10A-10B, the composite structure may comprise cover T and sensor grid SG and light/display panel L and absorber panel AP and decorative material/layer DM on the substrate/carrier S; in operation, the composite visual effect at the display of the composite structure through the exterior surface of the cover may comprise a visual effect presented by output from the display panel over the absorber panel and the decorative material; the user interface may comprise interaction with the sensor grid and the display D/image IM presented by the absorber panel. See also FIGS. 13A-13C (use of absorber panel as background panel for light/display panel) and FIGS. 14A-14C (use of absorber panel shown as absorber display with light/display panel) and FIGS. 15A-15C (use of display system without absorber panel).

Figure 8A:
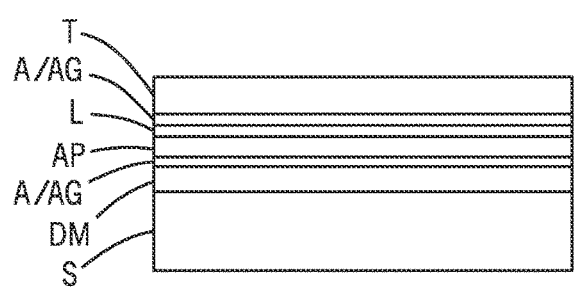
FIG. 8A is a schematic fragmentary cross-section view of a component/display configured to provide a user interface according to an exemplary embodiment.
Figure 8B:
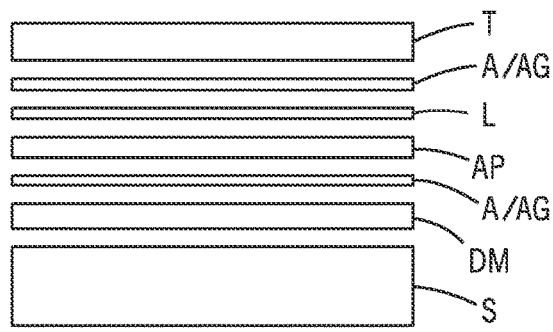
FIG. 8B is a schematic exploded fragmentary cross-section view of a component/display configured to provide a user interface according to an exemplary embodiment.

As indicated in FIGS. 8A-8B, the composite structure may comprise cover T and light/display panel L and absorber panel AP and decorative material/layer DM on the substrate/carrier S; in operation, the composite visual effect at the display of the composite structure through the exterior surface of the cover may comprise a visual effect presented by output from the display panel over the absorber panel and the decorative material; the user interface may comprise interaction with the display presented by the display panel over the absorber panel. See also FIGS. 13A-13C (use of absorber panel as background panel for light/display panel) and FIGS. 14A-14C (use of absorber panel shown as absorber display with light/display panel).

As indicated in FIG. 10D, the composite structure may comprise cover T and absorber panel AP and decorative material/layer DM on the substrate/carrier S; in operation, the composite visual effect SE at the display of the composite structure through the exterior surface of the cover may comprise a visual effect presented by the absorber panel and the decorative material; the user interface may comprise interaction with the display D/image IM presented by the absorber panel. See also FIGS. 11A-11C and 12A-12C (use of absorber panel shown as stand-alone absorber display).

Referring to FIGS. 11A-11C and 12A-12C, operation of the component/composite structure in a user interface/display system with a stand-alone absorber panel AP (e.g. without light/display panel) configured to provide the display for user interface is shown schematically according to an exemplary embodiment; absorber panel AP may comprise an addressable display configured to present a display/image (e.g. configured to present the image display at the exterior surface of the cover).

Referring to FIGS. 13A-13C and 14A-14C, operation of the component/composite structure in a user interface/display system with an absorber panel AP and a light/display panel L configured in combination to provide the display for user interface is shown schematically according to an exemplary embodiment; absorber panel AP may comprise a background panel configured to provide a background for the light/display panel (e.g. configured to enhance the image display from the light/display panel at the exterior surface of the cover).

As shown schematically according to an exemplary embodiment in FIGS. 11A-11C, 12A-12C, 13A-13C and 14A-14C, the user interface/display system may be configured to operate with a control system for interaction with vehicle systems and/or through user input such as by a command/signal (e.g. from input such as sensor/sensor grid, etc.) at a user interface and for connectivity with a network (e.g. vehicle network or other network configured to provide communications/data, etc.); activation of the user interface/display system to operate the control system may facilitate or produce the selection of data to be presented as an image (e.g. data/pattern providing content/graphic information) for the user interface/display system (e.g. for interaction with a vehicle occupant). See also FIGS. 2 and 3.

Figure 11A:
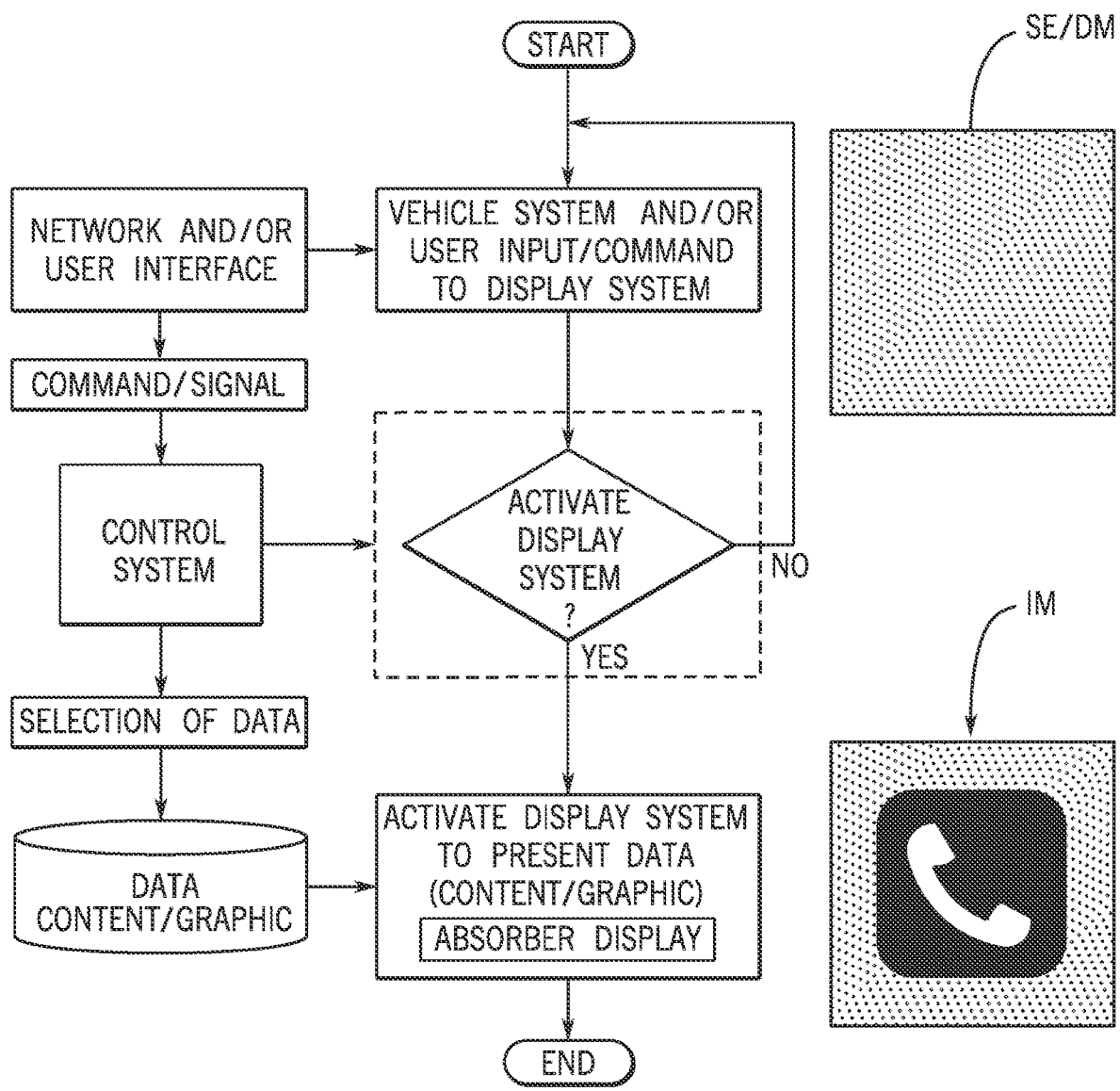
FIG. 11A is a schematic flow diagram of operation of a component/display for a user interface/display system configured to provide a user interface according to an exemplary embodiment.
Figure 11B:
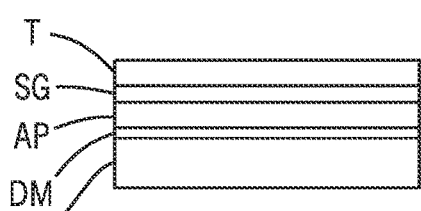
FIG. 11B is a schematic fragmentary cross-section view of a component/display configured to provide a user interface according to an exemplary embodiment.
Figure 11C:
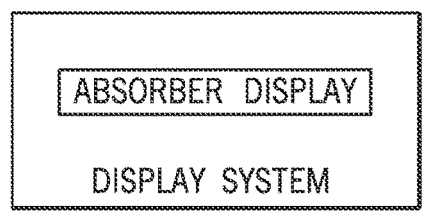
FIG. 11C is a schematic block diagram of a component/display for a user interface/display system configured to provide a user interface according to an exemplary embodiment.

As indicated schematically in FIGS. 11A-11C, operation of the user interface/display system with absorber panel AP comprising absorber display may comprise display of data presented as a composite visual effect of an image IM (e.g. data/pattern providing content/graphic information shown as telephony control) from the absorber display and the visual effect of the decorative material DM (e.g. shown as a conventional/monolithic background) at the exterior surface of the cover for the user interface. See also FIG. 10C. (As shown schematically, the user interface may be configured for interaction with a vehicle occupant, such as through a sensor to operate/control vehicle systems or other systems.)

Figure 12A:
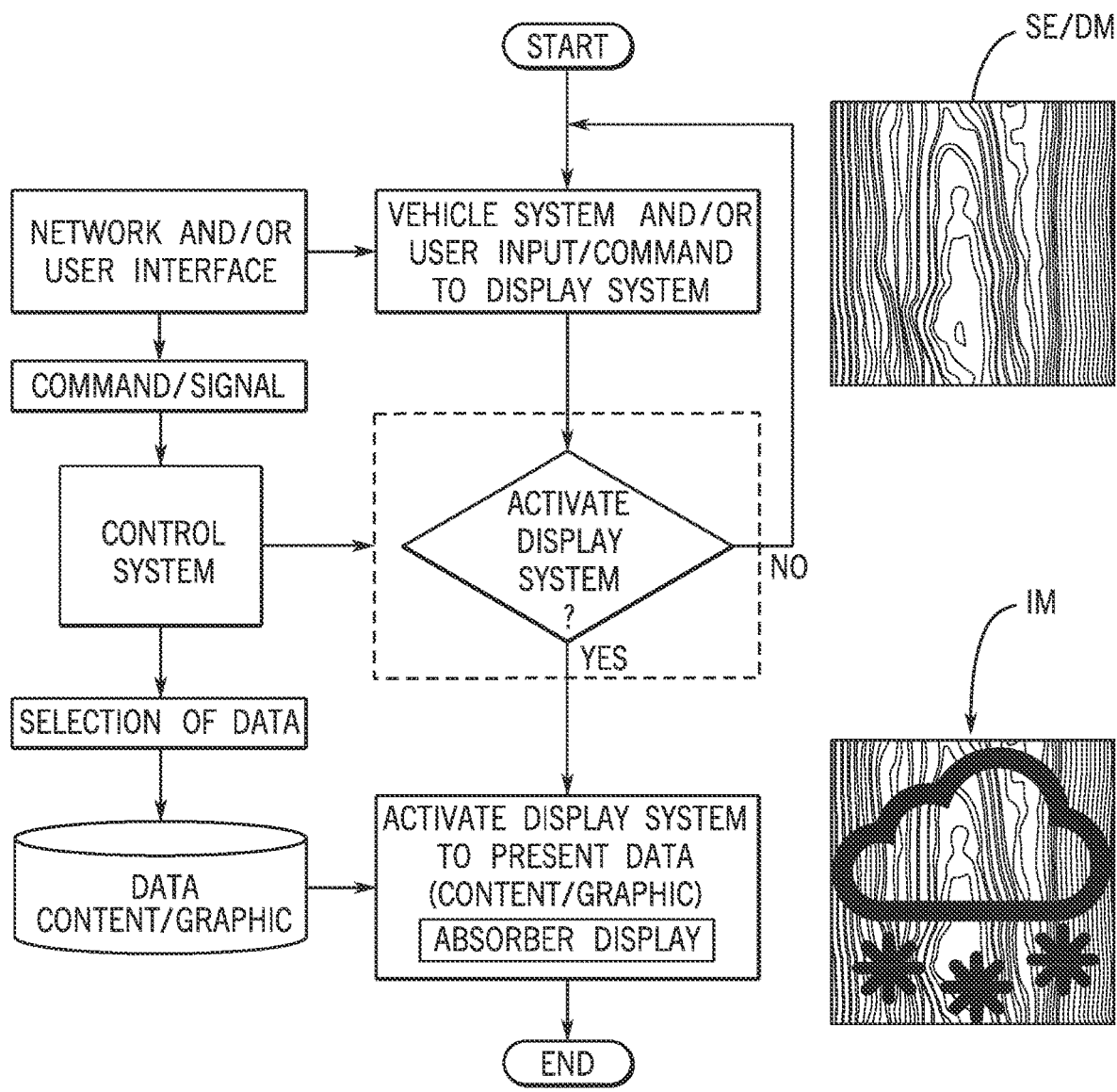
FIG. 12A is a schematic flow diagram of operation of a component/display for a user interface/display system configured to provide a user interface according to an exemplary embodiment.
Figure 12B:
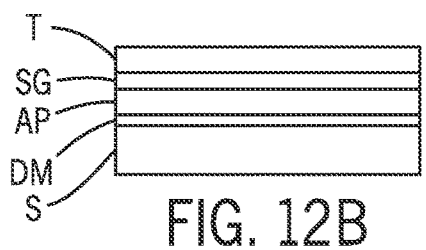
FIG. 12B is a schematic fragmentary cross-section view of a component/display configured to provide a user interface according to an exemplary embodiment.
Figure 12C:
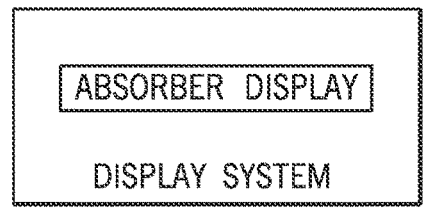
FIG. 12C is a schematic block diagram of a component/display for a user interface/display system configured to provide a user interface according to an exemplary embodiment.

As indicated schematically in FIGS. 12A-12C, operation of the user interface/display system with absorber panel AP comprising absorber display may comprise display of data presented as a composite visual effect of an image IM (e.g. data/pattern providing content/graphic information shown as telephony control) from the absorber display and the visual effect of the decorative material DM (e.g. shown as a decorative wood trim appearance background) at the exterior surface of the cover for the user interface. See also FIG. 10D.

Figure 13A:
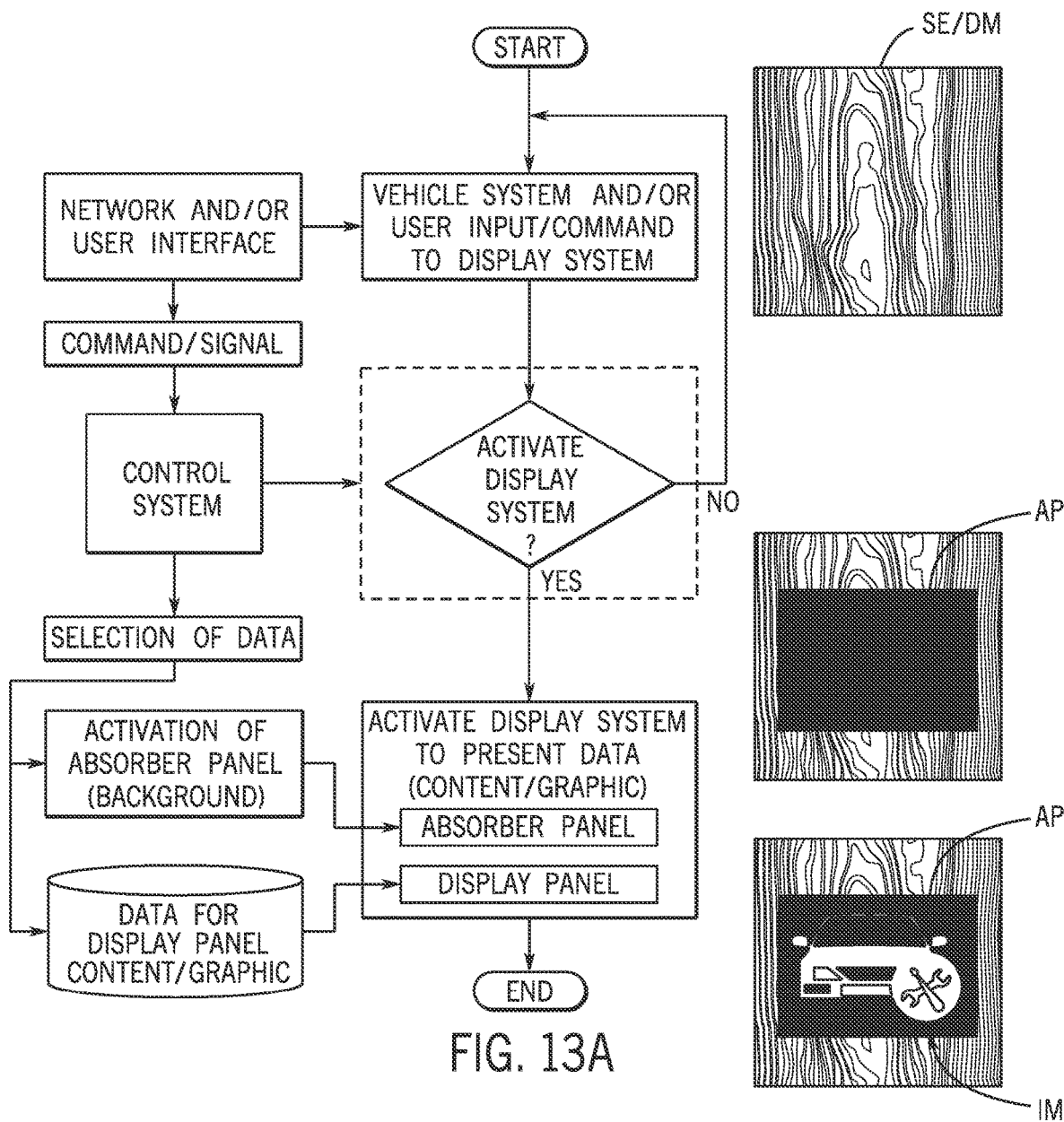
FIG. 13A is a schematic flow diagram of operation of a component/display for a user interface/display system configured to provide a user interface according to an exemplary embodiment.
Figure 13B:
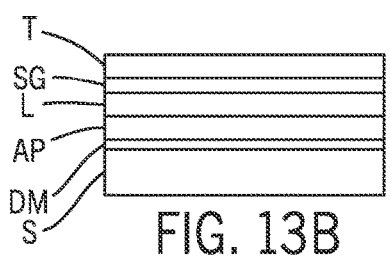
FIG. 13B is a schematic fragmentary cross-section view of a component/display configured to provide a user interface according to an exemplary embodiment.
Figure 13C:
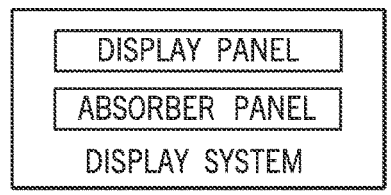
FIG. 13C is a schematic block diagram of a component/display for a user interface/display system configured to provide a user interface according to an exemplary embodiment.

As indicated schematically in FIGS. 13A-13C, operation of the user interface/display system with absorber panel AP comprising an absorber background panel configured to provide a background for the light/display panel L (e.g. configured to enhance the image display from the light/display panel) may comprise display of data presented as a composite visual effect of an image IM (e.g. data/pattern providing content/graphic information shown as vehicle system status/control) from the light/display panel on the absorber/background panel (e.g. to provide contrast enhancement) and the visual effect of the decorative material DM (e.g. shown as a decorative wood trim appearance background) at the exterior surface of the cover for the user interface. (As indicated schematically in FIG. 13A, the absorber panel functioning as a background panel for the display panel is generally transparent when off and provides a dark/black background area when activated/on.) As indicated schematically, the composite visual effect for the user interface/display system is enhanced through the use of the absorber background panel to provide a background for the image presented by the light/display panel. See FIGS. 10A-10B.

Figure 14A:
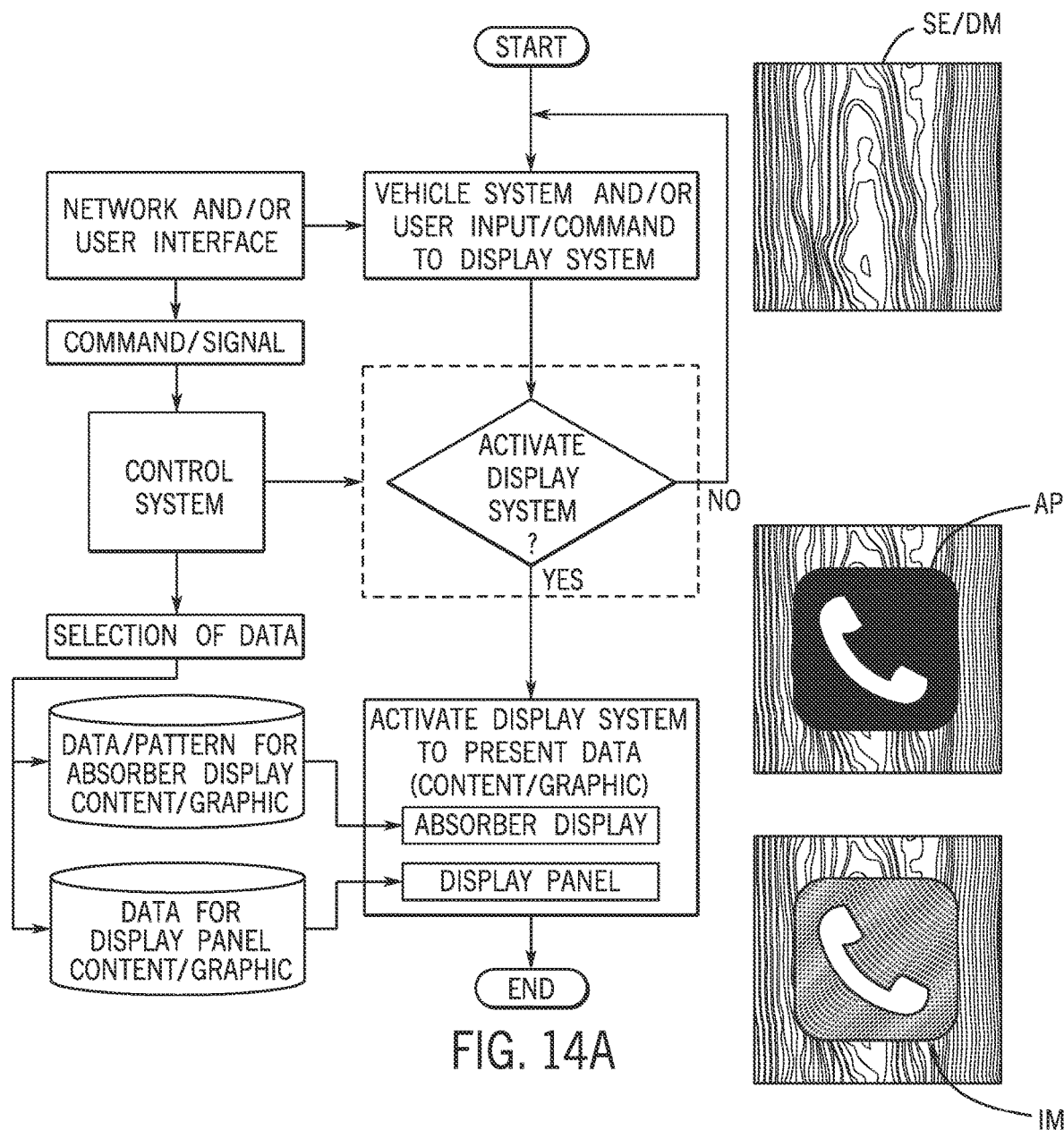
FIG. 14A is a schematic flow diagram of operation of a component/display for a user interface/display system configured to provide a user interface according to an exemplary embodiment.
Figure 14B:
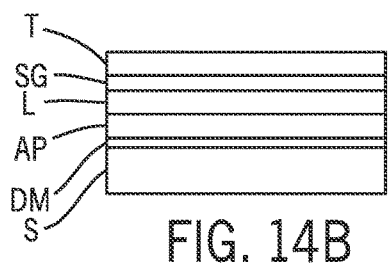
FIG. 14B is a schematic fragmentary cross-section view of a component/display configured to provide a user interface according to an exemplary embodiment.
Figure 14C:
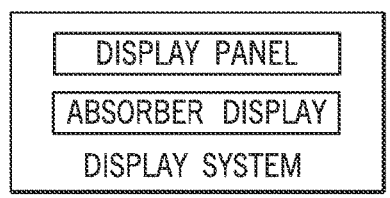
FIG. 14C is a schematic block diagram of a component/display for a user interface/display system configured to provide a user interface according to an exemplary embodiment.

As indicated schematically in FIGS. 14A-14C, operation of the user interface/display system with absorber panel AP comprising absorber display configured to operate in combination with the light/display panel L (e.g. configured to augment/enhance the image display from the light/display panel) may comprise display of data presented as a composite visual effect of an image IM from the light/display panel and of an image IM from the absorber display and the visual effect of the decorative material DM (e.g. shown as a decorative wood trim appearance background) at the exterior surface of the cover for the user interface. As indicated schematically the composite visual effect for the user interface/display system is enhanced through the use of the absorber display panel to provide an image from a data pattern to augment/background the image presented by the light/display panel (example image for the display comprises content/graphic information shown as telephony control). See also FIGS. 10A-10B.

As indicated schematically in FIGS. 11A, 12A, 13A and 14A, the system may be configured to be operated with data and command/signal provided from any of a variety of sources including but not limited to input from a user interface (e.g. from a vehicle occupant) and/or a signal from a network (e.g. local/vehicle network, wireless network, connected network, Internet, etc.) and/or vehicle system; as indicated schematically, data (including content/graphics, etc.) may be stored and accessed from any of a variety of locations/sites (e.g. local, network, remote, etc.) and selected for display/presentation at the display system.

Referring to FIGS. 16A-16C, 17A-17B, 18A-18B and 19, structure/configuration and data connectivity of the user interface/display system for the component/composite structure is shown schematically; the system may comprise the functional elements (e.g. absorber panel, light/display panel, sensor grid, etc.) and connectivity through a connector CN to an interface and control system (e.g. with computer system and controller and data input/output) with connectivity through a network (e.g. data communications/connectivity with vehicle systems, vehicle network, internet/network, data, etc.).

Figure 16A:
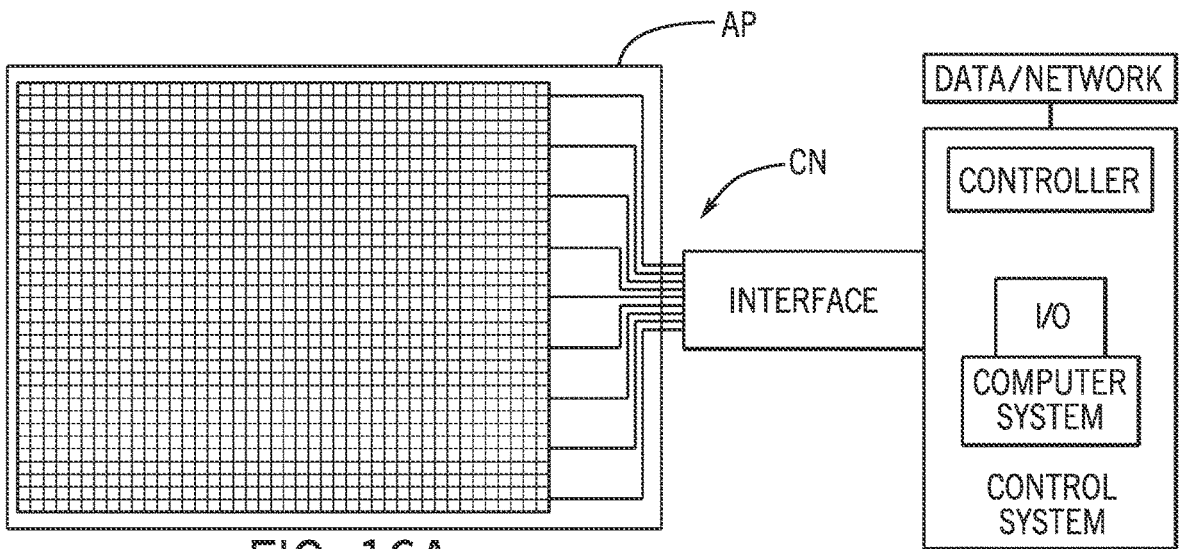
FIG. 16A is a schematic block diagram of absorber panel arrangement for a user interface/display system according to an exemplary embodiment.
Figure 16B:
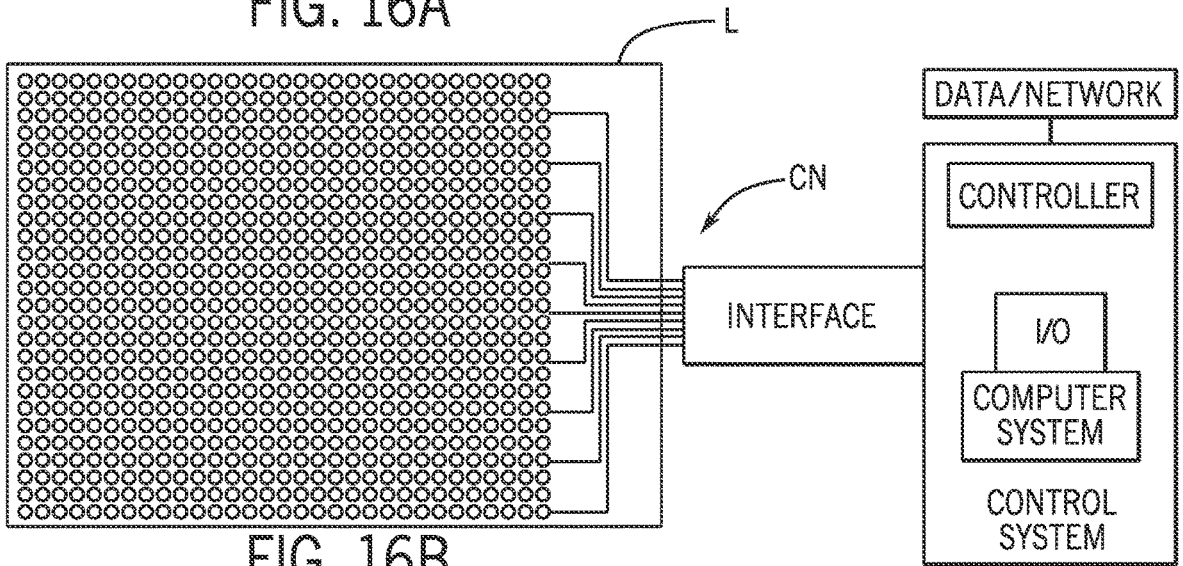
FIG. 16B is a schematic block diagram of light/display panel arrangement for a user interface/display system according to an exemplary embodiment.
Figure 16C:
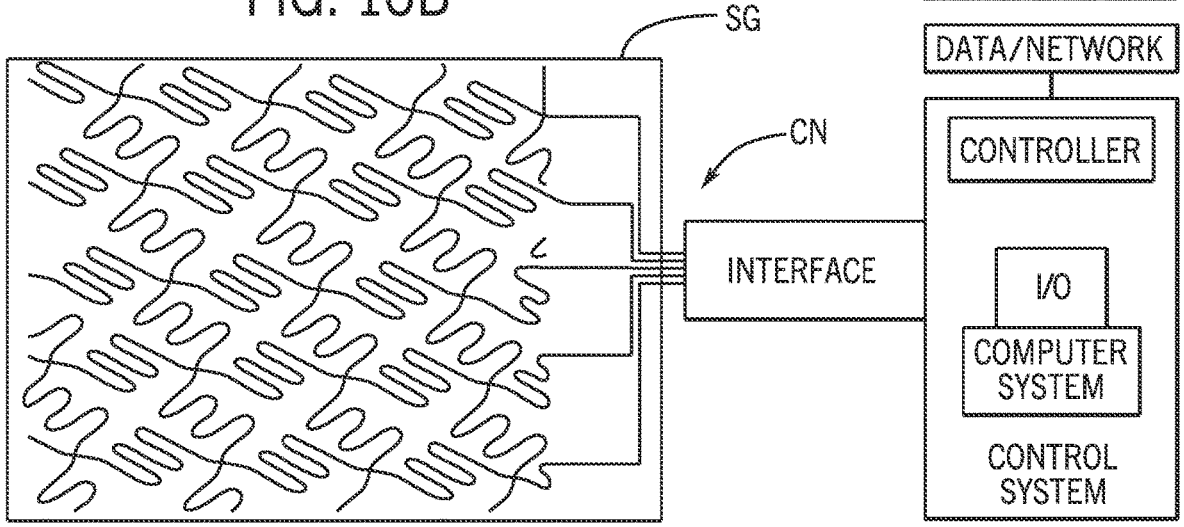
FIG. 16C is a schematic block diagram of sensor grid panel arrangement for a user interface/display system according to an exemplary embodiment.
Figure 17A:
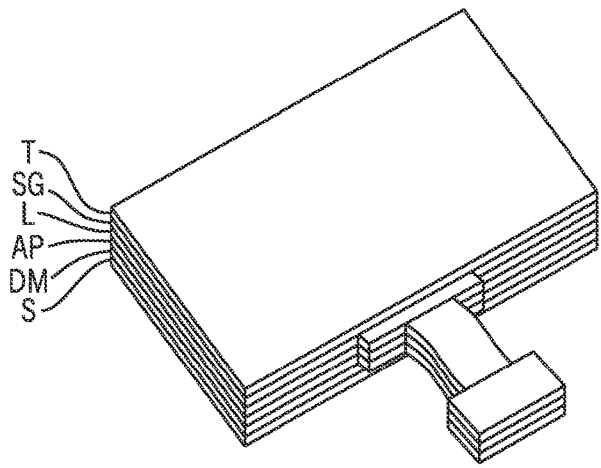
FIG. 17A is a schematic perspective view of a user interface/display system according to an exemplary embodiment.
Figure 17B:
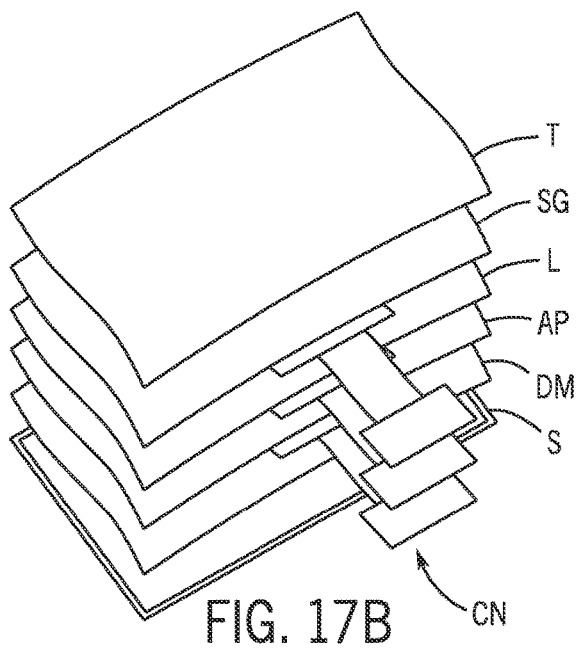
FIG. 17B is a schematic exploded perspective view of a user interface/display system according to an exemplary embodiment.
Figure 18A:
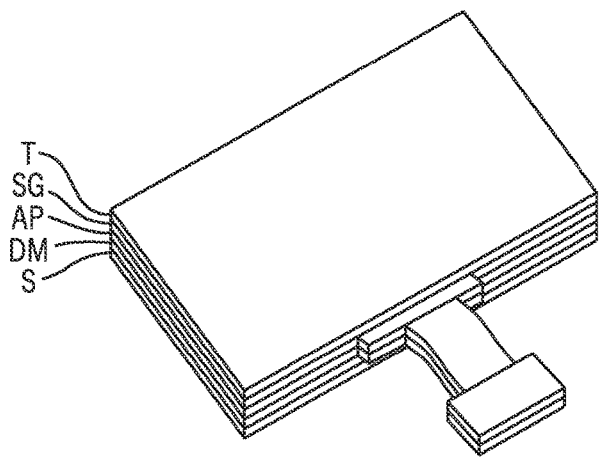
FIG. 18A is a schematic perspective view of a user interface/display system according to an exemplary embodiment.
Figure 18B:
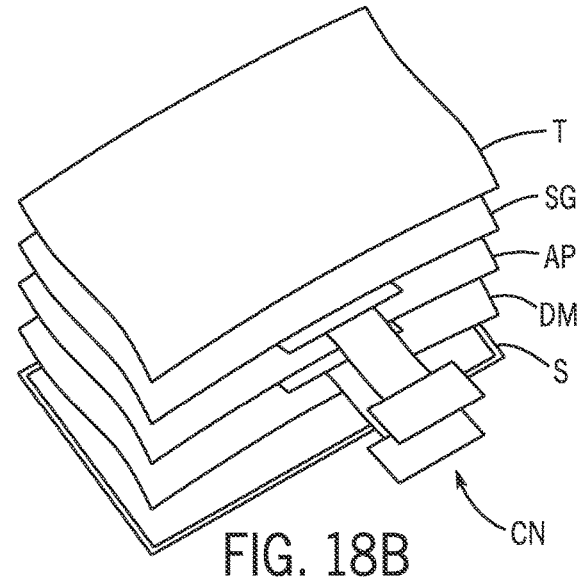
FIG. 18B is a schematic exploded perspective view of a user interface/display system according to an exemplary embodiment.
Figure 19:
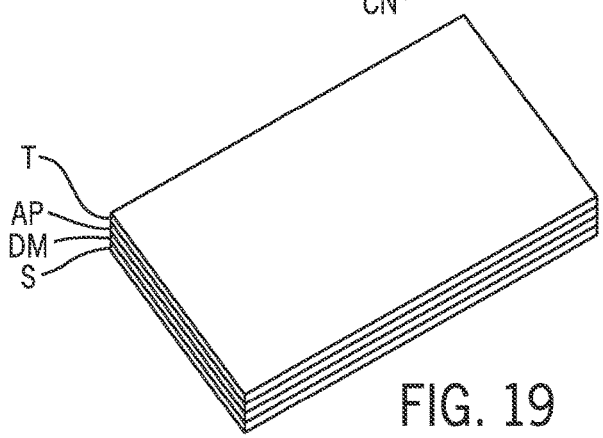
FIG. 19 is a schematic perspective view of a user interface/display system according to an exemplary embodiment.
Figure 23A:
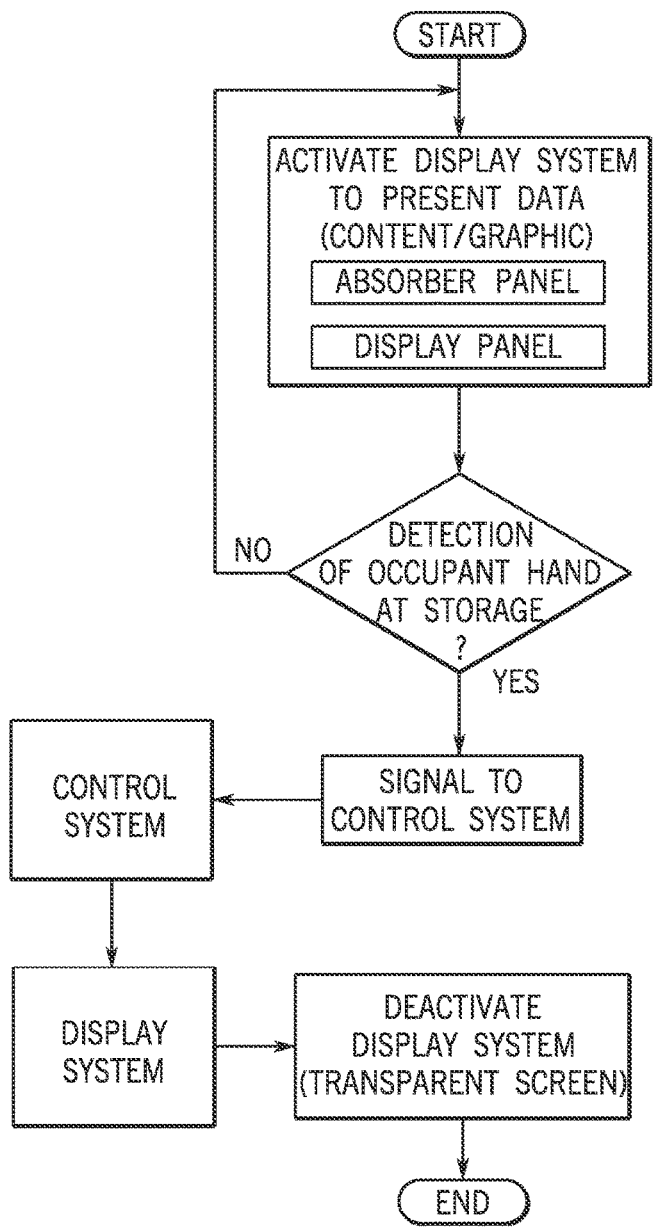
FIG. 23A is a schematic flow diagram of operation of a component/display for a user interface/display system configured to provide a user interface according to an exemplary embodiment.
Figure 23B:
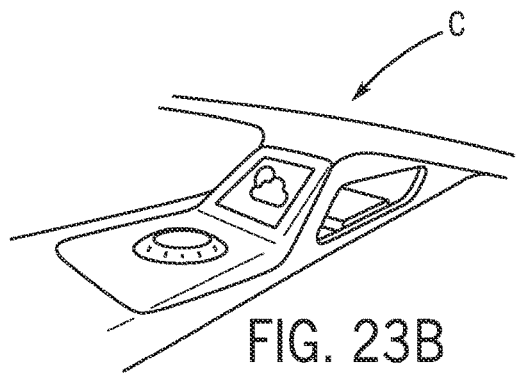
FIGS. 23B through 23D are schematic perspective views of a vehicle interior component comprising a user interface/display according to an exemplary embodiment.
Figure 23C:
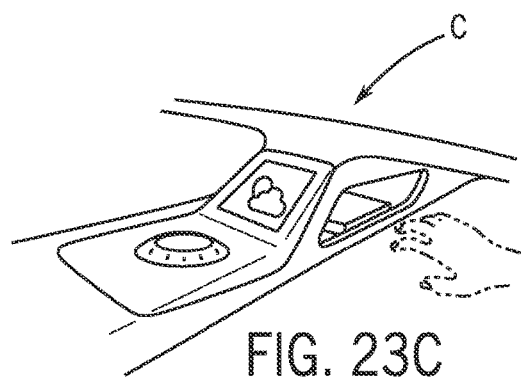
Figure 23D:
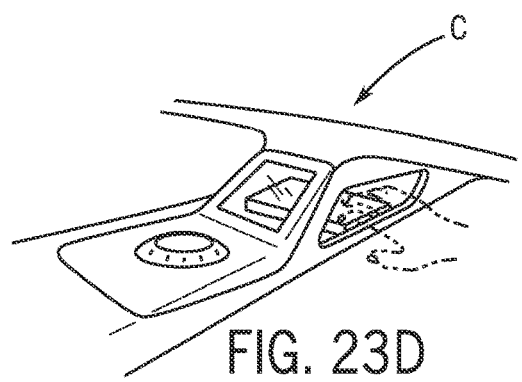
Figure 23E:
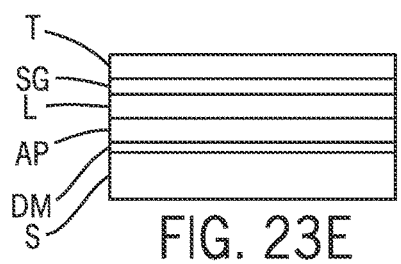
FIG. 23E is a schematic fragmentary cross-section view of a component/display configured to provide a user interface according to an exemplary embodiment.
Figure 23F:
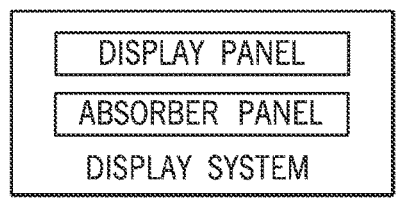
FIG. 23F is a schematic block diagram of a component/display for a user interface/display system configured to provide a user interface according to an exemplary embodiment.

As indicated schematically in FIG. 16A, the composite structure may comprise an absorber panel AP configured to present a background panel (e.g. configured to turn on/off to facilitate display from a display panel) and/or an as addressable panel (e.g. configured to present an image). As indicated schematically in FIGS. 16B and 16C, the system may comprise a light panel L and/or a sensor grid SG. See also FIGS. 6A-6B, 7A-7B, 8A-8B and 10A-10E.

As indicated schematically according to an exemplary embodiment, the user interface as configured for the component may comprise a "passive" interface (e.g. providing for output such a by a display, signal, audio, etc.) and/or an "interactive" interface (e.g. providing for input such as by a sensor, touch, audio, etc.); according to an exemplary embodiment, the user interface may or may not comprise an interactive configuration (e.g. may or may not facilitate or accept input from a vehicle occupant).

As indicated schematically according to an exemplary embodiment, the display and/or display panel may comprise a subcomponent configured to provide a display of light and/or as a light source (e.g. display, screen, light emitting diode/LED, LED array, LED mat, etc.); the display/display panel may comprise any of a wide variety of forms including commercially available technology/products.

As indicated schematically according to an exemplary embodiment, the absorber panel (e.g. variable absorber) may comprise any of a wide variety of types and forms including commercially available technology/products (including but not limited to liquid crystal, twisted nematic liquid crystal, etc.); the absorber panel may comprise a configuration that is either (a) transparent when power is off (e.g. "white mode" when no power consumption) or (b) dark/black when power is off (e.g. "black mode" when no power consumption). As indicated, "active" and "inactive" will correlate to the state of the display from the absorber panel (notwithstanding the state of power consumption): "inactive" will comprise a state of display when the absorber panel provides relative transparency and no background/contrast or image display is provided by the absorber panel (only a decorative material if any is visible); "active" will comprise a state of display when the absorber panel provides a background/contrast or image display (e.g. an image/contrast for images display is presented). (According to an exemplary embodiment, the absorber panel as selected for use may be on or off when in an "inactive" state (depending upon the configuration).)

Composite Visual Effect/Operation of User Interface/Display System

According to an exemplary embodiment, the user interface/display system will be configured and operated to provide a composite visual effect comprising the visual effect of a selected decorative material/layer (e.g. authentic decorative material, imitation decorative material, authentic wood trim, imitation wood trim, stone appearance, metal appearance, plastic contour effect, veneers, decorative finishes, paint/colors, foils, films, labels, in-mold labels, coatings, background art/effects, etc.) at the exterior surface of the cover for the user interface/ornamental appearance of the component; a composite visual effect may be available to be created with the composite structure that facilitates variations and design options and color choices for vehicle interior appearance (beyond conventional arrangements that tend to be limited to black/gray/dark surfaces) including enhancement of appearance with variations in contrast levels between an activated/on state and an off state. See e.g. FIGS. 4, 5A-5D, 10A-10E, 11A, 12A, 13A and 14A (indicating user interface with intuitive and seamless information display with a non-distracting authentic material visual appearance with optional touch-input capability such as from a sensor grid such as a capacitive touch panel, ITO panel/grid, film/foil, etc.).

As indicated schematically according to an exemplary embodiment, when the display/user interface is in an off state the absorber panel (and the display panel (if any)) may remain generally transparent and the composite visual effect at the exterior surface of the cover of the component may be provided substantially by the visual effect of the decorative material/layer; when the display/user interface is in an on state the absorber panel (and the display panel (if any)) may be activated to present an image and the composite visual effect at the exterior surface of the cover of the component may be provided by the image and/over the visual effect of the decorative material/layer. See FIGS. 10A-10E, 11A, 12A, 13A and 14A. As indicated schematically in FIGS. 11A and 12A, the absorber panel may present an image/display; as indicated schematically in FIGS. 13A and 14A, the absorber panel may be combined with a display panel to present an image/display (e.g. visually enhanced by combination of illumination from the display panel and contrast-enhancement from the absorber panel, such as providing a dark/black background for illumination from the display).

According to an exemplary embodiment, the functional layers of the composite structure of the component may comprise an integrated sensor grid (such as a capacitive touch panel, force sensors, etc.) and/or integrated haptic/mechanical feedback arrangement (e.g. actuators, piezoelectric elements, etc.) within the construction or at the substrate/base (e.g. carrier) of the component.

As indicated schematically, the user interface/display may be configured and connected to operate any of a wide variety of vehicle systems (e.g. for environment controls, audio controls, light controls, door/other locks, personalization/settings, data connection, etc.).

Elements/Materials of Construction

According to an exemplary embodiment, the elements of the composite structure may be selected and sized/fit for the particular/intended use and application of the component and intended function of the user interface for the vehicle interior. See generally FIGS. 1B-1C, 2, 3 and 5A-5D.

As indicated schematically, the absorber panel may comprise or be constructed from a variable absorber configuration such as with "smart glass" (or switchable glass) in the form of a glass material with light transmission properties that can be controlled (e.g. modified by a control signal such as applied voltage, light or heat is applied); for example the light transmission properties may change from opaque or translucent (e.g. generally opaque/translucent) to transparent (e.g. generally transparent) or be calibrated to pass/block light completely or at certain wavelengths (e.g. to provide a tinting effect); the absorber panel may use any of a variety of technologies such as variable absorber technology, electrochromic technology, photochromic technology, thermochromic technology, suspended particle technology, micro-blind technology, liquid-crystal display technology, and polymer-dispersed liquid-crystal device technology, etc. (configured to be actuated through an connector/interface by a control system). See FIGS. 11A-11C, 12A-12C, 13A-13C, 14A-14C and 16A. The absorber panel may be selected and/or configured as a background panel (e.g. actuated on or off) or as an addressable display configured to present a display/image (e.g. configured to present an image display).

According to an exemplary embodiment, the light/display panel may comprise or be constructed from any of a wide variety of technologies including light-emitting diode technology (e.g. LED Display (Light emitting diode), organic light-emitting diode/LED (OLED), organic EL (organic electroluminescent) diode, Thin Film Electroluminescent Displays (TFEL), Passive-matrix OLED (PMOLED), Active-matrix OLED (AMOLED), Transparent OLED, Top-emitting OLED, Foldable OLED, Flexible OLED, TFEL, Quantum Dot (QD) Display (Quantum Dot), ELQD Display (Electroluminescent Quantum Dot), LC Display (Liquid Crystal), color display, color and light emitting display, etc.) in an arrangement where the display is controlled sequentially (e.g. by element, row, etc.); the display panel may comprise a construction (such as thin-film transistor back-plane construction) that can be configured to directly access/switch individual pixels (e.g. on or off); the construction of the light/display panel may include additional elements and/or layers (e.g. polarizer/polarizers, backlighting, encapsulation, etc.). (A display with OLED-type of element may not require a separate light source/array/panel to produce the visual effect; a display with LED may require a light source/array/panel for illumination of the LED to produce the visual effect.) The light/display panel may employ any of a wide variety of forms and constructions that are assembled/integrated into the composite structure and operated as the display/user interface according to specifications for the light/display panel in operating conditions (e.g. color, monochrome, intensity, etc.). As indicated, the light/display panel can be selected and/or operated to provide the intended illumination/light for the application to present the intended composite visual effect at the exterior surface of the cover of the component.

As shown schematically according to an exemplary embodiment in FIGS. 6A-6B, 7A-7B and 8A-8B, in the construction of the composite structure the absorber panel may be optically bonded to the transparent display layer for enhanced optical transparency and to prevent/reduce image quality degradation; the bonding process (e.g. depending on the shape, size, form, geometry, etc.) may use an optically clear adhesive (e.g. OCA, liquid OCA (LOCA), glue, bond, film, etc.); optical clear adhesive may be selected to provide optical characteristics (e.g high light transmittance, reduction of reflectivity) and resistance to aging effects (e.g ultra-violent weathering, etc.) as a generally transparent bond for materials/layers in the composite structure. According to an exemplary embodiment, the adhesive material for the composite structure may be of a type that is suited for the shape/contour of the component (e.g. able to be applied in an optimal manner, such as by liquid application, film layer, spray, roll, cure-hardening, etc.). See FIG. 4B (curved form) and FIGS. 5A-5D (flat form/flat-to-flat construction of layers).

As shown schematically, the cover may comprise a form/structure configured to facilitate the transmission of light (e.g. light-transmissive material). The cover may comprise an at least partially light-transmitting cover; illumination from the display at the exterior surface of the composite structure may comprise visible light transmitted through the functional layer and through the at least partially translucent cover. According to an exemplary embodiment, the cover may comprise plastic or glass or composite material (e.g. formed by molding, etc.) configured to provide scratch resistance, hardness, optical characteristics (e.g. polarization, reduced light contamination/rainbow effects, etc.), low mass/low-weight; the cover may be provided with a coating to provide improved functionality/performance and/or protection and durability (e.g. hardness, etc.). See e.g. FIGS. 3, 4A-4C and 5A-5D (e.g. showing cover structure that is rigid/semi-rigid, molded, formed, etc.) and FIGS. 10B-10E (e.g. showing cover layer that is generally flexible, sheet, etc.). The sensor may be configured to detect input from a vehicle occupant at or adjacent to the exterior surface of the cover; the display may be configured to provide illumination through the cover. See e.g. FIGS. 5A-5D and 10A-10E. The user interface may be configured for input at the cover detected by the sensor and/or output from the display presented at least partially through the cover (e.g. interaction with vehicle occupant by display and by touch, proximity, etc.). The composite structure may comprise a substrate and/or may be configured in a contoured shape. See e.g. FIGS. 4A-4C and 10A-10E.

As indicated schematically, functional layers may be attached by mechanical features (e.g. attachments, fixtures, clamps, screws, etc.) and/or by adhesive (e.g. optically clear adhesive/OCA, liquid OCA/LOCA, glue, bond, etc.). See e.g. FIGS. 6A-6B, 7A-7B, 8A-8B and 10A.

Exemplary Embodiments—A

According to an exemplary embodiment as shown schematically, a vehicle interior component may be configured to provide a user interface for a vehicle occupant in a vehicle comprising vehicle systems. See FIGS. 2, 3, 4A-4C, 5A-5D, 10A-10E, 11A-11C, 12A-12C, 13A-13C and 14A-14C.

According to an exemplary embodiment as shown schematically, the component may comprise a composite structure configured to provide the user interface comprising a cover providing an exterior surface and an absorber panel and a decorative material. See FIGS. 2, 3, 4A-4C, 5A-5D, 10A-10E, 11A-11C, 12A-12C, 13A-13C and 14A-14C. The decorative material may be configured to provide a visual effect at least partially visible at the exterior surface of the cover; the absorber panel may be configured to provide a visual effect at least partially visible at the exterior surface of the cover. The composite structure may be configured so that operation of the user interface for the vehicle occupant may comprise a composite visual effect. The component may comprise a light panel configured to provide output at least partially visible at the exterior surface of the cover; operation of the user interface for the vehicle occupant may comprise output from the light panel; the light panel may comprise a display panel; the light panel may comprise a display panel; the output of light panel may comprise a display from the display panel; the visual effect of the absorber panel may comprise a background for the display from the display panel. The absorber panel may comprise a background panel configured to provide a dark background for the display panel. The absorber panel may comprise a display panel configured to augment the output from the light panel. The light panel may comprise a display. The absorber panel may comprise a display panel; the visual effect of the absorber panel may comprise a display at least partially visible at the exterior surface of the cover. The absorber panel may comprise an addressable display. The absorber panel may comprise a display panel.

According to an exemplary embodiment as shown schematically, the composite structure may be configured so that the composite visual effect may comprise at least the visual effect of the decorative material when the composite structure may be in an off state. The composite structure may be configured for an on state and an off state; the composite visual effect of the composite structure may comprise at least the visual effect of the decorative material when the composite structure may be in an off state. The composite structure may be configured for an on state and an off state; the visual effect of the absorber panel may be generally light-transmissive when the composite structure may be in the off state. The composite structure may be configured for an on state and an off state; the visual effect of the absorber panel may be generally dark background when the composite structure is in the off state. The composite structure may be configured for an on state and an off state; the visual effect of the absorber panel may be generally dark background when the composite structure is in the on state. The composite structure may be configured for an on state and an off state; the visual effect of the absorber panel may be generally dark background when the composite structure may be in the on state. The light panel may comprise a display panel; the composite visual effect may comprise the output of the light panel over the visual effect of the absorber panel when the composite structure may be in the on state. The light panel may comprise a display panel; the composite visual effect may comprise the output of the light panel over the visual effect of the absorber panel with the visual effect of the decorative layer when the composite structure may be in the on state.

Operation of the user interface for the vehicle occupant may comprise input detected by the sensor. Operation of the user interface for the vehicle occupant may comprise at least one of (a) output from the absorber panel; (b) output from a light panel; (c) input detected by the sensor. The user interface may comprise a display comprising output from the light panel and a visual effect from the absorber panel. The cover may comprise a layer configured to facilitate the transmission of light from the light panel; the sensor may be configured to detect input from the vehicle occupant at or adjacent to the exterior surface of the cover. The user interface may be presented at the exterior surface of the cover. The visual effect of the decorative material may be presented at the exterior surface of the cover. The user interface may be presented with the visual effect of the decorative material and the visual effect of the absorber panel. The user interface may be presented with the visual effect of the decorative material and the visual effect of the absorber panel and output of a light panel; the light panel may comprise a display panel. The user interface may comprise the composite visual effect. The decorative material may comprise a decorative layer.

According to an exemplary embodiment as shown schematically, the composite structure may be configured in a contoured shape. See e.g. FIG. 4B. The composite structure may comprise a substrate. The composite structure may be configured to be coupled to at least one of (a) a trim component; (b) a panel; (c) a door panel; (d) an instrument panel; (e) a surface; (f) a console; (g) a base; (h) a seat; (i) a vehicle system; (j) an overhead console; (k) a floor console. See e.g. FIG. 1C.

According to an exemplary embodiment as shown schematically, the system/component may comprise or connect to a control system configured to connect to vehicle systems; the control system may be configured to facilitate operation by the vehicle occupant for at least one of (a) sending a signal to a control module, (b) controlling a motor, (c) providing a signal to a vehicle component, (d) providing electrical power to a vehicle component, (e) providing at least one of (1) visible feedback, (2) audible feedback, (3) tactile feedback, (4) haptic feedback to the vehicle occupant.

According to an exemplary embodiment as shown schematically, operation of the user interface for the vehicle occupant may comprise at least one of (a) output a light panel presenting a display and (b) the visual effect of the absorber panel and (c) input detected by a sensor. The user interface may be configured for interaction with a vehicle occupant by at least one of (a) touch at the exterior surface of the cover detected by the sensor or (b) gesture adjacent to the exterior surface of the cover detected by the sensor. The sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel. The display may comprise at least one of (a) an array; (b) a grid; (c) a panel; (d) a display screen; (e) a flexible panel; (f) a lighting array; (g) a lighting device array; (h) a light-emitting device array; (i) an LED array; (j) a flexible LED array; (k) an OLED array; (l) a flexible LED matrix; (m) a flexible sheet; (n) a TFEL display.

According to an exemplary embodiment as shown schematically, the composite structure may comprise a composite surface; the cover may comprise a light-transmissive material (e.g. transparent, translucent, at least partially translucent, etc.); illumination from the display at the exterior surface of the composite structure may comprise visible light transmitted through the functional layer and through the at least partially translucent cover. See e.g. FIGS. 2, 3, 10A-10E, 11A, 12A, 13A and 14A. The cover may comprise an at generally rigid light-transmissive cover (see e.g. FIGS. 5A-5D) or a flexible light-transmissive material (see e.g. FIGS. 10B-10E). The cover may comprise at least one of a plastic material or a glass material or a composite material. The cover may comprise a polymeric material providing a generally rigid structure (e.g. polycarbonate, poly(methyl methacrylate) (PMMA), acrylic, acrylic glass, plexiglass, etc.).

According to an exemplary embodiment as shown schematically, a vehicle interior component may be configured to provide a user interface for a vehicle occupant in a vehicle comprising vehicle systems. See FIGS. 2, 3, 4A-4C, 5A-5D, 10A-10E, 11A-11C, 12A-12C, 13A-13C and 14A-14C. The component may comprise a composite structure configured to provide the user interface may comprise a cover providing an exterior surface; a light panel; an absorber panel; a decorative material; the light panel may be configured to provide output at least partially visible at the exterior surface of the cover; the decorative layer may be configured to provide a visual effect at least partially visible at the exterior surface of the cover; the absorber panel may be configured to provide a visual effect at least partially visible at the exterior surface of the cover; operation of the user interface for the vehicle occupant may comprise at least one of (a) output from light panel and (b) the visual effect of the absorber panel. The component may comprise a sensor; operation of the user interface for the vehicle occupant may comprise input detected by the sensor.

According to an exemplary embodiment as shown schematically, a vehicle interior component may be configured to provide a user interface for a vehicle occupant in a vehicle comprising vehicle systems; the component may comprise a composite structure configured to provide the user interface comprising: a cover providing an exterior surface; a sensor; an absorber panel; a decorative material; the decorative layer may be configured to provide a visual effect at least partially visible at the exterior surface of the cover; the absorber panel may be configured to provide a visual effect at least partially visible at the exterior surface of the cover; operation of the user interface for the vehicle occupant may comprise at least one of (a) the visual effect of the absorber panel and (b) input detected by the sensor. See FIGS. 2, 3, 4A-4C, 5A-5D, 10A-10E, 11A-11C, 12A-12C, 13A-13C and 14A-14C. The light panel may be configured to provide output at least partially visible at the exterior surface of the cover; the user interface for the vehicle occupant may comprise output from the light panel.

According to an exemplary embodiment as shown schematically, a vehicle interior component may be configured to provide a user interface for a vehicle occupant in a vehicle comprising vehicle systems; the vehicle interior component may comprise a composite structure configured to provide the user interface comprising a cover providing an exterior surface; a sensor; a light panel; an absorber panel; a decorative material. See FIGS. 2, 3, 4A-4C, 5A-5D, 10A-10E, 11A-11C, 12A-12C, 13A-13C and 14A-14C. The light panel may be configured to provide output at least partially visible at the exterior surface of the cover; the decorative layer may be configured to provide a visual effect at least partially visible at the exterior surface of the cover; the absorber panel may be configured to provide a visual effect at least partially visible at the exterior surface of the cover; operation of the user interface for the vehicle occupant may comprise at least one of (a) output from the light panel and (b) the visual effect of the absorber panel and (c) input detected by the sensor.

According to an exemplary embodiment as shown schematically, the composite structure may comprise a functional layer (see e.g. FIGS. 2, 3 and 4A); the functional layer (e.g. comprising a layer as indicated schematically in FIG. 4A) of the composite structure may be configured for at least one of (a) positioning; (b) spacing; (c) haptic feedback; (d) tactile feedback such as vibration; (e) audible feedback such as sound; (f) optical enhancement; (g) light shielding; (h) electrical shielding; (i) interference shielding; (j) optical electrical charging for a device; (k) interaction with a mobile device; (l) interaction with a vehicle system; (m) cushioning; (n) adhesion or bonding; (o) tactile shear/feel performance; (p) thermal management; (q) heating; (r) cooling; (s) providing Peltier effect; (t) diffusion of illumination from the display; (u) monitoring; (v) recording; (w) alerting; (x) messaging; (y) light guiding; (z) flexibility.

According to an exemplary embodiment as shown schematically, the user interface may comprise a display element from illumination from the display that may be configured to be selectively positioned on the exterior surface of the cover; and the display element of the user interface may comprise at least one of (a) an icon; (b) a symbol; (c) a button indicator; (d) a menu system; (e) a display panel image; (f) an information display image; (g) a graphics display image; (h) a control panel; (i) an input panel; (j) a touch screen; (k) a repositionable image; (l) a projected image; (m) an image element selectively positionable on the exterior surface of the cover by interaction with the vehicle occupant. The display element of the user interface may be configured to be positioned on the exterior surface of the cover (a) contacting of the exterior surface of the cover at a position where the display element may be to be displayed when the display element may be not displayed; (b) contacting the exterior surface of the cover where the display element may be displayed and dragging the display element along the exterior surface of the cover to a position where the display element may be to be displayed. The user interface may be configured (a) to be activated for operation by compressing the cover toward the sensor and (b) to be operated by contacting the exterior surface within a distance where input can be detected by the sensor and (c) to be operated by movement directed by the vehicle occupant above the exterior surface of the cover within a distance where input can be detected by the sensor.

Referring to the FIGURES, a vehicle interior component configured to provide a user interface for vehicle systems is shown according to an exemplary embodiment. The component may be configured to provide a user interface for a vehicle occupant in a vehicle comprising vehicle systems. The component may comprise a composite structure configured to provide the user interface comprising a cover providing an exterior surface and/or a sensor and/or a light panel and/or an absorber panel and/or a decorative material. The light panel may be configured to provide output at least partially visible at the exterior surface of the cover; the decorative layer may be configured to provide a visual effect at least partially visible at the exterior surface of the cover; the absorber panel may be configured to provide a visual effect at least partially visible at the exterior surface of the cover. Operation of the user interface for the vehicle occupant may comprise at least one of output from the light panel and/or the visual effect of the absorber panel and/or input detected by the sensor. The composite structure may further comprise a functional layer (e.g. haptic feedback, etc.). The cover may comprise a light-transmissive cover; illumination from the display at the exterior surface of the composite structure may comprise visible light transmitted through the functional layer and through the at least partially translucent cover. The component may comprise a light panel configured to provide output at least partially visible at the exterior surface of the cover; operation of the user interface for the vehicle occupant may comprise output from the light panel; the light panel may comprise a display panel; the light panel may comprise a display panel; the output of light panel may comprise a display from the display panel; the visual effect of the absorber panel may comprise a background for the display from the display panel. The absorber panel may comprise a background panel configured to provide a dark background for the display panel. The absorber panel may comprise a display panel configured to augment the output from the light panel. The light panel may comprise a display. The absorber panel may comprise a display panel; the visual effect of the absorber panel may comprise a display at least partially visible at the exterior surface of the cover. The absorber panel may comprise an addressable display. The absorber panel may comprise a display panel. The composite structure may be configured so that the composite visual effect may comprise at least the visual effect of the decorative material when the composite structure may be in an off state. The composite structure may be configured for an on state and an off state; the composite visual effect of the composite structure may comprise at least the visual effect of the decorative material when the composite structure may be in an off state. The composite structure may be configured for an on state and an off state; the visual effect of the absorber panel may be generally light-transmissive when the composite structure may be in the off state. The composite structure may be configured for an on state and an off state; the visual effect of the absorber panel may be generally dark background when the composite structure may be in the on state. The light panel may comprise a display panel; the composite visual effect may comprise the output of the light panel over the visual effect of the absorber panel when the composite structure may be in the on state. The light panel may comprise a display panel; the composite visual effect may comprise the output of the light panel over the visual effect of the absorber panel with the visual effect of the decorative layer when the composite structure may be in the on state. The composite structure may be coupled to at least one of a trim component, a panel, a door panel, an instrument panel, a surface, a console, a base, etc. A method of operating the user interface provided by the composite structure is also indicated schematically. The user interface may be coupled to a control system.

Exemplary Embodiments—B

According to an exemplary embodiment as shown schematically, a vehicle interior component may be configured to provide a user interface for a vehicle occupant in a vehicle comprising vehicle systems. See FIGS. 1C, 2, 3, 4A-4C, 5A-5D, 10A-10E, 11A-11C, 12A-12C, 13A-13C, 14A-14C, 15A-15C, 16A-16C, 20, 21A-21B, 22A-22B, 23A-23F and 24A-24D.

As shown schematically according to an exemplary embodiment in FIGS. 4B-4C and 5A-5D, the composite structure CS for component C configured to present the display D for the user interface UI may comprise a cover T (e.g. providing an exterior surface) and substrate/carrier S (e.g. providing for installation with the base/structure B) with functional segments/layers such as an absorber panel AP and a light/display panel L and decorative material/layer DM (i.e. a decorative material that may be applied as a layer, etc.) and a sensor/grid SG and etc. See also FIGS. 10A-10E.

Figure 5A:
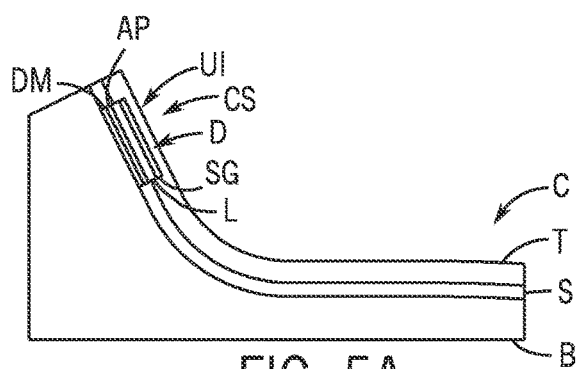
FIGS. 5A through 5D are schematic cross-section views of a vehicle interior component with a component/display configured to provide a user interface according to an exemplary embodiment.

As shown schematically according to an exemplary embodiment in FIG. 5A, the composite structure CS for component C configured to present the display D for the user interface UI may comprise a cover T (e.g. providing an exterior surface) and substrate/carrier S (e.g. providing for installation with the base/structure B) with functional segments/layers such as a decorative material/layer DM and a sensor/grid SG and light/display panel L and absorber panel AP.

Figure 5B:
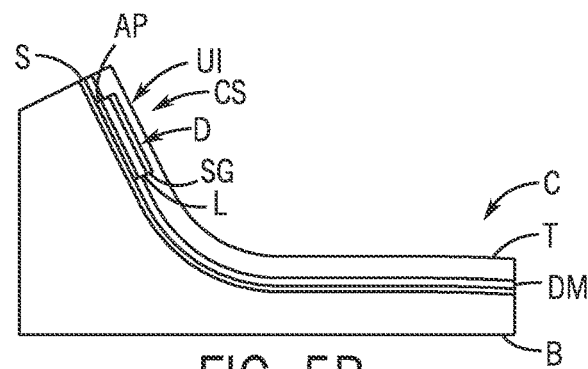

As shown schematically according to an exemplary embodiment in FIG. 5B, the composite structure CS for component C configured to present the display D for the user interface UI may comprise a cover T (e.g. providing an exterior surface) and substrate/carrier S (e.g. providing for installation with the base/structure B) with functional segments/layers such as extended decorative material/layer DM and a sensor/grid SG and light/display panel L and absorber panel AP.

Figure 5C:
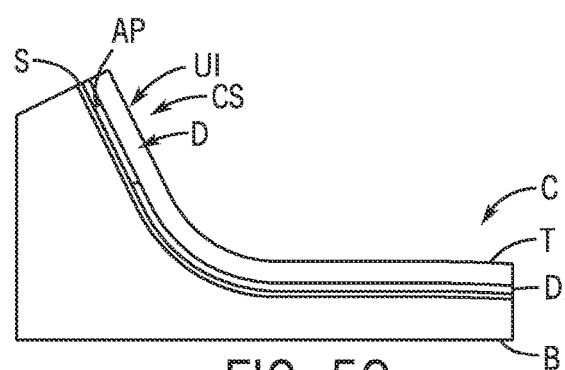

As shown schematically according to an exemplary embodiment in FIG. 5C, the composite structure CS for component C configured to present the display D for the user interface UI may comprise a cover T (e.g. providing an exterior surface) and substrate/carrier S (e.g. providing for installation with the base/structure B) with functional segments/layers such as an extended decorative material/layer DM and an absorber panel AP.

Figure 5D:
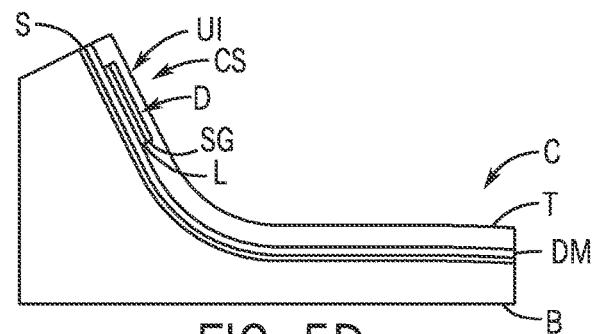

As shown schematically according to an exemplary embodiment in FIG. 5D, the composite structure CS for component C configured to present the display D for the user interface UI may comprise a cover T (e.g. providing an exterior surface) and substrate/carrier S (e.g. providing for installation with the base/structure B) with functional segments/layers such as an extended decorative material/layer DM and a sensor/grid SG and light/display panel L.

Figure 9A:
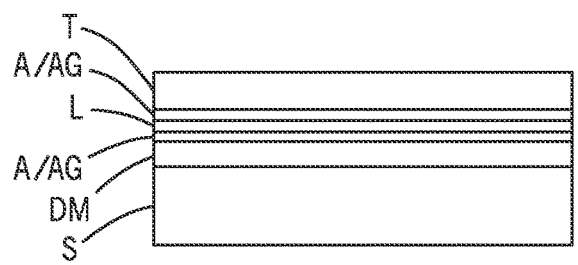
FIG. 9A is a schematic fragmentary cross-section view of a component/display configured to provide a user interface according to an exemplary embodiment.
Figure 9B:
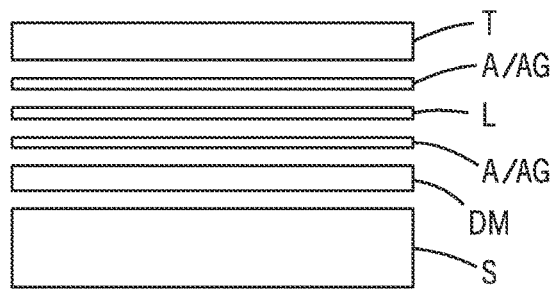
FIG. 9B is a schematic exploded fragmentary cross-section view of a component/display configured to provide a user interface according to an exemplary embodiment.

As indicated schematically in FIGS. 9A-9B. the composite structure may comprise cover T and light/display panel L and decorative material/layer DM on the substrate/carrier S; in operation, the composite visual effect at the display of the composite structure through the exterior surface of the cover may comprise a visual effect presented by output from the display panel over the decorative material; the user interface may comprise interaction with the display presented by the display panel.

As indicated schematically in FIG. 10E, the composite structure may comprise cover T and decorative material/layer DM on the substrate/carrier S; in operation, the composite visual effect SE at the display of the composite structure through the exterior surface of the cover may comprise a visual effect presented by the decorative material; the user interface may comprise interaction with the display D/image IM. See also FIGS. 15A-15C (use of display system with decorative material).

Figure 15A:
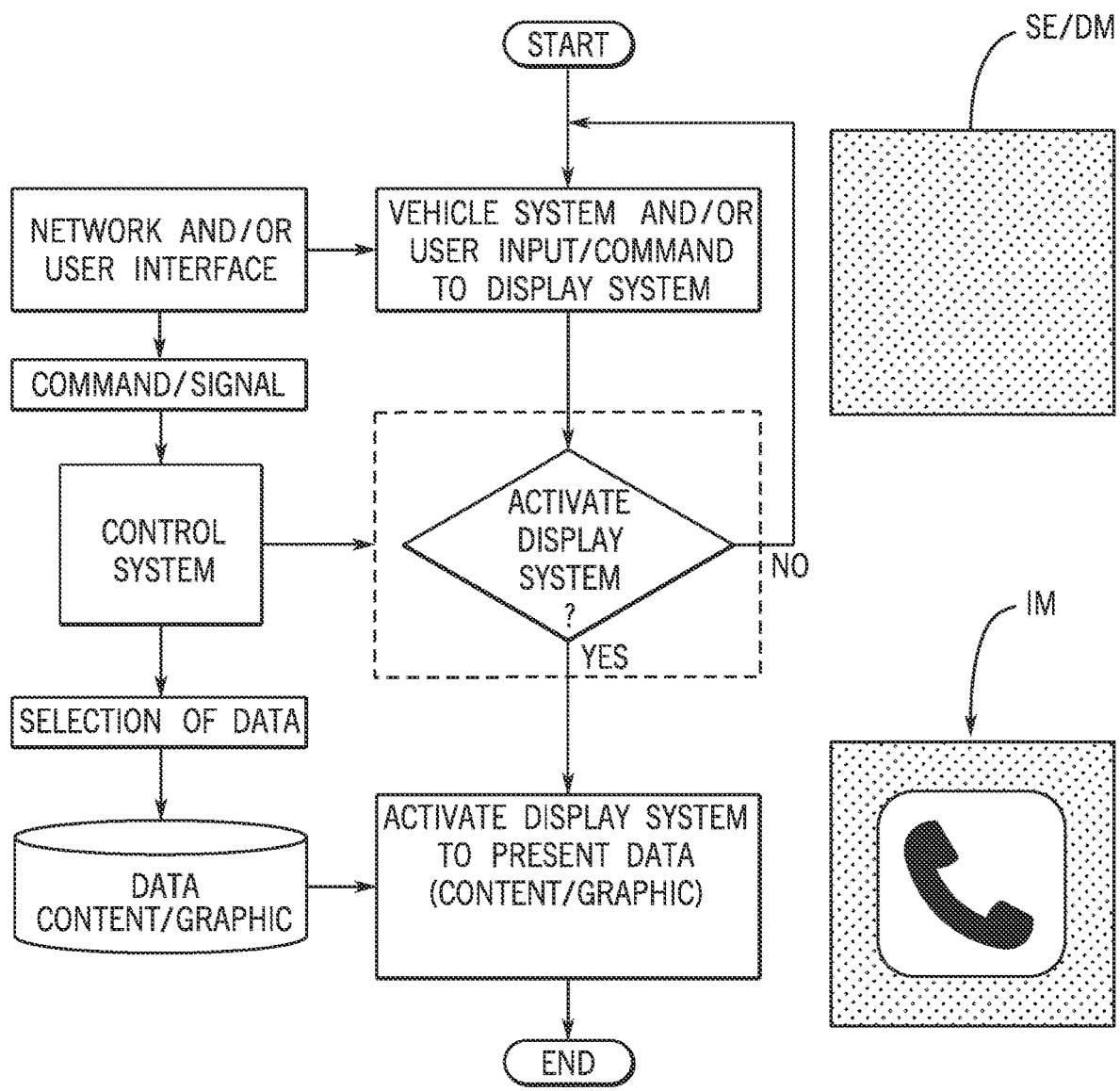
FIG. 15A is a schematic flow diagram of operation of a component/display for a user interface/display system configured to provide a user interface according to an exemplary embodiment.
Figure 15B:
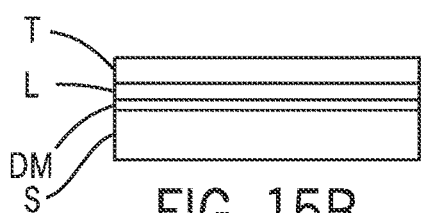
FIG. 15B is a schematic fragmentary cross-section view of a component/display configured to provide a user interface according to an exemplary embodiment.
Figure 15C:
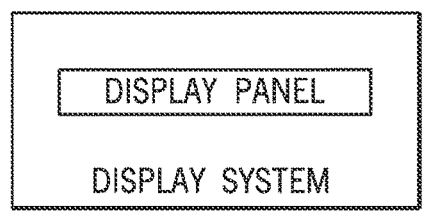
FIG. 15C is a schematic block diagram of a component/display for a user interface/display system configured to provide a user interface according to an exemplary embodiment.

As indicated schematically in FIGS. 15A-15C, operation of the user interface/display system with light/display panel L (e.g. configured to augment/enhance the image display from the light/display panel) may comprise display of data presented as a composite visual effect of an image IM from the light/display panel and the visual effect of the decorative material DM (e.g. shown as a decorative appearance background) at the exterior surface of the cover for the user interface. As shown schematically in FIG. 15B, the composite structure CS may comprise a cover T (e.g. providing an exterior surface) and substrate/carrier S (e.g. providing for installation with the base/structure B) with functional segments/layers such as an integrated light/display panel L and decorative material/layer DM (i.e. a decorative material that may be applied as a layer, etc.) (and optional sensor/grid. As indicated schematically the composite visual effect for the user interface/display system may be enhanced through the use of the display panel to provide an image from a data pattern to augment/background the image presented by the light/display panel (example image for the display may comprise content/graphic information shown as telephony control). According to an exemplary embodiment as indicated schematically, the display system may comprise a display/light panel comprising a generally transparent/light-transmissive LCD (liquid crystal diode) panel configured to provide a visual effect (e.g. color) and/or a generally transparent/light-transmissive self-emissive display such as an OLED (organic LED) panel configured to provide a visual effect (e.g. color, brightness/intensity); the display system may be provided with no absorber panel. See e.g. FIG. 5D. 10E and 15A-15C. As indicated schematically, the display system may comprise a light source/light panel configured to provide light/illumination and a layer/panel such as a decorative material configured to provide a visual effect (e.g. color, unmixed color effect, multi-color effect, mixed color effect, image, icon, etc. when illuminated by a light panel and/or a dark/"dead-front" effect when not illuminated).

Referring to FIGS. 20, 21A-21B, 22A-22B and 23A-23F, a vehicle interior component C comprising a user interface UI comprising a display system (with panel/display D and optional control element) may be configured to display an image IM. As shown schematically according to an exemplary embodiment in FIGS. 20, 21A-21B and 22A-22B, the component C may comprise a compartment for an article AC (e.g. item, object, device, etc.) and a sensor (e.g. sensor grid SG, sensor arrangement SPR, etc.) with the display system comprising panel/display D of the user interface UI. See also FIG. 23F. As shown schematically in FIG. 23E, the composite structure CS may comprise a cover T (e.g. providing an exterior surface) and substrate/carrier S (e.g. providing for installation with the base/structure B) with functional segments/layers such as a sensor/grid SG and light/display panel L and absorber panel AP and decorative material/layer DM (i.e. a decorative material that may be applied as a layer, etc.); in operation, the composite visual effect at the display of the composite structure through the exterior surface of the cover may comprise a visual effect presented by the decorative material DM and an absorber panel AP with light/display panel L to provide display D; the user interface may comprise interaction with the display D/image IM (and/or an optional control element); the composite structure may comprise a sensor shown as sensor grid SG. Compare FIGS. 21A-21B and 22A-22B and FIG. 23E (use of sensor as sensor arrangement SPR rather than sensor grid SG).

As shown schematically in FIGS. 21A-21B and 23A-23B, the panel/display D of the user interface UI may be configured to present the image IM (shown as data/information from a system and/or network) for a decorative state; the article AC may be not generally visible behind panel/display D (e.g. when in the decorative state). As shown schematically in FIGS. 22A-22B and 23C-23D, the sensor (shown as sensor grid and/or sensor arrangement SPR) may be configured (with the control system for the user interface) to operate the display system; when an occupant of the vehicle reaches into the compartment to access or place the article AC the panel/display D and is detected the display system may be configured to present a light-transmissive display (e.g. a light-transmissive state shown as generally transparent panel rather than image IM) so that the article AC may be generally visible to the vehicle occupant. See also FIG. 23A. As indicated schematically in FIGS. 23A-23D and 23F, operation of the user interface/display system with absorber panel AP comprising absorber display configured to operate in combination with the light/display panel L (e.g. configured to augment/enhance the image display from the light/display panel) may comprise display of data presented as a composite visual effect of an image IM from the light/display panel and of an image IM from the absorber display and the visual effect of the decorative material DM. As indicated schematically in FIGS. 20, 21B, 22B and 23B-23D, the composite visual effect for the user interface/display system may be enhanced through the use of the absorber display panel to provide an image from a data pattern to augment/background the image presented by the light/display panel and to provide a light-transmissive (e.g. generally transparent) display for the compartment of the component. As indicated schematically in FIG. 23A, the operation of the display system may comprise operation of an absorber panel and/or a display panel (and/or a combined light panel arrangement); the display system may be operated by a control system and a sensor/detector to provide a signal to active/deactivate the display to provide a decorative/display state (see FIGS. 23B-23C) and a light-transmissive state (see FIG. 23D) (e.g. according to a control program/algorithm).

As indicated schematically in FIGS. 11A, 12A, 13A, 14A, 15A and 23A, the display system for the component may be configured to be operated with data and command/signal provided from any of a variety of source including but not limited to input from a user interface (e.g. from a vehicle occupant) and/or a signal from a network (e.g. local/vehicle network, wireless network, connected network, internet, etc.) and/or vehicle system; as indicated schematically, data (including content/graphics, etc.) may be stored and accessed from any of a variety of locations/sites (e.g. local, network, remote, etc.) and selected for display/presentation at the display system. See also FIGS. 1C, 2, 3, 10A-10E and 16A-16C. As indicated schematically according to an exemplary embodiment in FIGS. 5A-5D and 10A-10E, the display system may provide a user interface/display comprising at least one of (a) an absorber panel and/or (b) a light panel. See also FIGS. 23B-23F and 24A-24D.

As indicated schematically according to an exemplary embodiment, the component C with composite structure CS may be configured with a display system providing for an on state and an off state (e.g. with an absorber panel selected/designed and operable to provide for an intended visual effect in each state); according to an exemplary embodiment, the visual effect of the absorber panel may be generally light-transmissive when the composite structure may be in the off state; according to an exemplary embodiment, the visual effect of the absorber panel may be generally light-transmissive when the composite structure may be in the off state. As indicated schematically, the display system with absorber panel may be designed to be operated in each state as intended for the application.

Figure 24A:
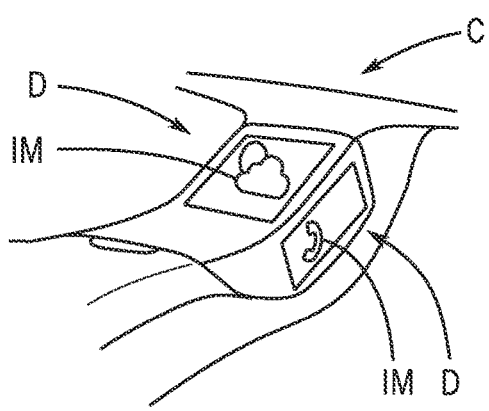
FIG. 24A is a schematic perspective view of a vehicle interior component comprising a user interface/display according to an exemplary embodiment.
Figure 24B:
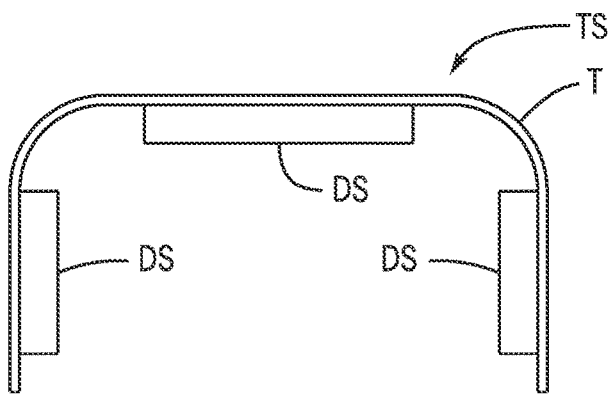
FIG. 24B is a schematic cross-section view of a vehicle interior component comprising a user interface/display according to an exemplary embodiment.
Figure 24C:
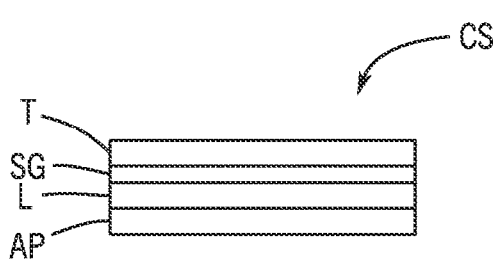
FIG. 24C is a schematic fragmentary cross-section view of a component/display configured to provide a user interface according to an exemplary embodiment.
Figure 24D:
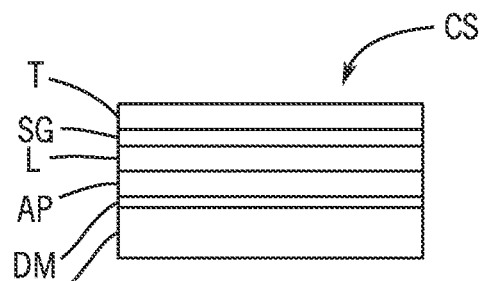
FIG. 24D is a schematic fragmentary cross-section view of a component/display configured to provide a user interface according to an exemplary embodiment.

As shown schematically in FIGS. 24A-24D, the component C may comprise a composite structure CS configured to provide a user interface providing a set of displays D for a display system DS (with each display/panel configured to display an image IM). As shown schematically in FIGS. 24A and 24B, the component may comprise a cover structure TS (e.g. a rigid/semi-rigid material such as glass, plastic, etc.) providing a cover T with a display system DS (e.g. system configured to provide a display from a light panel, display panel, absorber panel, combination display panel/absorber panel, etc.). See also FIGS. 5A-5D and 10A-10E. As indicated schematically in FIGS. 24A-24B, the display system of the component may comprise a display D on a primary surface (e.g. front/face) (indicating an information display shown as presenting weather information) and a display D on a lateral surface (e.g. side, secondary, etc.) (indicating an information display shown as presenting telephony/communications information). As indicated schematically in FIGS. 24A-24B, operation of the user interface/display system for the component may comprise connectivity with a control system. See also FIGS. 16A-16C. As shown schematically in FIGS. 24C-24D, the composite structure CS may comprise a cover T (e.g. providing an exterior surface) and substrate/carrier S (e.g. providing for installation with the base/structure B) with functional segments/layers such as a sensor/grid SG and light/display panel L and absorber panel AP (FIG. 24C) or with functional segments/layers such as a sensor/grid SG and light/display panel L and absorber panel AP and decorative material/layer DM (i.e. a decorative material that may be applied as a layer, etc.) (FIG. 24D).

Figure 25A:
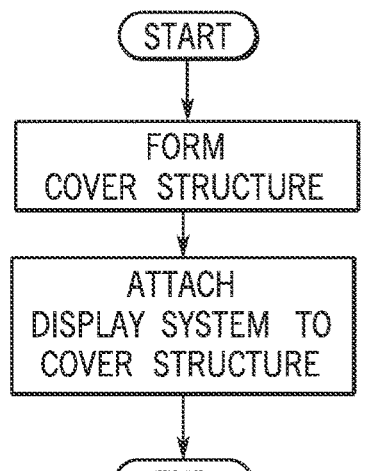
FIGS. 25A through 25C are schematic flow diagrams of a process for making a vehicle interior component comprising a user interface/display according to an exemplary embodiment.
Figure 25B:
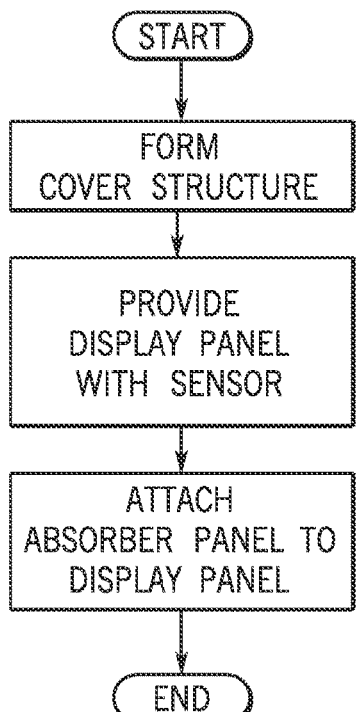
Figure 25C:
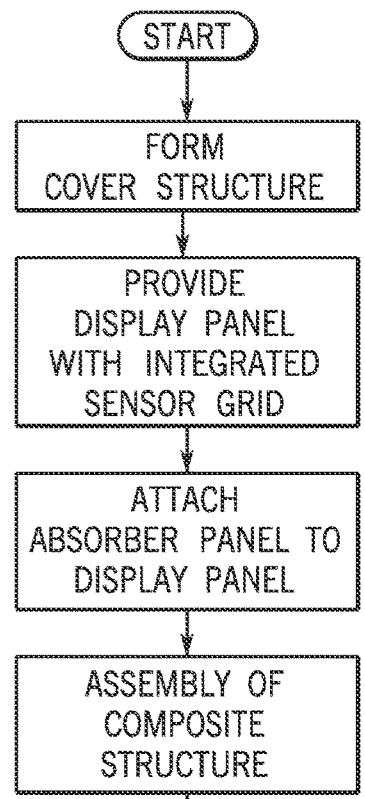
Figure 26A:
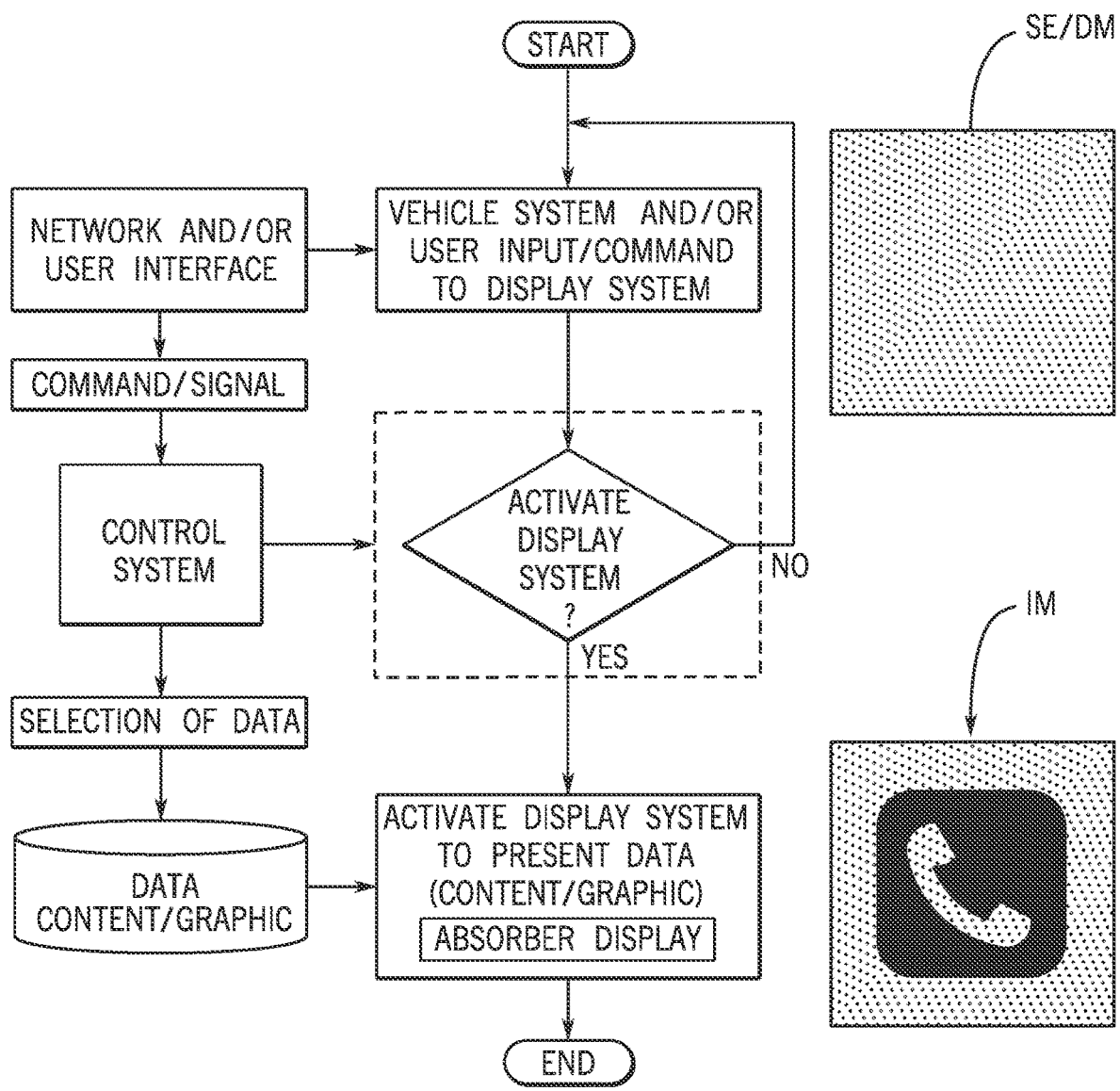
FIG. 26A is a schematic flow diagram of operation of a component/display for a user interface/display system configured to provide a user interface according to an exemplary embodiment.
Figure 26B:
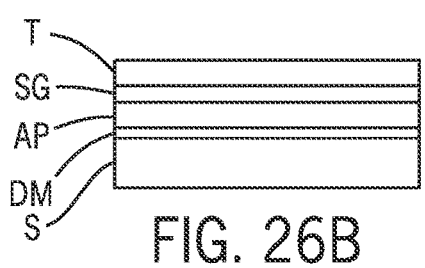
FIG. 26B is a schematic fragmentary cross-section view of a component/display configured to provide a user interface according to an exemplary embodiment.
Figure 26C:
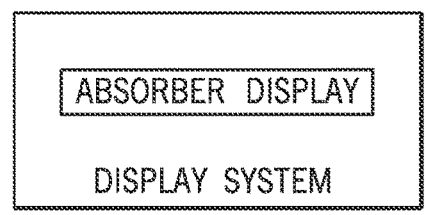
FIG. 26C is a schematic block diagram of a component/display for a user interface/display system configured to provide a user interface according to an exemplary embodiment.
Figure 27A:
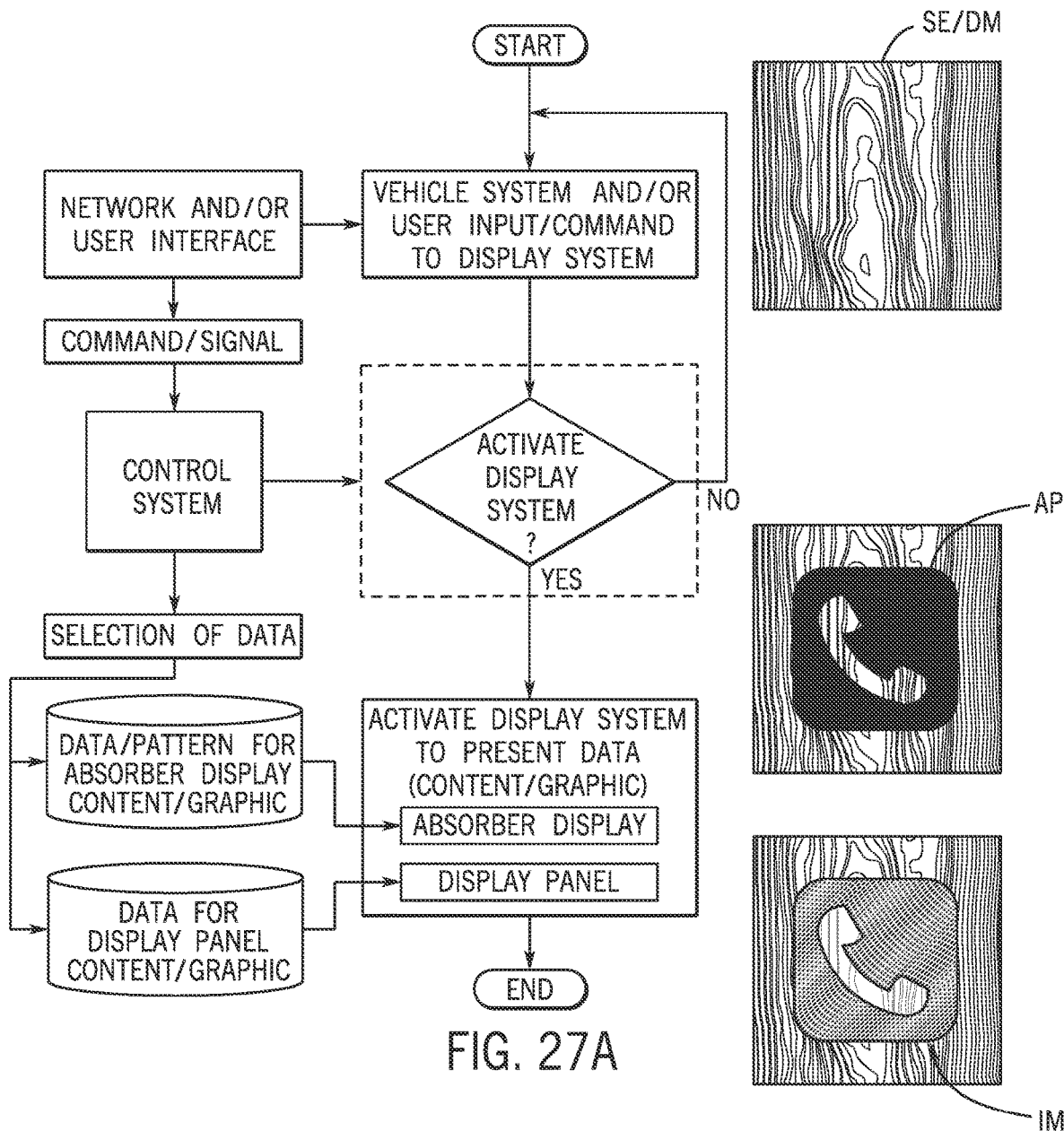
FIG. 27A is a schematic flow diagram of operation of a component/display for a user interface/display system configured to provide a user interface according to an exemplary embodiment.
Figure 27B:
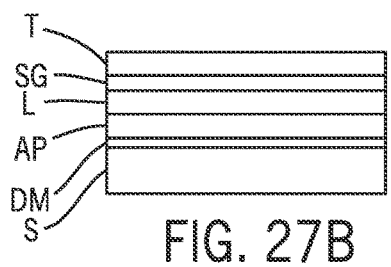
FIG. 27B is a schematic fragmentary cross-section view of a component/display configured to provide a user interface according to an exemplary embodiment.
Figure 27C:
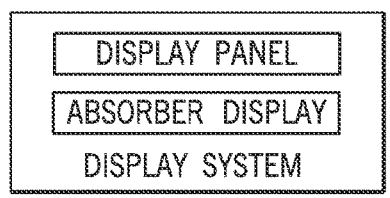
FIG. 27C is a schematic block diagram of a component/display for a user interface/display system configured to provide a user interface according to an exemplary embodiment.
Figure 28A:
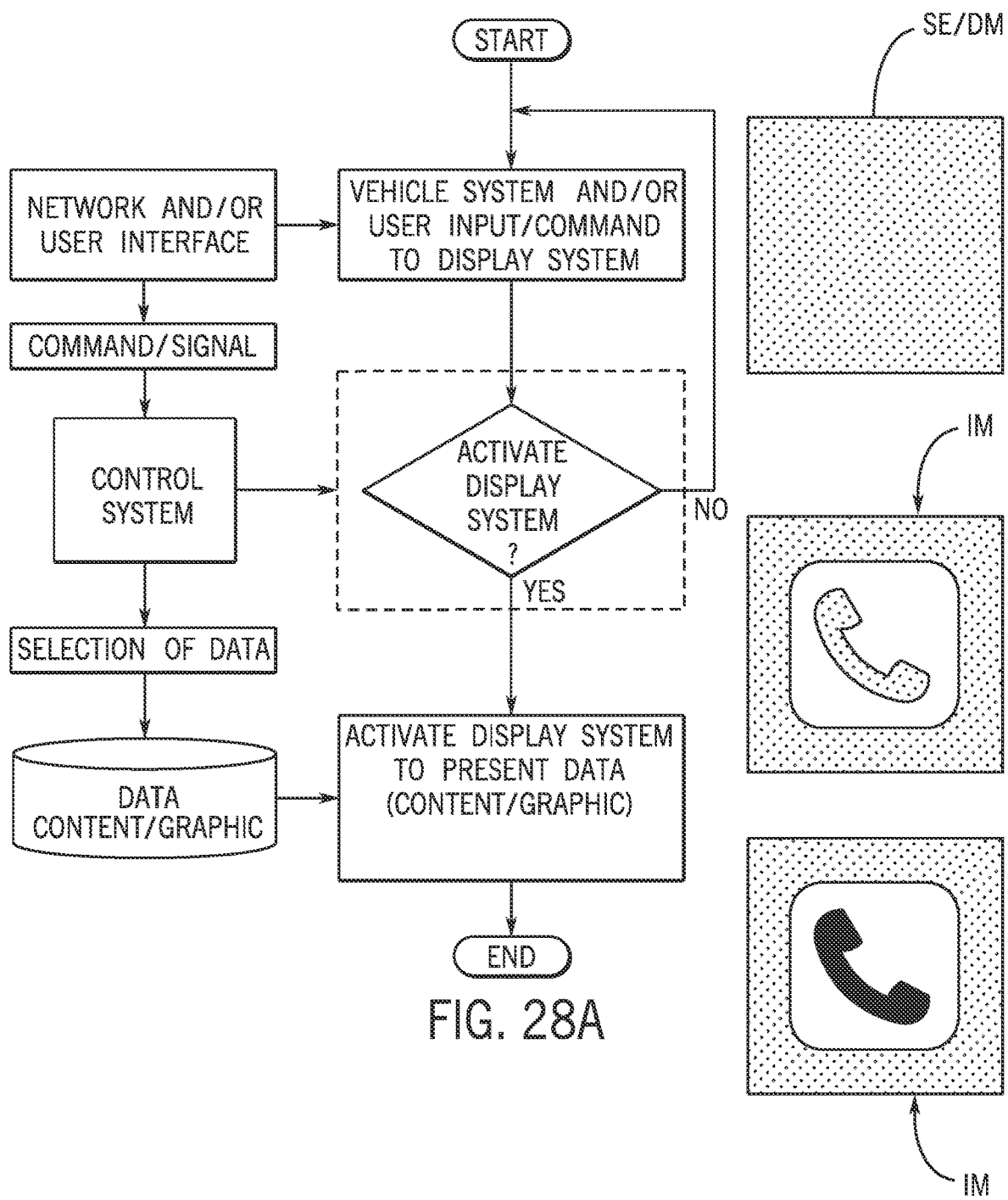
FIG. 28A is a schematic flow diagram of operation of a component/display for a user interface/display system configured to provide a user interface according to an exemplary embodiment.
Figure 28B:
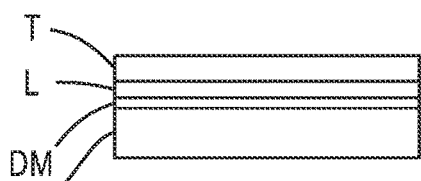
FIG. 28B is a schematic fragmentary cross-section view of a component/display configured to provide a user interface according to an exemplary embodiment.
Figure 28C:
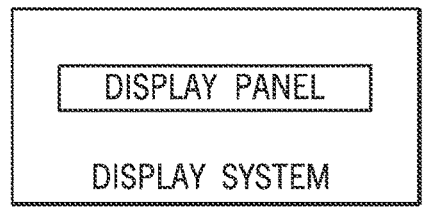
FIG. 28C is a schematic block diagram of a component/display for a user interface/display system configured to provide a user interface according to an exemplary embodiment.
Figure 29A:
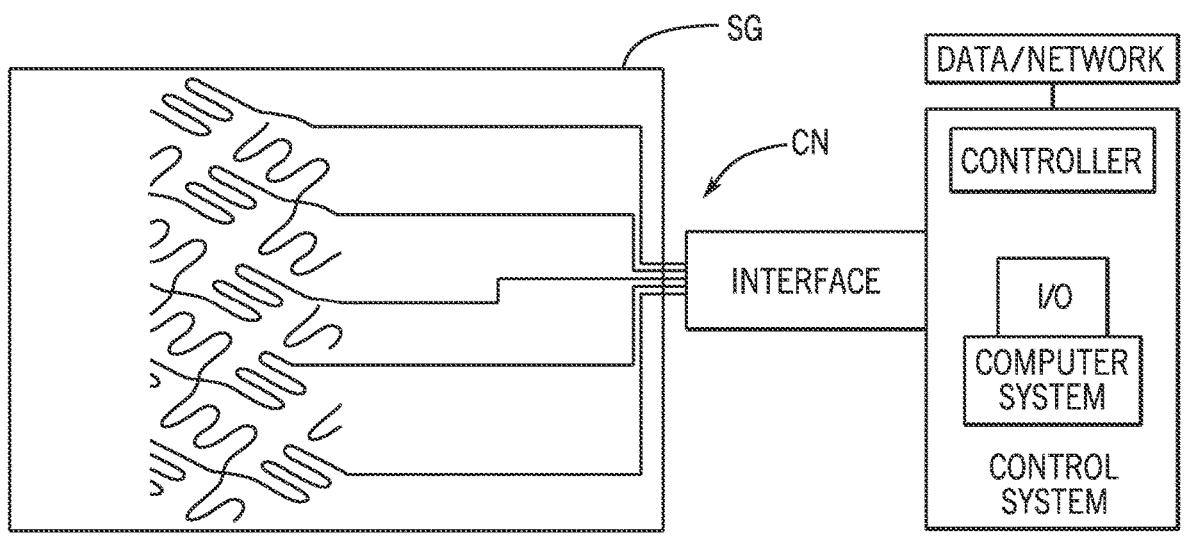
FIG. 29A is a schematic block diagram of absorber panel arrangement for a user interface/display system according to an exemplary embodiment.
Figure 29B:
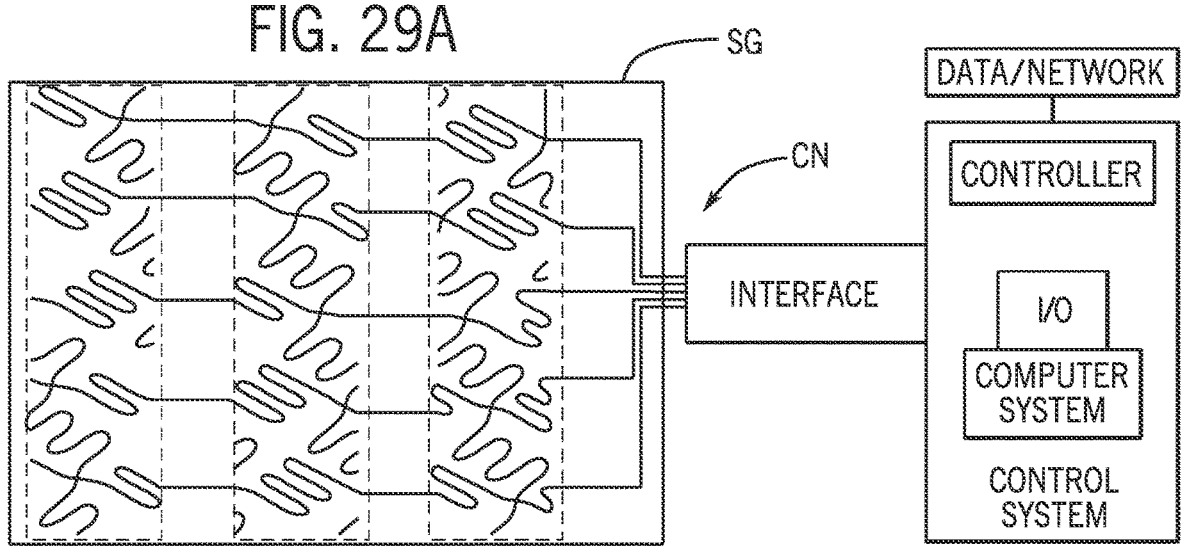
FIG. 29B is a schematic block diagram of light/display panel arrangement for a user interface/display system according to an exemplary embodiment.
Figure 29C:
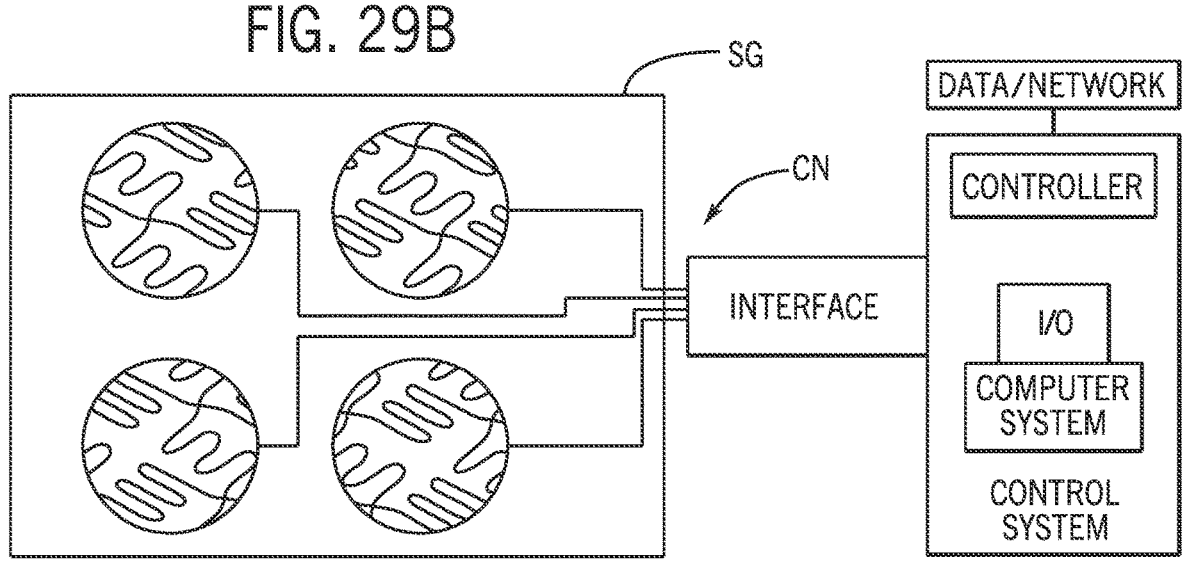
FIG. 29C is a schematic block diagram of sensor grid panel arrangement for a user interface/display system according to an exemplary embodiment.
Figure 30A:
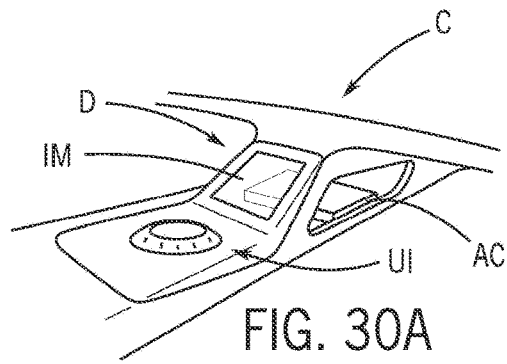
FIG. 30A is a schematic perspective view of a vehicle interior component comprising a user interface/display according to an exemplary embodiment.
Figure 31A:
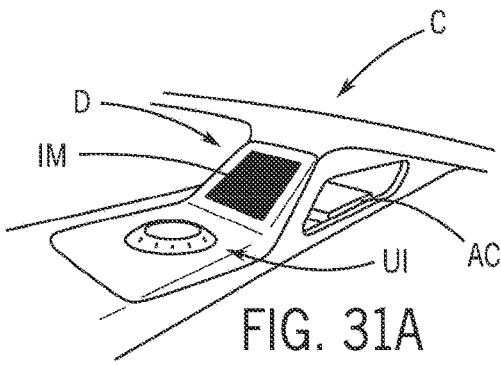
FIG. 31A is a schematic perspective view of a vehicle interior component comprising a user interface/display according to an exemplary embodiment.
Figure 30B:
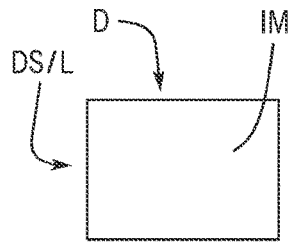
FIG. 30B is a schematic diagram of a user interface/display for a vehicle interior component comprising a compartment according to an exemplary embodiment.
Figure 30C:
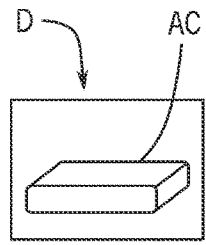
FIG. 30C is a schematic diagram of a user interface/display for a vehicle interior component comprising a compartment according to an exemplary embodiment.
Figure 31B:
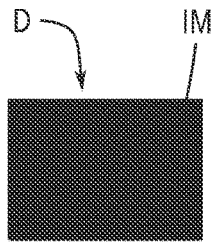
FIG. 31B is a schematic diagram of a user interface/display for a vehicle interior component comprising a compartment according to an exemplary embodiment.
Figure 31C:
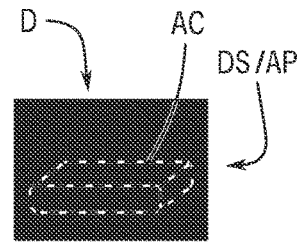
FIG. 31C is a schematic diagram of a user interface/display for a vehicle interior component comprising a compartment according to an exemplary embodiment.
Figure 32A:
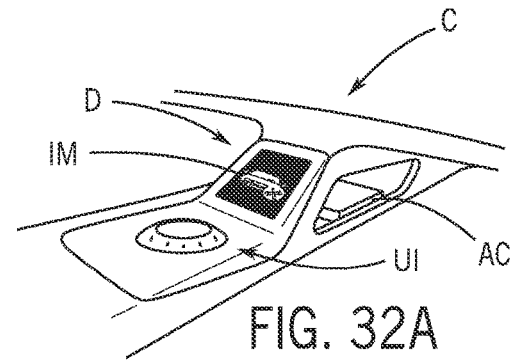
FIG. 32A is a schematic perspective view of a vehicle interior component comprising a user interface/display according to an exemplary embodiment.
Figure 33A:
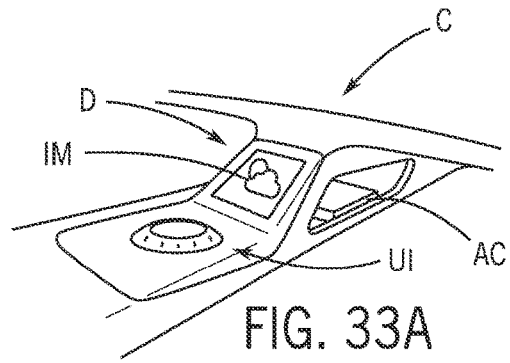
FIG. 33A is a schematic perspective view of a vehicle interior component comprising a user interface/display according to an exemplary embodiment.
Figure 32B:
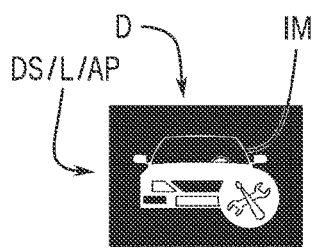
FIG. 32B is a schematic diagram of a user interface/display for a vehicle interior component comprising a compartment according to an exemplary embodiment.
Figure 32C:
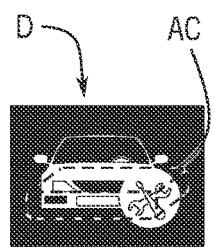
FIG. 32C is a schematic diagram of a user interface/display for a vehicle interior component comprising a compartment according to an exemplary embodiment.
Figure 33B:
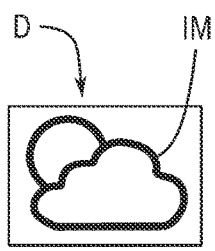
FIG. 33B is a schematic diagram of a user interface/display for a vehicle interior component comprising a compartment according to an exemplary embodiment.
Figure 33C:
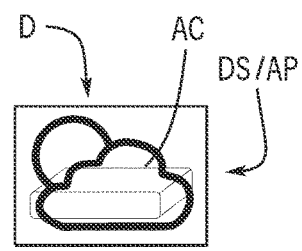
FIG. 33C is a schematic diagram of a user interface/display for a vehicle interior component comprising a compartment according to an exemplary embodiment.
Figure 34:
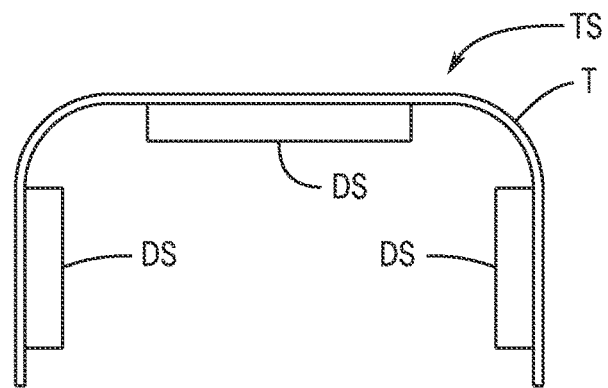
FIG. 34 is a schematic cross-section view of a vehicle interior component comprising a user interface/display according to an exemplary embodiment.
Figure 35A:
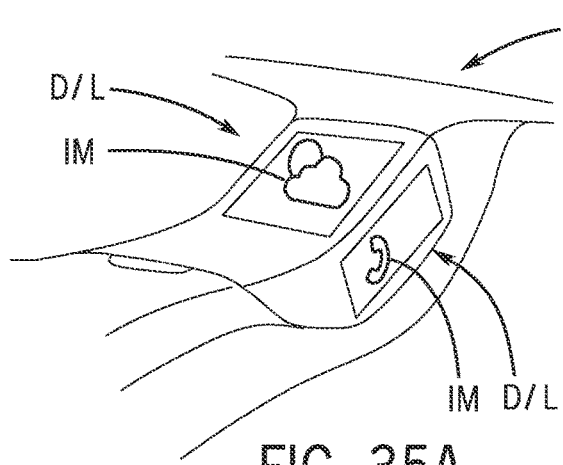
FIG. 35A is a schematic perspective view of a vehicle interior component comprising a user interface/display according to an exemplary embodiment.
Figure 35B:
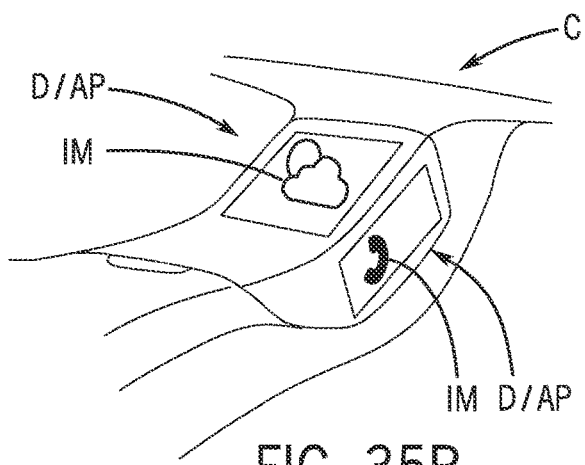
FIG. 35B is a schematic perspective view of a vehicle interior component comprising a user interface/display according to an exemplary embodiment.
Figure 35C:
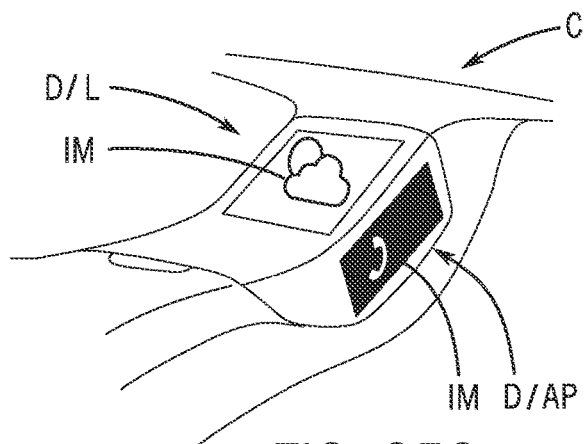
FIG. 35C is a schematic perspective view of a vehicle interior component comprising a user interface/display according to an exemplary embodiment.
Figure 35D:
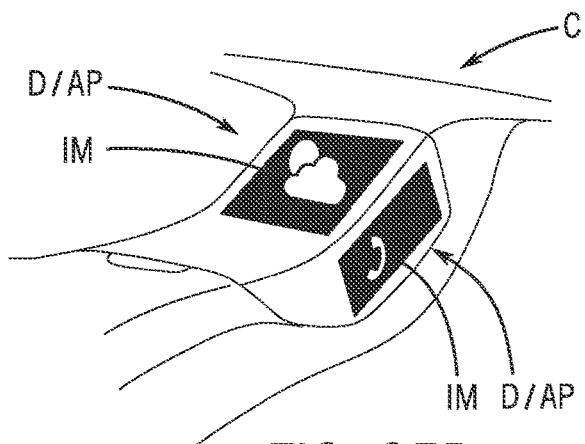
FIG. 35D is a schematic perspective view of a vehicle interior component comprising a user interface/display according to an exemplary embodiment.

FIGS. 25A through 25C are schematic flow diagrams of a process for making a vehicle interior component comprising a user interface/display according to an exemplary embodiment (such as shown in FIGS. 24A-24D).

According to an exemplary embodiment as shown schematically in FIGS. 1C, 2, 3, 5A-5C, 10A-10D, 11A-11C, 12A-12C, 13A-13C, 14A-14C, 20 and 23A-23F, a vehicle interior component may be configured to provide a user interface for a vehicle occupant in a vehicle comprising vehicle systems comprising a composite structure configured to provide the user interface comprising a cover providing an exterior surface; an absorber panel; and a decorative material. See also FIGS. 5D, 10E and 15A-15C, 24A-24D and 25A-25C. The decorative material may be configured to provide a visual effect at least partially visible at the exterior surface of the cover. The absorber panel may be configured to provide a visual effect at least partially visible at the exterior surface of the cover. The composite structure may be configured so that operation of the user interface for the vehicle occupant may comprise a composite visual effect. The component may comprise a light panel configured to provide output at least partially visible at the exterior surface of the cover; operation of the user interface for the vehicle occupant may comprise output from the light panel. The light panel may comprise a display panel; the display panel may comprise a self-emissive panel; the self-emissive panel may comprise at least one of a light-transmissive display, a translucent display, a transparent display. The light panel may comprise a display panel; the output of light panel may comprise a display from the display panel; the visual effect of the absorber panel may comprise a background for the display from the display panel. The absorber panel may comprise a background panel configured to provide a dark background for a display panel. The absorber panel may comprise a display panel configured to augment output from the light panel. The light panel may comprise a display. The light panel may comprise a display panel; the composite visual effect may comprise the output of a light panel over the visual effect of the absorber panel when the composite structure is in an on state. The light panel may comprise a display panel; the composite visual effect may comprise the output of the light panel over the visual effect of the absorber panel with the visual effect of the decorative layer when the composite structure is in an on state. The user interface may comprise a display comprising output from the light panel and a visual effect from the absorber panel. The cover may comprise a layer configured to facilitate the transmission of light from the light panel. The absorber panel may comprise a display panel; the visual effect of the absorber panel may comprise a display at least partially visible at the exterior surface of the cover. The absorber panel may comprise an addressable display. The absorber panel may comprise a display panel. The composite structure may be configured so that the composite visual effect may comprise at least the visual effect of the decorative material when the composite structure is in an off state. The composite structure may be configured for an on state and an off state; the composite visual effect of the composite structure may comprise at least the visual effect of the decorative material when the composite structure is in the off state. The decorative material may be at least one of light transmissive or transparent. The decorative material may comprise at least one of (a) glass or (b) plastic. The composite structure may be configured for an on state and an off state; the visual effect of the absorber panel may be generally light-transmissive when the composite structure is in the off state. The composite structure may be configured for an on state and an off state; the visual effect of the absorber panel may be generally light-transmissive when the composite structure is in the on state. The composite structure may be configured for an on state and an off state; the visual effect of the absorber panel may be generally dark background when the composite structure is in the on state. The component may comprise a sensor; operation of the user interface for the vehicle occupant may comprise input detected by the sensor. Operation of the user interface for the vehicle occupant may comprise at least one of (a) output from the absorber panel; (b) output from a light panel; (c) input detected by the sensor. The sensor may be configured to detect input from the vehicle occupant at or adjacent to the exterior surface of the cover. The user interface may be presented at the exterior surface of the cover. The visual effect of the decorative material may be presented at the exterior surface of the cover. The user interface may be presented with the visual effect of the decorative material and the visual effect of the absorber panel. The user interface may be presented with the visual effect of the decorative material and the visual effect of the absorber panel and output of a light panel; the light panel may comprise a display panel. The user interface may comprise the composite visual effect. The decorative material may comprise a decorative layer. The composite structure may be configured in a contoured shape. The composite structure may comprise a substrate. The composite structure may be configured to be coupled to at least one of (a) a trim component; (b) a panel; (c) a door panel; (d) an instrument panel; (e) a surface; (f) a console; (g) a base; (h) a seat; (i) a vehicle system; (j) an overhead console; (k) a floor console, (l) a seat back panel. The component may comprise a control system configured to connect to vehicle systems; the control system may be configured to facilitate operation by the vehicle occupant for at least one of (a) sending a signal to a control module; (b) controlling a motor; (c) providing a signal to a vehicle component; (d) providing electrical power to a vehicle component; (e) providing to the vehicle occupant at least one of (1) visible feedback and/or (2) audible feedback and/or (3) tactile feedback and/or (4) haptic feedback. Operation of the user interface for the vehicle occupant may comprise at least one of (a) output from a light panel presenting a display and (b) the visual effect of the absorber panel and (c) input detected by a sensor. The user interface may be configured for interaction with a vehicle occupant by at least one of (a) touch at the exterior surface of the cover detected by the sensor or (b) gesture adjacent to the exterior surface of the cover detected by the sensor. The sensor may comprise at least one of (a) an array; (b) a grid; (c) a foil; (d) a panel; (e) a touch panel; (f) a flexible panel; (g) a detector; (h) a proximity detector; (i) a capacitive touch panel; (j) a pressure sensitive panel. The component may comprise a display system comprising the absorber panel and a display; the display may comprise at least one of (a) an array; (b) a grid; (c) a panel; (d) a display screen; (e) a flexible panel; (f) a lighting array; (g) a lighting device array; (h) a light-emitting device array; (i) an LED array; (j) a flexible LED array; (k) an OLED array; (l) a flexible LED matrix; (m) a flexible sheet; (n) EL display; (o) a TFEL display, (p) QD array, (q) color emitting device array, (r) light and color emitting device; (s) self-emissive display. The display may be configured to provide color and light; the display may comprise at least one of an OLED (organic light emitting diode) display, an ELQD (Electroluminescent Quantum Dot) display. The display may comprise at least one of a light emitting display, an EL (electroluminescent) display, a TFEL (Thin Film Electroluminescent) display. The display may be configured to provide color; the display may comprise at least one of a QD (Quantum Dot) display, an LED (Light emitting diode) display, a LC (Liquid Crystal) display. The display further may comprise a light source; the display may be configured to provide color and light. The visual effect may comprise color and light. The composite structure may comprise a composite surface; the cover may comprise an at least partially translucent cover; illumination from the display at the exterior surface of the composite structure may comprise visible light transmitted through the functional layer and through the at least partially translucent cover. The cover may comprise a generally rigid light-transmissive cover. The cover may comprise at least one of a plastic material and/or a glass material and/or a composite material and/or a light-transmissive material and/or a flexible material and/or a generally rigid material. The cover may comprise a polymeric material providing a generally rigid structure.

According to an exemplary embodiment as shown schematically in FIGS. 1C, 2, 3, 5A-5C, 10A-10D, 11A-11C, 12A-12C, 13A-13C, 14A-14C, 20 and 23A-23F, a vehicle interior component may be configured to provide a user interface for a vehicle occupant in a vehicle comprising vehicle systems comprising a composite structure configured to provide the user interface comprising a cover providing an exterior surface; a light panel; an absorber panel; and a decorative material. See also FIGS. 5D, 10E and 15A-15C. The light panel may be configured to provide output at least partially visible at the exterior surface of the cover. The decorative material may be configured to provide a visual effect at least partially visible at the exterior surface of the cover. The absorber panel may be configured to provide a visual effect at least partially visible at the exterior surface of the cover so that operation of the user interface for the vehicle occupant may comprise at least one of (a) output from the light panel and (b) the visual effect of the absorber panel. The component may comprise a sensor; operation of the user interface for the vehicle occupant may comprise input detected by the sensor.

According to an exemplary embodiment as shown schematically in FIGS. 1C, 2, 3, 5A-5C, 10A-10D, 11A-11C, 12A-12C, 13A-13C, 14A-14C, 20 and 23A-23F, a vehicle interior component may be configured to provide a user interface for a vehicle occupant in a vehicle comprising vehicle systems comprising a composite structure configured to provide the user interface comprising a cover providing an exterior surface; a sensor; an absorber panel; and a decorative material. See also FIGS. 5D, 10E and 15A-15C. The decorative material may be configured to provide a visual effect at least partially visible at the exterior surface of the cover. The absorber panel may be configured to provide a visual effect at least partially visible at the exterior surface of the cover so that operation of the user interface for the vehicle occupant may comprise at least one of (a) the visual effect of the absorber panel and (b) input detected by the sensor. The component may comprise a light panel configured to provide output at least partially visible at the exterior surface of the cover. Operation of the user interface for the vehicle occupant may comprise output from the light panel.

Exemplary Embodiments—C

As shown schematically according to an exemplary embodiment in FIGS. 6A-6B, 7A-7B, 8A-8B, 9A-9B and 10B-10E, the component C may comprise a composite structure CS with an assembled/layered construction with selected functional segments/layers for the application; as indicated schematically the segments/layers may be assembled with an adhesive A and/or air gap AG in the assembly/construction of the composite structure for the component (e.g. adjacent positioning, adhesive attachment, direct positioning, indirect/separated positioning, etc.). See also FIGS. 4A-4C and 5A-5D. As indicated schematically according to an exemplary embodiment in FIGS. 10A-10E, 11A-11C, 12A-12C, 13A-13C, 14A-14C, 15A-15C, 26A-26C, 27A-27C, 28A-28C, the component C may be configured to present an image IM at the display D for the user interface in a structure/component configured for installation in/on a vehicle interior component. See also FIGS. 1B-1C, 2, 3, 30A-30C, 31A-31C, 32A-32C, 33A-33C, 34 and 35A-35D.

As indicated schematically, the absorber panel of the composite structure may comprise an addressable display configured to present a display/image (e.g. configured to present the image display at the exterior surface of the cover) or a background panel configured to provide a background for the light/display panel (e.g. configured to enhance the image display from the light/display panel at the exterior surface of the cover). See generally FIGS. 11A-11C, 12A-12C, 13A-13C, 14A-14C, 15A-15C, 26A-26C, 27A-27C, 28A-28C.

As indicated schematically in FIGS. 6A-6B and 10C, the composite structure may comprise cover T and sensor grid SG and absorber panel AP and decorative material/layer DM on the substrate/carrier S; in operation, the composite visual effect at the display of the composite structure through the exterior surface of the cover may comprise a visual effect presented by the absorber panel and the decorative material; the user interface may comprise interaction with the sensor grid and the display D/image IM presented by the absorber panel. See also FIGS. 11A-11C and 12A-12C and 26A-26C (use of absorber panel shown as stand-alone absorber display).

As indicated in FIGS. 7A-7B and 10A-10B, the composite structure may comprise cover T and sensor grid SG and light/display panel L and absorber panel AP and decorative material/layer DM on the substrate/carrier S; in operation, the composite visual effect at the display of the composite structure through the exterior surface of the cover may comprise a visual effect presented by output from the display panel over the absorber panel and the decorative material; the user interface may comprise interaction with the sensor grid and the display D/image IM presented by the absorber panel. See also FIGS. 13A-13C (use of absorber panel as background panel for light/display panel) and FIGS. 14A-14C and 27A-27C (use of absorber panel shown as absorber display with light/display panel) and FIGS. 15A-15C and 28A-28C (use of display system without absorber panel).

As indicated in FIGS. 8A-8B, the composite structure may comprise cover T and light/display panel L and absorber panel AP and decorative material/layer DM on the substrate/carrier S; in operation, the composite visual effect at the display of the composite structure through the exterior surface of the cover may comprise a visual effect presented by output from the display panel over the absorber panel and the decorative material; the user interface may comprise interaction with the display presented by the display panel over the absorber panel. See also FIGS. 13A-13C (use of absorber panel as background panel for light/display panel) and FIGS. 14A-14C and 27A-27C (use of absorber panel shown as absorber display with light/display panel).

As indicated in FIG. 10D, the composite structure may comprise cover T and absorber panel AP and decorative material/layer DM on the substrate/carrier S; in operation, the composite visual effect SE at the display of the composite structure through the exterior surface of the cover may comprise a visual effect presented by the absorber panel and the decorative material; the user interface may comprise interaction with the display D/image IM presented by the absorber panel. See also FIGS. 11A-11C and 12A-12C and 26A-26C (use of absorber panel shown as stand-alone absorber display).

Referring to FIGS. 11A-11C, 12A-12C and 26A-26C, operation of the component/composite structure in a user interface/display system with a stand-alone absorber panel AP (e.g. without light/display panel) configured to provide the display for user interface is shown schematically according to an exemplary embodiment; absorber panel AP may comprise an addressable display configured to present a display/image (e.g. configured to present the image display at the exterior surface of the cover).

Referring to FIGS. 13A-13C, 14A-14C and 27A-27C, operation of the component/composite structure in a user interface/display system with an absorber panel AP and a light/display panel L configured in combination to provide the display for user interface is shown schematically according to an exemplary embodiment; absorber panel AP may comprise a background panel configured to provide a background for the light/display panel (e.g. configured to enhance the image display from the light/display panel at the exterior surface of the cover).

As shown schematically according to an exemplary embodiment in FIGS. 11A-11C, 12A-12C, 13A-13C, 14A-14C, 26A-26C, 27A-27C and 28A-28C, the user interface/display system may be configured to operate with a control system for interaction with vehicle systems and/or through user input such as by a command/signal (e.g. from input such as sensor/sensor grid, etc.) at a user interface and for connectivity with a network (e.g. vehicle network or other network configured to provide communications/data, etc.); activation of the user interface/display system to operate the control system may facilitate or produce the selection of data to be presented as an image (e.g. data/pattern providing content/graphic information) for the user interface/display system (e.g. for interaction with a vehicle occupant). See also FIGS. 2 and 3.

As indicated schematically in FIGS. 11A-11C and 26A-26C, operation of the user interface/display system with absorber panel AP comprising absorber display may comprise display of data presented as a composite visual effect of an image IM (e.g. data/pattern providing content/graphic information shown as telephony control) from the absorber display and the visual effect of the decorative material DM (e.g. shown as a conventional/monolithic background) at the exterior surface of the cover for the user interface. See also FIG. 10C. (As shown schematically, the user interface may be configured for interaction with a vehicle occupant, such as through a sensor to operate/control vehicle systems or other systems.)

As indicated schematically in FIGS. 12A-12C, operation of the user interface/display system with absorber panel AP comprising absorber display may comprise display of data presented as a composite visual effect of an image IM (e.g. data/pattern providing content/graphic information shown as telephony control) from the absorber display and the visual effect of the decorative material DM (e.g. shown as a decorative wood trim appearance background) at the exterior surface of the cover for the user interface. See also FIG. 10D.

As indicated schematically in FIGS. 13A-13C, operation of the user interface/display system with absorber panel AP comprising an absorber background panel configured to provide a background for the light/display panel L (e.g. configured to enhance the image display from the light/display panel) may comprise display of data presented as a composite visual effect of an image IM (e.g. data/pattern providing content/graphic information shown as vehicle system status/control) from the light/display panel on the absorber/background panel (e.g. to provide contrast enhancement) and the visual effect of the decorative material DM (e.g. shown as a decorative wood trim appearance background) at the exterior surface of the cover for the user interface. (As indicated schematically in FIG. 13A, the absorber panel functioning as a background panel for the display panel is generally transparent when off and provides a dark/black background area when activated/on.) As indicated schematically, the composite visual effect for the user interface/display system is enhanced through the use of the absorber background panel to provide a background for the image presented by the light/display panel. See FIGS. 10A-10B.

As indicated schematically in FIGS. 14A-14C and 28A-28C, operation of the user interface/display system with absorber panel AP comprising absorber display configured to operate in combination with the light/display panel L (e.g. configured to augment/enhance the image display from the light/display panel) may comprise display of data presented as a composite visual effect of an image IM from the light/display panel and of an image IM from the absorber display and the visual effect of the decorative material DM (e.g. shown as a decorative wood trim appearance background) at the exterior surface of the cover for the user interface. As indicated schematically the composite visual effect for the user interface/display system is enhanced through the use of the absorber display panel to provide an image from a data pattern to augment/background the image presented by the light/display panel (example image for the display comprises content/graphic information shown as telephony control). See also FIGS. 10A-10B.

As indicated schematically in FIGS. 11A, 12A, 13A, 14A, 26A and 27A, the system may be configured to be operated with data and command/signal provided from any of a variety of sources including but not limited to input from a user interface (e.g. from a vehicle occupant) and/or a signal from a network (e.g. local/vehicle network, wireless network, connected network, internet, etc.) and/or vehicle system; as indicated schematically, data (including content/graphics, etc.) may be stored and accessed from any of a variety of locations/sites (e.g. local, network, remote, etc.) and selected for display/presentation at the display system. See also FIGS. 15A and 28A.

Referring to FIGS. 16A-16C, 17A-17B, 18A-18B, 19 and 29A-29C, structure/configuration and data connectivity of the user interface/display system for the component/composite structure is shown schematically; the system may comprise the functional elements (e.g. absorber panel, light/display panel, sensor grid, etc.) and connectivity through a connector CN to an interface and control system (e.g. with computer system and controller and data input/output) with connectivity through a network (e.g. data communications/connectivity with vehicle systems, vehicle network, internet/network, data, etc.). As indicated schematically according to an exemplary embodiment, the user interface as configured for the component may comprise a "passive" interface (e.g. providing for output such a by a display, signal, audio, etc.) and/or an "interactive" interface (e.g. providing for input such as by a sensor, touch, audio, etc.); according to an exemplary embodiment, the user interface may or may not comprise an interactive configuration (e.g. may or may not facilitate or accept input from a vehicle occupant). As indicated schematically according to an exemplary embodiment, the display and/or display panel may comprise a subcomponent configured to provide a display of light and/or as a light source (e.g. display, screen, light emitting diode/LED, LED array, LED mat, etc.); the display/display panel may comprise any of a wide variety of forms including commercially available technology/products. See FIGS. 13A-13C, 14A-14C, 15A-15C, 16A, 23A-23F, 26A-26C and 28A-28C.

As indicated schematically according to an exemplary embodiment, the absorber panel (e.g. variable absorber) may comprise any of a wide variety of types and forms including commercially available technology/products (including but not limited to liquid crystal, twisted nematic liquid crystal, etc.); the absorber panel may comprise a configuration that is either (a) transparent when power is off (e.g. "white mode" when no power consumption) or (b) dark/black when power is off (e.g. "black mode" when no power consumption). As indicated, "active" and "inactive" will correlate to the state of the display from the absorber panel (notwithstanding the state of power consumption): "inactive" will comprise a state of display when the absorber panel provides relative transparency and no background/contrast or image display is provided by the absorber panel (only a decorative material if any is visible); "active" will comprise a state of display when the absorber panel provides a background/contrast or image display (e.g. an image/contrast for images display is presented). (According to an exemplary embodiment, the absorber panel as selected for use may be on or off when in an "inactive" state (depending upon the configuration).) See also FIGS. 11A-11C, 12A-12C, 13A-13C, 14A-14C, 16B, 23A-23F, 26A-26C, 27A-27C.

According to an exemplary embodiment, the user interface/display system will be configured and operated to provide a composite visual effect comprising the visual effect of a selected decorative material/layer (e.g. authentic decorative material, imitation decorative material, authentic wood trim, imitation wood trim, stone appearance, metal appearance, plastic contour effect, veneers, decorative finishes, paint/colors, foils, films, labels, in-mold labels, coatings, background art/effects, etc.) at the exterior surface of the cover for the user interface/ornamental appearance of the component; a composite visual effect may be available to be created with the composite structure that facilitates variations and design options and color choices for vehicle interior appearance (beyond conventional arrangements that tend to be limited to black/gray/dark surfaces) including enhancement of appearance with variations in contrast levels between an activated/on state and an off state. See e.g. FIGS. 4, 5A-5D, 10A-10E, 11A, 12A, 13A, 14A, 26A and 27A (indicating user interface with intuitive and seamless information display with a non-distracting authentic material visual appearance with optional touch-input capability such as from a sensor grid such as a capacitive touch panel, ITO panel/grid, film/foil, etc.).

As indicated schematically according to an exemplary embodiment, when the display/user interface is in an off state the absorber panel (and the display panel (if any)) may remain generally transparent and the composite visual effect at the exterior surface of the cover of the component may be provided substantially by the visual effect of the decorative material/layer; when the display/user interface is in an on state the absorber panel (and the display panel (if any)) may be activated to present an image and the composite visual effect at the exterior surface of the cover of the component may be provided by the image and/over the visual effect of the decorative material/layer. See FIGS. 10A-10E, 11A, 12A, 13A, 14A, 26A and 27A. As indicated schematically in FIGS. 11A, 12A and 26A, the absorber panel may present an image/display; as indicated schematically in FIGS. 13A, 14A and 27A, the absorber panel may be combined with a display panel to present an image/display (e.g. visually enhanced by combination of illumination from the display panel and contrast-enhancement from the absorber panel, such as providing a dark/black background for illumination from the display).

According to an exemplary embodiment, the functional layers of the composite structure of the component may comprise an integrated sensor grid (such as a capacitive touch panel, force sensors, etc.) and/or integrated haptic/mechanical feedback arrangement (e.g. actuators, piezoelectric elements, etc.) within the construction or at the substrate/base (e.g. carrier) of the component. See FIGS. 16C and 29A-29C. As indicated schematically in FIGS. 16C and 29A-29C, the sensor configuration/arrangement for the component/composite structure may be configured/arranged to provide a generally full-panel touch region (see FIG. 16C) or a selective/partial touch region arrangement (see FIGS. 29A and 29B) or a set of button/touch regions/switch areas (see FIG. 29C).

As indicated schematically, the user interface/display may be configured and connected to operate any of a wide variety of vehicle systems (e.g. for environment controls, audio controls, light controls, door/other locks, personalization/settings, data connection, etc.).

Referring to FIGS. 20, 21A-21B, 22A-22B, 23A-23F, 30A-30C, 31A-31C, 32A-32C and 33A-33C, a vehicle interior component C comprising a user interface UI comprising a display system (with panel/display D and optional control element) may be configured to display an image IM. As shown schematically according to an exemplary embodiment in FIGS. 20, 21A-21B and 22A-22B, the component C may comprise a compartment for an article AC (e.g. item, object, device, etc.) and a sensor (e.g. sensor grid SG, sensor arrangement SPR, etc.) with the display system comprising panel/display D of the user interface UI. See also FIG. 23F. As shown schematically in FIG. 23E, the composite structure CS may comprise a cover T (e.g. providing an exterior surface) and substrate/carrier S (e.g. providing for installation with the base/structure B) with functional segments/layers such as a sensor/grid SG and light/display panel L and absorber panel AP and decorative material/layer DM (i.e. a decorative material that may be applied as a layer, etc.); in operation, the composite visual effect at the display of the composite structure through the exterior surface of the cover may comprise a visual effect presented by the decorative material DM and an absorber panel AP with light/display panel L to provide display D; the user interface may comprise interaction with the display D/image IM (and/or an optional control element); the composite structure may comprise a sensor shown as sensor grid SG. Compare FIGS. 21A-21B and 22A-22B and FIG. 23E (use of sensor as sensor arrangement SPR rather than sensor grid SG). See also FIGS. 30A-30C, 31A-31C, 32A-32C and 33A-33C.

As shown schematically in FIGS. 21A-21B and 23A-23B, the panel/display D of the user interface UI may be configured to present the image IM (shown as data/information from a system and/or network) for a decorative state; the article AC may be not generally visible behind panel/display D (e.g. when in the decorative state). As shown schematically in FIGS. 22A-22B and 23C-23D, the sensor (shown as sensor grid and/or sensor arrangement SPR) may be configured (with the control system for the user interface) to operate the display system; when an occupant of the vehicle reaches into the compartment to access or place the article AC the panel/display D and is detected the display system may be configured to present a light-transmissive display (e.g. a light-transmissive state shown as generally transparent panel rather than image IM) so that the article AC may be generally visible to the vehicle occupant. See also FIG. 23A. As indicated schematically in FIGS. 23A-23D and 23F, operation of the user interface/display system with absorber panel AP comprising absorber display configured to operate in combination with the light/display panel L (e.g. configured to augment/enhance the image display from the light/display panel) may comprise display of data presented as a composite visual effect of an image IM from the light/display panel and of an image IM from the absorber display and the visual effect of the decorative material DM. As indicated schematically in FIGS. 20, 21B, 22B and 23B-23D, the composite visual effect for the user interface/display system may be enhanced through the use of the absorber display panel to provide an image from a data pattern to augment/background the image presented by the light/display panel and to provide a light-transmissive (e.g. generally transparent) display for the compartment of the component. See also FIGS. 30A-30C, 31A-31C, 32A-32C and 33A-33C. As indicated schematically in FIG. 23A, the operation of the display system may comprise operation of an absorber panel and/or a display panel (and/or a combined light panel arrangement); the display system may be operated by a control system and a sensor/detector to provide a signal to active/deactivate the display to provide a decorative/display state (see FIGS. 23B-23C) and a light-transmissive state (see FIG. 23D) (e.g. according to a control program/algorithm).

As indicated schematically in FIGS. 20, 21B, 22B, 23B-23D, 30A-30C, 31A-31C, 32A-32C and 33A-33C, the composite visual effect for the user interface/display system may be operated enhanced through the use of the absorber display panel and/or light panel for the display to provide an image from a data pattern to augment/background the image presented by the light/display panel and to provide a light-transmissive (e.g. generally transparent) display for the compartment of the component. See also FIGS. 10A-10E, 11A-11C, 12A-12C, 13A-13C, 14A-14C, 15A-15C, 23A-23F, 24A-24D, 26A-26C, 27A-27C and 28A-28C. As indicated schematically in FIGS. 30A-30C, the display system DS with display for the component C configured to store an article AC (shown as a mobile/phone device) may be configured a display DS/L with a display panel to present an image IM and/or to show/conceal the article AC. As indicated schematically in FIGS. 31A-31C and 33A-33C, the display system DS with display for the component C configured to store an article AC (shown as a mobile/phone device) may be configured a display DS/AP with an absorber panel to present an image IM and/or show/conceal the article AC. As indicated schematically in FIGS. 32A-32C, the display system DS with display for the component C configured to store an article AC (shown as a mobile/phone device) may be configured a display DS/L/AP with a display panel and an absorber panel to present an image IM and/or show/conceal the article AC.

As indicated schematically in FIGS. 11A, 12A, 13A, 14A, 15A, 23A, 26A, 27A, 28A, 30A, 31A, 32A and 33A, the display system for the component may be configured to be operated with data and command/signal provided from any of a variety of source including but not limited to input from a user interface (e.g. from a vehicle occupant) and/or a signal from a network (e.g. local/vehicle network, wireless network, connected network, internet, etc.) and/or vehicle system; as indicated schematically, data (including content/graphics, etc.) may be stored and accessed from any of a variety of locations/sites (e.g. local, network, remote, etc.) and selected for display/presentation at the display system. See also FIGS. 1C, 2, 3, 10A-10E, 16A-16C and 29A-29C. As indicated schematically according to an exemplary embodiment in FIGS. 5A-5D and 10A-10E, the display system may provide a user interface/display comprising at least one of (a) an absorber panel and/or (b) a light panel. See also FIGS. 23B-23F, 24A-24D, 30A-30C, 31A-31C, 32A-32C, 33A-33C, 34 and 35A-35D.

As indicated schematically according to an exemplary embodiment, the component C with composite structure CS may be configured with a display system providing for an on state and an off state (e.g. with an absorber panel selected/designed and operable to provide for an intended visual effect in each state); according to an exemplary embodiment, the visual effect of the absorber panel may be generally light-transmissive when the composite structure may be in the off state; according to an exemplary embodiment, the visual effect of the absorber panel may be generally light-transmissive when the composite structure may be in the off state. See also FIGS. 11A-11C, 12A-12C, 13A-13C, 14A-14C, 23A-23F, 26A-26C, 27A-27C. As indicated schematically, the display system with absorber panel may be designed to be operated in each state as intended for the application. See also FIGS. 10A-10E, 11A-11C, 12A-12C, 13A-13C, 14A-14C, 15A-15C, 23A-23F, 24A-24D, 26A-26C, 27A-27C, 28A-28C, 30A-30C, 31A-31C, 32A-32C, 33A-33C, 34 and 35A-35D.

As shown schematically in FIGS. 24A-24D, 34 and 35A-35D, the component C may comprise a composite structure CS configured to provide a user interface providing a set of displays D for a display system DS with each display/panel configured to display an image IM. As shown schematically in FIGS. 24A and 24B, the component may comprise a cover structure TS (e.g. a rigid/semi-rigid material such as glass, plastic, etc.) providing a cover T with a display system DS (e.g. system configured to provide a display from a light panel, display panel, absorber panel, combination display panel/absorber panel, etc.). See also FIGS. 5A-5D, 10A-10E, 34 and 35A-35D. As indicated schematically in FIGS. 24A-24B, the display system of the component may comprise a display D on a primary surface (e.g. front/face) (indicating an information display shown as presenting weather information) and a display D on a lateral surface (e.g. side, secondary, etc.) (indicating an information display shown as presenting telephony/communications information). See also FIGS. 34 and 35A-35D. As indicated schematically in FIGS. 24A-24B, 34 and 35A-35D, operation of the user interface/display system for the component may comprise connectivity with a control system. See also FIGS. 16A-16C and 29A-29C. As shown schematically in FIGS. 24C-24D, the composite structure CS may comprise a cover T (e.g. providing an exterior surface) and substrate/carrier S (e.g. providing for installation with the base/structure B) with functional segments/layers such as a sensor/grid SG and light/display panel L and absorber panel AP (FIG. 24C) or with functional segments/layers such as a sensor/grid SG and light/display panel L and absorber panel AP and decorative material/layer DM (i.e. a decorative material that may be applied as a layer, etc.) (FIG. 24D). As indicated schematically in FIGS. 34 and 35A-35D, the multiple displays D of the composite structure CS with display system DS may be provided in a variety of forms and/or combinations of forms including with/without light/display panel L and/or with/without absorber panel AP. As indicated schematically in FIGS. 35A-35D, the display system DS with display arrangement D may be configured with display with a display panel L and/or an absorber panel AP to present an image IM. See also FIGS. 10A-10E, 11A-11C, 12A-12C, 13A-13C, 14A-14C, 15A-15C, 26A-26C, 27A-27C and 28A-28C (indicating example configurations of display system/display). As shown schematically in FIGS. 34 and 35A-35D, the composite structure CS with display system DS configured to provide a display D may comprise a cover T (e.g. providing an exterior surface) and substrate/carrier S (e.g. providing for installation with the base/structure B) with functional segments/layers such as a sensor/grid SG and light/display panel L (FIGS. 35A and 35C) and absorber panel AP (FIGS. 35B, 35C and 35C); the display system DS with display D may be configured to provide functional segments/layers such as a sensor/grid SG and light/display panel L and absorber panel AP and decorative material/layer DM (i.e. a decorative material that may be applied as a layer, etc.). See also FIGS. 10A-10E, 11A-11C, 12A-12C, 13A-13C, 14A-14C, 15A-15C, 26A-26C, 27A-27C and 28A-28C.

It is important to note that the present inventions (e.g. inventive concepts, etc.) have been described in the specification and/or illustrated in the FIGURES of the present patent document according to exemplary embodiments; the embodiments of the present inventions are presented by way of example only and are not intended as a limitation on the scope of the present inventions. The construction and/or arrangement of the elements of the inventive concepts embodied in the present inventions as described in the specification and/or illustrated in the FIGURES is illustrative only. Although exemplary embodiments of the present inventions have been described in detail in the present patent document, a person of ordinary skill in the art will readily appreciate that equivalents, modifications, variations, etc. of the subject matter of the exemplary embodiments and alternative embodiments are possible and contemplated as being within the scope of the present inventions; all such subject matter (e.g. modifications, variations, embodiments, combinations, equivalents, etc.) is intended to be included within the scope of the present inventions. It should also be noted that various/other modifications, variations, substitutions, equivalents, changes, omissions, etc. may be made in the configuration and/or arrangement of the exemplary embodiments (e.g. in concept, design, structure, apparatus, form, assembly, construction, means, function, system, process/method, steps, sequence of process/method steps, operation, operating conditions, performance, materials, composition, combination, etc.) without departing from the scope of the present inventions; all such subject matter (e.g. modifications, variations, embodiments, combinations, equivalents, etc.) is intended to be included within the scope of the present inventions. The scope of the present inventions is not intended to be limited to the subject matter (e.g. details, structure, functions, materials, acts, steps, sequence, system, result, etc.) described in the specification and/or illustrated in the FIGURES of the present patent document. It is contemplated that the claims of the present patent document will be construed properly to cover the complete scope of the subject matter of the present inventions (e.g. including any and all such modifications, variations, embodiments, combinations, equivalents, etc.); it is to be understood that the terminology used in the present patent document is for the purpose of providing a description of the subject matter of the exemplary embodiments rather than as a limitation on the scope of the present inventions.

It is also important to note that according to exemplary embodiments the present inventions may comprise conventional technology (e.g. as implemented and/or integrated in exemplary embodiments, modifications, variations, combinations, equivalents, etc.) or may comprise any other applicable technology (present and/or future) with suitability and/or capability to perform the functions and processes/operations described in the specification and/or illustrated in the FIGURES. All such technology (e.g. as implemented in embodiments, modifications, variations, combinations, equivalents, etc.) is considered to be within the scope of the present inventions of the present patent document.

What is claimed is:

1. A vehicle interior component configured to provide a user interface for a vehicle occupant in a vehicle comprising vehicle systems comprising:
   a composite structure configured to provide the user interface comprising:
   (a) a cover providing an exterior surface;
   (b) an absorber panel; and
   (c) a decorative material comprising a decorative layer;
   wherein the decorative material is configured to provide a visual effect at least partially visible at the exterior surface of the cover;
   wherein the absorber panel comprises an addressable display configured to present an image;
   wherein the absorber panel is configured to provide a visual effect at least partially visible at the exterior surface of the cover;
   wherein the composite structure is configured so that operation of the user interface for the vehicle occupant comprises a composite visual effect;
   wherein the visual effect of the decorative material is presented at the exterior surface of the cover.

2. The component of claim 1 further comprising a light panel configured to provide output at least partially visible at the exterior surface of the cover; wherein operation of the user interface for the vehicle occupant comprises output from the light panel.

3. The component of claim 2 wherein the light panel comprises a display panel; wherein the display panel comprises a self-emissive panel; wherein the self-emissive panel comprises at least one of a light-transmissive display and/or a translucent display and/or a transparent display.

4. The component of claim 3 wherein the display panel is configured to provide color and light; wherein the composite visual effect comprises color and light.

5. The component of claim 2 wherein the light panel comprises a display panel; wherein the output of light panel comprises a display from the display panel; wherein the visual effect of the absorber panel comprises a background for the display from the display panel.

6. The component of claim 2 wherein the absorber panel comprises (a) a background panel configured to provide a dark background for a display panel or (b) a display panel configured to augment output from the light panel.

7. The component of claim 2 wherein the light panel comprises a display panel; wherein the composite visual effect comprises (a) the output of a light panel over the visual effect of the absorber panel when the composite structure is in an on state or (b) the output of the light panel over the visual effect of the absorber panel with the visual effect of the decorative layer when the composite structure is in an on state.

8. The component of claim 1 wherein the composite structure is configured for an on state and an off state; wherein the composite visual effect of the composite structure comprises at least the visual effect of the decorative material when the composite structure is in the off state.

9. The component of claim 1 wherein the composite structure is configured for an on state and an off state; wherein the visual effect of the absorber panel (a) is generally light-transmissive when the composite structure is in the off state and/or (b) is generally light-transmissive when the composite structure is in the on state.

10. The component of claim 1 further comprising a sensor; wherein operation of the user interface for the vehicle occupant comprises at least one of (a) output from the absorber panel; (b) output from a light panel; (c) input detected by the sensor.

11. A vehicle interior component configured to provide a user interface for a vehicle occupant in a vehicle comprising vehicle systems comprising:
    a composite structure configured to provide the user interface comprising:
        (a) a cover providing an exterior surface;
        (b) an absorber panel comprising an active display; and
        (c) a decorative material;
    wherein the decorative material is configured to provide a visual effect at least partially visible at the exterior surface of the cover;
    wherein the absorber panel is configured to provide a visual effect at least partially visible at the exterior surface of the cover;
    wherein the composite structure is configured so that operation of the user interface for the vehicle occupant comprises a composite visual effect;
    wherein the composite structure is configured so that the composite visual effect comprises at least the visual effect of the decorative material when the composite structure is in an off state;
    wherein the absorber panel is configured to be generally transparent when inactive in the off state and to provide a dark background when active;
    so that the composite visual effect for the user interface is enhanced by use of the absorber panel.

12. The component of claim 11 further comprising a display panel; wherein the user interface is presented with (a) the visual effect of the decorative material and the visual effect of the absorber panel and/or (b) the visual effect of the absorber panel and output of the display panel.

13. The component of claim 11 further comprising a control system configured to connect to vehicle systems; wherein the control system is configured to facilitate operation by the vehicle occupant for at least one of (a) sending a signal to a control module; (b) controlling a motor; (c) providing a signal to a vehicle component; (d) providing electrical power to a vehicle component; (e) providing to the vehicle occupant at least one of (1) visible feedback and/or (2) audible feedback and/or (3) tactile feedback and/or (4) haptic feedback.

14. The component of claim 11 wherein the cover comprises at least one of (a) a plastic material and/or (b) a glass material and/or (c) a composite material and/or (d) a light-transmissive material and/or (e) a flexible material and/or (f) a generally rigid material and/or (g) a polymeric material providing a generally rigid structure.

15. A vehicle interior component configured to provide a user interface for a vehicle occupant in a vehicle comprising vehicle systems comprising:
    a composite structure configured to provide the user interface comprising:
        (a) a cover providing an exterior surface;
        (b) an absorber panel; and
        (c) a decorative material;
    wherein the decorative material is configured to provide a visual effect at least partially visible at the exterior surface of the cover;
    wherein the absorber panel is configured to provide a visual effect at least partially visible at the exterior surface of the cover;
    wherein the composite structure is configured so that operation of the user interface for the vehicle occupant comprises a composite visual effect;
    wherein the absorber panel comprises a display panel;
    wherein the visual effect of the absorber panel comprises a display at least partially visible at the exterior surface of the cover;
    wherein the composite visual effect is configured to comprise (1) display of data comprising an image presented at the absorber panel and (2) the visual effect of the decorative material.

16. The component of claim 15 wherein operation of the user interface for the vehicle occupant comprises at least one of (a) output from a light panel presenting a display and/or (b) the visual effect of the absorber panel and/or (c) input detected by a sensor and/or (d) interaction with a vehicle occupant by at least one of (1) touch at the exterior surface of the cover detected by the sensor or (2) gesture adjacent to the exterior surface of the cover detected by the sensor.

17. The component of claim 15 wherein the composite structure is configured to provide (a) a decorative state and (b) a light-transmissive state; wherein the decorative state comprises at least one of an opaque appearance, a translucent appearance, display of information, display of icons, display of images, display of pictures, display of patterns, display of a map.

18. A vehicle interior component configured to provide a user interface for a vehicle occupant in a vehicle comprising vehicle systems comprising:
    a composite structure configured to provide the user interface comprising:
    (a) a cover comprising a form providing an exterior surface comprising a primary surface and at least one lateral surface;
    (b) a light panel for the primary surface;
    (c) a light panel for at least one lateral surface; and
    (d) an absorber panel;
    wherein the light panel for the primary surface is configured to provide output at least partially visible at the exterior surface of the cover;
    wherein the light panel for the at least one lateral surface is configured to provide output at least partially visible at the at least one lateral surface;
    wherein the absorber panel comprises an active display configured to provide a visual effect at least partially visible at the exterior surface of the cover;
    so that operation of the user interface is configured to comprise at least one of (a) output from at least one light panel and/or (b) the visual effect of the absorber panel.

19. The component of claim 18 further comprising a decorative material; wherein the decorative material comprises a decorative layer configured to provide a visual effect at least partially visible at the exterior surface of the cover.

20. The component of claim 18 wherein the light panel for the primary surface comprises a display panel; wherein the display panel comprises a self-emissive panel.

\* \* \* \* \*